(12) United States Patent
Nakada et al.

(10) Patent No.: US 9,553,114 B2
(45) Date of Patent: Jan. 24, 2017

(54) DISPLAY DEVICE AND ELECTRONIC DEVICE WITH A COLOR FILTER

(71) Applicant: Semiconductor Energy Laboratory Co., Ltd., Atsugi-shi, Kanagawa-ken (JP)

(72) Inventors: Masataka Nakada, Tochigi (JP); Hidenori Mori, Kawachi (JP); Hisashi Ohtani, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/516,103

(22) Filed: Oct. 16, 2014

(65) Prior Publication Data

US 2015/0108471 A1 Apr. 23, 2015

(30) Foreign Application Priority Data

Oct. 18, 2013 (JP) ................... 2013-216904
Jan. 15, 2014 (JP) ................... 2014-005432

(51) Int. Cl.
*H01L 29/10* (2006.01)
*H01L 27/12* (2006.01)
(Continued)

(52) U.S. Cl.
CPC ..... *H01L 27/1255* (2013.01); *G02F 1/133553* (2013.01); *G02F 1/136204* (2013.01);
(Continued)

(58) Field of Classification Search
CPC .............. G02F 1/133514; G02F 1/1368; G02F 1/134309; G02F 1/133345; G02F 1/1343; G02F 1/136227; G02F 1/1533; G02F 2001/136222; G02F 2001/1536; H01L 27/322; H01L 27/124; H01L 27/3218; H01L 27/1248; H01L 27/3216; H01L 27/3276; H01L 27/14629; H01L 27/3206; H01L 27/3251; H01L 27/14636; H01L 27/3248; H01L 27/3258; H01L 27/14621; H01L 27/3211; H01L 27/326; H01L 51/5253; H01L 51/0024; H01L 51/5218; H01L 51/5225; H01L 21/76877; H01L 33/405; H01L 33/44

See application file for complete search history.

(56) References Cited

U.S. PATENT DOCUMENTS 4,580,159 A 4/1986 Manabe
5,731,856 A 3/1998 Kim et al.
(Continued)

FOREIGN PATENT DOCUMENTS

EP 0665449 A 8/1995
EP 1154305 A 11/2001
(Continued)

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Julio J Maldonado
*Assistant Examiner* — Cory Eskridge
(74) *Attorney, Agent, or Firm* — Robinson Intellectual Property Law Office; Eric J. Robinson

(57) ABSTRACT

A novel display device capable of adjusting color purity is provided. A novel display device with improved adhesion of a color filter is provided. A novel display device capable of excellent reflective display is provided. The display device includes a transistor, a reflective electrode layer formed on the same surface as a source electrode layer or a drain electrode layer of the transistor, a first insulating layer over
(Continued)

the reflective electrode layer, a coloring layer which is over the first insulating layer and overlaps with the reflective electrode layer, a second insulating layer over the coloring layer, and a pixel electrode layer over the second insulating layer. The coloring layer includes at least a first opening and a second opening. The pixel electrode layer is electrically connected to the transistor through the first opening. The second insulating layer is in contact with the first insulating layer in the second opening.

10 Claims, 28 Drawing Sheets

(51) Int. Cl.
  *G02F 1/1335* (2006.01)
  *G02F 1/1362* (2006.01)
(52) U.S. Cl.
  CPC .............. *H01L 27/1248* (2013.01); *G02F 2001/136222* (2013.01); *H01L 27/1225* (2013.01)

(56) References Cited

U.S. PATENT DOCUMENTS

| | | |
|---|---|---|
| 5,744,864 A | 4/1998 | Cillessen et al. |
| 5,948,576 A | 9/1999 | Shirota et al. |
| 6,084,650 A | 7/2000 | Sekiguchi |
| 6,134,059 A | 10/2000 | Shirota et al. |
| 6,207,329 B1 | 3/2001 | Shirota et al. |
| 6,294,274 B1 | 9/2001 | Kawazoe et al. |
| 6,445,005 B1 | 9/2002 | Yamazaki et al. |
| 6,500,701 B2 | 12/2002 | Higashi et al. |
| 6,529,255 B1 | 3/2003 | Sekiguchi |
| 6,563,174 B2 | 5/2003 | Kawasaki et al. |
| 6,593,691 B2 | 7/2003 | Nishi et al. |
| 6,624,861 B2 | 9/2003 | Miyakawa et al. |
| 6,653,216 B1 | 11/2003 | Shimomaki et al. |
| 6,678,017 B1 | 1/2004 | Shimomaki et al. |
| 6,727,522 B1 | 4/2004 | Kawasaki et al. |
| 6,784,457 B2 | 8/2004 | Yamazaki et al. |
| 6,819,374 B2 | 11/2004 | Sekiguchi |
| 6,894,312 B2 | 5/2005 | Yamazaki et al. |
| 6,933,520 B2 | 8/2005 | Yamazaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,397,180 B2 | 7/2008 | Yamazaki |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,518,146 B2 | 4/2009 | Yamazaki et al. |
| 7,522,226 B2 | 4/2009 | Park et al. |
| 7,541,734 B2 | 6/2009 | Yamazaki et al. |
| 7,674,650 B2 | 3/2010 | Akimoto et al. |
| 7,732,819 B2 | 6/2010 | Akimoto et al. |
| 7,738,050 B2 | 6/2010 | Yamazaki et al. |
| 7,952,103 B2 | 5/2011 | Yamazaki et al. |
| 7,986,087 B2 | 7/2011 | Asano et al. |
| 8,111,362 B2 | 2/2012 | Yamazaki et al. |
| 8,304,265 B2 | 11/2012 | Nakamura et al. |
| 8,405,063 B2 | 3/2013 | Kazlas et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0023567 A1 | 2/2004 | Koyama et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0270445 A1* | 12/2005 | Lee .................. G02F 1/133514 349/108 |
| 2006/0035452 A1 | 2/2006 | Carcia et al. |
| 2006/0038752 A1 | 2/2006 | Winters |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0085938 A1* | 4/2007 | Yamazaki .............. H01L 27/124 349/43 |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0159043 A1 | 7/2007 | Kubota et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0200492 A1 | 8/2007 | Cok et al. |
| 2007/0252928 A1 | 11/2007 | Ito et al. |
| 2007/0272922 A1 | 11/2007 | Kim et al. |
| 2007/0275624 A1 | 11/2007 | Kawaguchi et al. |
| 2007/0287296 A1 | 12/2007 | Chang |
| 2008/0001528 A1 | 1/2008 | Eida |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0224595 A1 | 9/2008 | Nakamata et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0195152 A1 | 8/2009 | Sawano |

(56) References Cited

U.S. PATENT DOCUMENTS

| | | |
|---|---|---|
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0245898 A1 | 9/2010 | Nakai et al. |
| 2011/0042697 A1 | 2/2011 | Lee et al. |
| 2011/0221741 A1 | 9/2011 | Kawamura et al. |
| 2011/0227088 A1 | 9/2011 | Yamazaki et al. |
| 2011/0298361 A1 | 12/2011 | Matsunaga et al. |
| 2012/0162557 A1 | 6/2012 | Nakazawa |
| 2012/0223979 A1 | 9/2012 | Matsukura |
| 2013/0341624 A1* | 12/2013 | Cho ................. H01L 29/786 257/57 |
| 2014/0291667 A1 | 10/2014 | Nakada et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-253510 A | 10/1995 |
| JP | 08-264794 A | 10/1996 |
| JP | 08-286178 A | 11/1996 |
| JP | 11-084358 A | 3/1999 |
| JP | 11-505377 | 5/1999 |
| JP | 11-352503 A | 12/1999 |
| JP | 2000-044236 A | 2/2000 |
| JP | 2000-150900 A | 5/2000 |
| JP | 2000-162625 A | 6/2000 |
| JP | 2000-187209 A | 7/2000 |
| JP | 2001-217072 A | 8/2001 |
| JP | 2001-305333 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-186005 A | 7/2003 |
| JP | 2003-195350 A | 7/2003 |
| JP | 2003-308976 A | 10/2003 |
| JP | 2004-103957 A | 4/2004 |
| JP | 2004-219515 A | 8/2004 |
| JP | 2004-273614 A | 9/2004 |
| JP | 2004-273732 A | 9/2004 |
| JP | 2010-165961 A | 7/2010 |
| WO | WO-2004/114391 | 12/2004 |
| WO | WO-2011/045953 | 4/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3-A2O3-BO Systems [A; Fe, Ga or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3-Ga2ZnO4-ZnO system at 1350° C.", Journal of Solid State Chemistry, Aug. 1, 1991, vo. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S at al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp, 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J at al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J at al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J at al., "Amorphous Indium-Gallium-Zinc Oxide TFTs and Their Application for Large Size AMOLED", AM-FPD '08 Digest of Technical Papers, Jul. 2, 2008, pp. 275-278.

(56) References Cited

OTHER PUBLICATIONS

Takahashi.M at al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandam OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009 pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids). 1996, vol. 198-200, pp. 165-169.
Orita.M et al., "Mechanism of Electrical Conductivity of Transparent InGaZnO4", Phys. Rev. B (Physical Review B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasman Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorpous GIZO (Ga2O3-In2O3-ZnO) TFT", SID Digest '08 : SID International Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-251, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J.

(56) References Cited

OTHER PUBLICATIONS

Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
International Search Report (Application No. PCT/JP2014/058156) Dated Jun. 17, 2014.
Written Opinion (Application No. PCT/JP2014/058156) Dated Jun. 17, 2014.

\* cited by examiner

|  | High reflective LCD | High color gamut LCD |
|---|---|---|
| Display size | 6.0 inches | |
| Effective pixels | 768 (H) × 1024 × RGB (V) | |
| Resolution | 212 ppi | |
| Aperture ratio | 83.4% | |
| Backplane | CAAC-OS | |
| Frame frequency | 60 Hz (moving images) | |
| | 1/60 Hz to 2 Hz (still images) | |
| Scan driver | Integrated | |
| Touch panel | Mutual Capacitive | |
| Reflectance ※ | 37% | 18% |
| NTSC ratio ※ | 3% | 15% |
| Contrast ratio ※ | 14 : 1 | 10 : 1 |

※ Measured at 30° without a touch panel

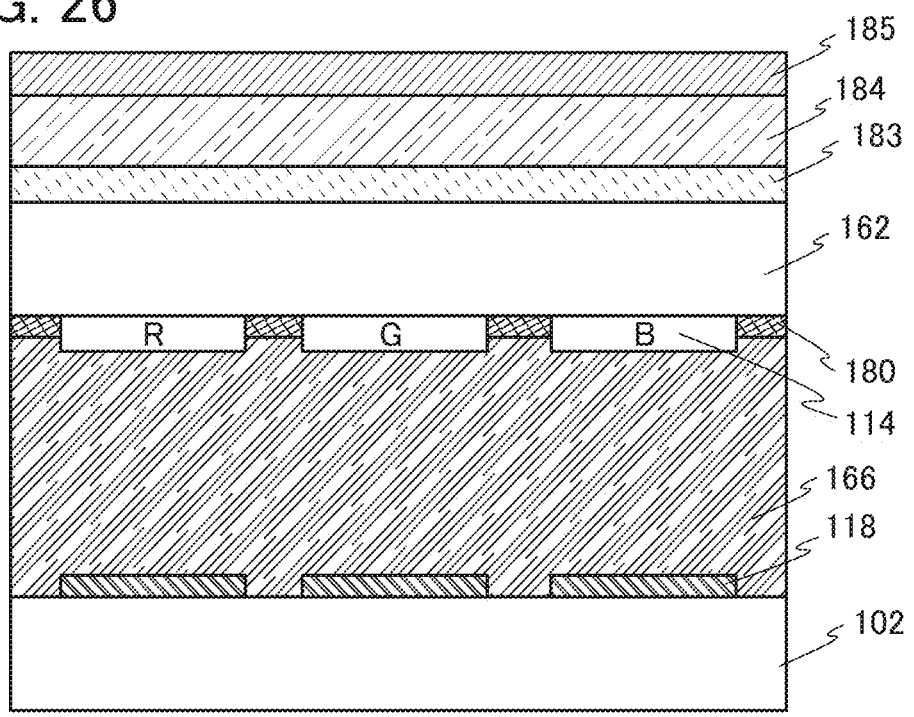

1 frame
1/60 sec 1 frame
5 sec

DISPLAY DEVICE AND ELECTRONIC DEVICE WITH A COLOR FILTER

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to a semiconductor device, a display device, an electronic device, a manufacturing method thereof, or a driving method thereof. One embodiment of the present invention particularly relates to, for example, a reflective liquid crystal display device.

Note that the term "display device" means a device including a display element. In addition, the display device includes a driver circuit for driving a plurality of pixels, and the like. Furthermore, the display device may include a control circuit, a power supply circuit, a signal generation circuit, or the like formed over another substrate.

2. Description of the Related Art

With the recent rapid spread of portable information terminals such as smartphones, improvement in their performance has progressed rapidly. Their screens have been increased in size and resolution, and some recent ones have resolutions as high as over 300 ppi.

For example, liquid crystal display devices generally have a structure in which R, G, and B sub-pixels are provided in a display region and provided with their respective color filters. The color filters are provided over a substrate (a counter substrate) which faces an active-matrix substrate (a substrate provided with elements (e.g., transistors) for driving pixels).

With the increase in resolution, the alignment accuracy between an active-matrix substrate and a counter substrate provided with color filters can be recognized as a problem. In view of this problem, attention has been focused on what is called a color filter on array (COA) structure, in which a color filter is formed on the active-matrix substrate side.

As a liquid crystal display device with a COA structure, a reflective or semi-transmissive liquid crystal display device which includes a color filter, a pixel electrode, and a reflective layer on the active-matrix substrate side and in which light entering from the counter substrate side is transmitted through the pixel electrode and the color filter and is reflected by the underlying reflective layer and is visually recognized is disclosed (e.g., see Patent Document 1 and Patent Document 2).

Patent Documents

[Patent Document 1] Japanese Published Patent Application No. 2000-187209

[Patent Document 2] PCT International Publication No. 2011/045953

SUMMARY OF THE INVENTION

In the case of a reflective display device in which a counter substrate is provided with a color filter, light such as external light is transmitted through the color filter, reflected by a reflective film or the like, and transmitted through the color filter again.

Also in the case of a reflective display device having a COA structure, light such as external light is transmitted through the color filter, reflected by a reflective film or the like, and transmitted through the color filter again. That is, light such as external light is transmitted through the color filter twice and is then observed by a viewer. This may increase the color purity of reflected light. In the case where external light is relatively weak in a room or the like, reflected light with high color purity is weak, resulting in dark display.

The color purity of reflected light in a reflective display device can be adjusted by the thickness of a color filter, for example. The color purity can be adjusted also by changing a coloring material, such as a pigment, which is used for the color filter. However, when the thickness of the color filter is large or small, it is difficult to make the thickness uniform all over a substrate surface. In the case where a coloring material used for the color filter is changed, the material change results in increases in development time and cost.

Another problem is low adhesion between the color filter and a surface over which the color filter is formed. For example, as the color filter, a photosensitive resin film is formed by applying and drying a photosensitive resin solution in which a coloring material is dispersed. Since the coloring material is dispersed, light intensity at the time of light exposure of the photosensitive resin film decreases in a depth direction, which may cause insufficient photocuring and low adhesion at or around the interface between the photosensitive resin film and the surface over which the photosensitive resin film is formed.

In view of the above problems, an object of one embodiment of the present invention is to provide a novel display device capable of adjusting color purity. Another object of one embodiment of the present invention is to provide a novel display device with improved adhesion of a color filter. Another object of one embodiment of the present invention is to provide a novel display device of which productivity is improved. Another object of one embodiment of the present invention is to provide a novel display device capable of excellent reflective display. Another object of one embodiment of the present invention is to provide a novel display device with a COA structure that is capable of excellent reflective display. Another object of one embodiment of the present invention is to provide a novel display device or the like.

Note that the descriptions of these objects do not disturb the existence of other objects. Note that in one embodiment of the present invention, there is no need to achieve all the objects. Note that other objects will be apparent from the description of the specification, the drawings, the claims, and the like and other objects can be derived from the description of the specification, the drawings, the claims, and the like.

One embodiment of the present invention is a display device which includes a pixel region, a transistor formed in the pixel region, a source electrode layer or a drain electrode layer of the transistor, an insulating layer over the source electrode layer or the drain electrode layer, a pixel electrode layer over the insulating layer, and a coloring layer overlapping with the pixel electrode layer and the drain electrode layer. The pixel electrode layer is electrically connected to the transistor. The coloring layer includes at least a first opening and a second opening.

In the above embodiment, the coloring layer may be formed over a counter substrate, and a substrate provided with the pixel electrode layer and the counter substrate may be aligned with and attached to each other such that the coloring layer overlaps with the pixel electrode layer. In the above embodiment, the pixel electrode layer may function as a reflective electrode layer.

In the above embodiment, the coloring layer may be a material layer capable of transmitting light in a red wavelength range, a material layer capable of transmitting light in a green wavelength range, or a material layer capable of transmitting light in a blue wavelength range. As another color of the coloring layer, cyan, magenta, yellow, or the like may be used. In the case where three or more kinds of coloring layers are used to achieve full-color display, each coloring layer may have an upper surface shape different from those of the coloring layers of the other colors, and for example, may have a different opening shape. A plurality of coloring layers are not necessarily formed over one substrate, and for example, the counter substrate may be provided with a first coloring layer and the substrate provided with the transistor may be provided with a second coloring layer and a third coloring layer.

In the above embodiment, the display device may further include a second coloring layer and a third coloring layer. The second coloring layer includes at least a third opening and a fourth opening. Upper surface shapes of the third opening and the fourth opening are different from those of the first opening and the second opening. When an opening in a red coloring layer has a larger area than that of an opening in a blue coloring layer, reflectance can be improved with an NTSC ratio maintained.

Another embodiment of the present invention is a display device which includes a pixel region, a transistor formed in the pixel region, a reflective electrode layer formed on the same surface as a source electrode layer or a drain electrode layer of the transistor, a first insulating layer over the reflective electrode layer, a coloring layer which is over the first insulating layer and overlaps with the reflective electrode layer, a second insulating layer over the coloring layer, and a pixel electrode layer over the second insulating layer. The coloring layer includes at least a first opening and a second opening. The pixel electrode layer is electrically connected to the transistor through the first opening. The second insulating layer is in contact with the first insulating layer in the second opening.

Another embodiment of the present invention is a display device which includes a pixel region, a transistor formed in the pixel region, a reflective electrode layer formed on the same surface as a source electrode layer or a drain electrode layer of the transistor, a first insulating layer including an inorganic insulating material over the reflective electrode layer, a coloring layer which is over the first insulating layer and overlaps with the reflective electrode layer, a second insulating layer including an organic insulating material over the coloring layer, and a pixel electrode layer over the second insulating layer. The coloring layer includes at least a first opening and a second opening. The pixel electrode layer is electrically connected to the transistor through the first opening. The second insulating layer is an contact with the first insulating layer in the second opening.

In each of the above embodiments, it is preferable that the transistor include a gate electrode layer, a gate insulating layer over the gate electrode layer, a semiconductor layer over the gate insulating layer, and the source electrode layer and the drain electrode layer which are in contact with the gate insulating layer and the semiconductor layer.

In each of the above embodiments, it is preferable that the first insulating layer include a third opening overlapping with the first opening and the pixel electrode layer be electrically connected to the drain electrode layer of the transistor through the first opening and the third opening.

In each of the above embodiments, it is preferable that the semiconductor layer be an oxide semiconductor layer. The oxide semiconductor layer preferably includes an oxide represented by an In-M-Zn oxide that contains at least indium (In), zinc (Zn), and M (M represents Al, Ga, Ge, Y, Zr, Sn, La, Ce, or Hf).

In each of the above embodiments, a touch panel may overlap with the pixel region, or the counter substrate may be provided with a circuit having a touch input function.

Embodiments of the present invention also include an electronic device including the above display device.

In one embodiment of the present invention, a novel display device capable of adjusting color purity can be provided. In one embodiment of the present invention, a novel display device with improved adhesion of a color filter can be provided. Furthermore, in one embodiment of the present invention, a novel display device of which productivity is improved can be provided. Furthermore, in one embodiment of the present invention, a novel display device capable of excellent reflective display can be provided. Furthermore, in one embodiment of the present invention, a novel display device or the like can be provided.

Note that the descriptions of these effects do not disturb the existence of other effects, Note that in one embodiment of the present invention, there is no need to achieve all the effects. Note that other effects will be apparent from the description of the specification, the drawings, the claims, and the like and other effects can be derived from the description of the specification, the drawings, the claims, and the like.

BRIEF DESCRIPTION OF THE DRAWINGS

In the accompanying drawings:

FIG. 26 is a schematic cross-sectional view of a display device;

DETAILED DESCRIPTION OF THE INVENTION

Figure 1:
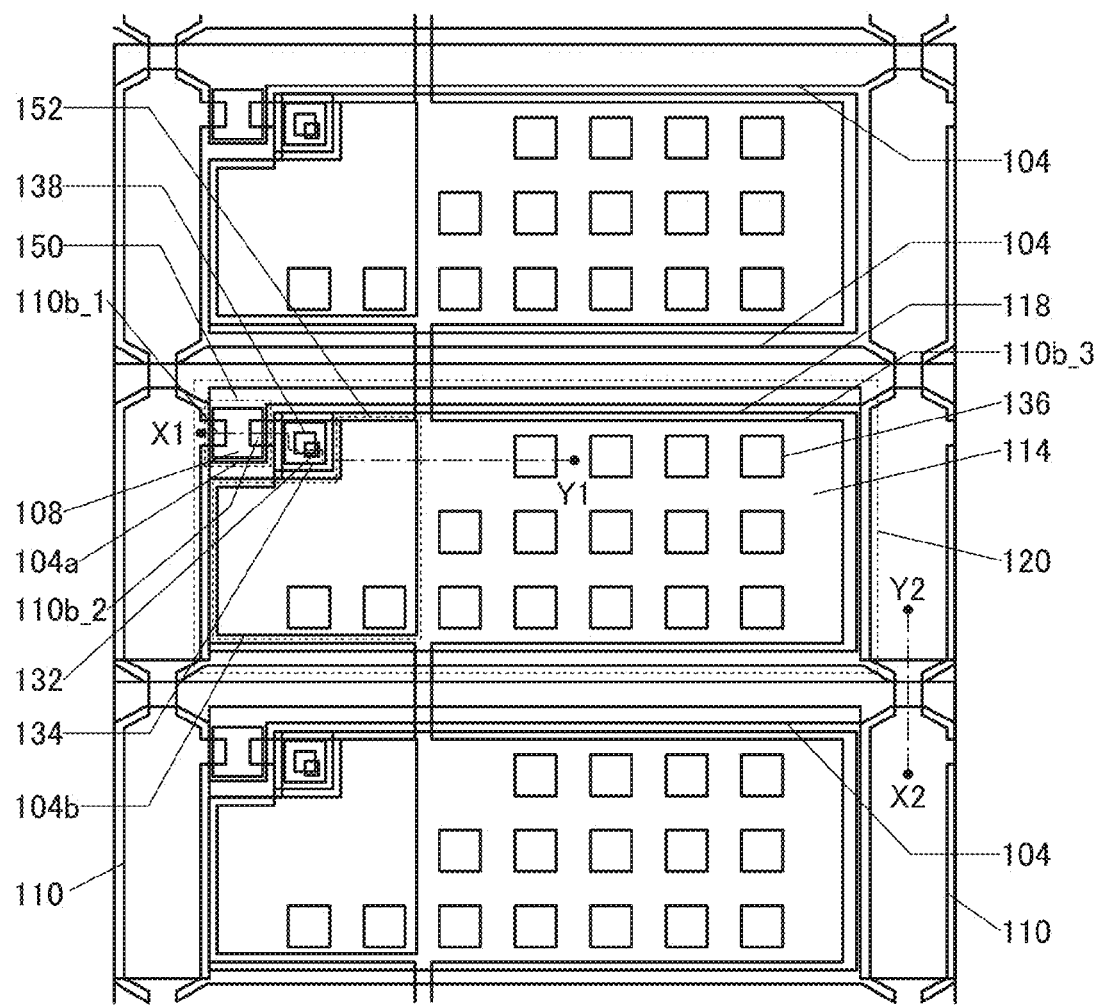
FIG. 1 illustrates a top view of a display device.

Embodiments will be hereinafter described with reference to drawings. However, the embodiments can be implemented with various modes. It will be readily appreciated by those skilled in the art that modes and details can be changed in various ways without departing from the spirit and scope of the present invention. Therefore, the present invention should not be construed as being limited to the description in the following embodiments.

In drawings, the size, the layer thickness, or the region is exaggerated for clarity in some cases. Therefore, embodiments of the present invention are not limited to such a scale. Note that drawings are schematic views showing ideal examples, and embodiments of the present invention are not limited to shapes or values shown in the drawings.

Ordinal numbers such as "first", "second", and "third" in this specification are used in order to avoid confusion among components, and the terms do not limit the components numerically.

Note that in this specification, terms for describing arrangement, such as "over" and "under", are used for convenience for describing the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode layer) and a source (a source terminal, a source region, or a source electrode layer), and current can flow through the drain, the channel region, and the source.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

In this specification and the like, the term "electrically connected" includes the case where components are connected through an object having any electric function. There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, a pixel region includes at least a pixel corresponding to a display unit that can control the luminance of one color element (e.g., any one of R (red), G (green), and B (blue))). Therefore, in a color display device, the minimum display unit of a color image is composed of three pixels of an R pixel, a G pixel, and a B pixel. Note that the colors of the color elements for displaying color images are not limited to three colors, and may be more than three colors or may include a color other than R, G, and B. For example, a display unit may be composed of four pixels of the R pixel, the G pixel, the B pixel, and a W (white) pixel. Alternatively, a display unit may be composed of a plurality of color elements among R, G, and B as in PenTile Layout.

Embodiment 1

In this embodiment, a display device of one embodiment of the present, invention will be described with reference to FIG. 1, FIGS. 2A to 2C, FIGS. 3A and 3B, FIGS. 4A to 4D, FIGS. 5A to 5D, and FIGS. 6A to 6C.

FIG. 1 illustrates a top view of an example of a display device of one embodiment of the present invention. In the top view of FIG. 1, which shows some pixel regions (three pixels) in the display device, components such as a gate insulating layer are partly omitted to avoid complexity.

In FIG. 1, a transistor 150 includes a conductive layer 104a serving as a gate electrode layer, a gate insulating layer (not illustrated in FIG. 1), a semiconductor layer 108 where a channel region is formed, a conductive layer 110b_1 serving as a source electrode layer, and a conductive layer 110b_2 serving as a drain electrode layer. A gate line 104 including the conductive layer 104a serving as the gate electrode layer of the transistor 150 extends in the horizontal direction, and a source line 110 including the conductive layer 110b_1 serving as the source electrode layer of the transistor 150 extends in the vertical direction. A pixel region 120 is formed in a region defined by two gate lines 104 adjacent to each other and two source lines 110 adjacent to each other. In this manner, the transistor 150 is formed in the pixel region 120.

Furthermore, a conductive layer 104b that is formed in the same step as the conductive layer 104a serving as a gate electrode layer and the conductive layer 110b_2 that serves as a drain electrode layer are stacked with an insulating layer that is formed in the same step as the gate insulating layer positioned therebetween. The conductive layer 104b, the insulating layer that is formed in the same step as the gate insulating layer, and the conductive layer 110b_2 form a capacitor 152.

The transistor 150 is electrically connected to a pixel electrode layer 118. Specifically, the pixel electrode layer 8 is electrically connected to the conductive layer 110b_2 that serves as the drain electrode layer of the transistor 150, through an opening 134 and an opening 138.

It is preferable that the area of a region where the source line 110 including the conductive layer 110b_1 and the gate line 104 including the conductive layer 104a intersect with each other be small as illustrated in FIG. 1. Reducing the area of the source line 110 and the area of the gate line 104 can reduce parasitic capacitance that can be generated between the source line 110 and the gate line 104.

The pixel region 120 includes a conductive layer 110b_3 that is formed in same step as the conductive layer 110b_1 serving as the source electrode layer of the transistor 150 and the conductive layer 110b_2 serving as the drain electrode layer of the transistor 150. Note that the conductive layer 110b_3 has a function of a reflective electrode layer. The conductive layer 110b_3 overlaps with a coloring layer 114. The coloring layer 114 overlaps with the pixel electrode layer 118.

In the structure in FIG. 1, light (mainly external light) that is incident on the conductive layer 110b_3 is transmitted through at least the pixel electrode layer 118 and the coloring layer 114 and is reflected by the conductive layer 110b_3. In other words, the display device in this embodiment performs color display with the use of light reflected by the conductive layer 110b_3 serving as a reflective electrode layer. Note that the conductive layer 110b_3 has a function of a capacitor line. The conductive layer 110b_3 is connected to that in an adjacent pixel.

The coloring layer 114 has an opening 134 serving as a first opening and an opening 136 serving as a second opening. Note that FIG. 1 illustrates a structure in which one pixel is provided with 16 openings 136. However, the shape or number of openings 136 is not limited to this example.

The opening 134 serves as an opening for connection between the transistor 150 and the pixel electrode layer 118. The opening 136 has a function of adjusting the color purity of the coloring layer 114. In other words, the color purity of the coloring layer 114 can be adjusted with the shape or number of openings 136.

Such a structure in which the coloring layer 114 has the opening 136 makes it easy to adjust the color purity of the coloring layer 114.

Figure 2A:
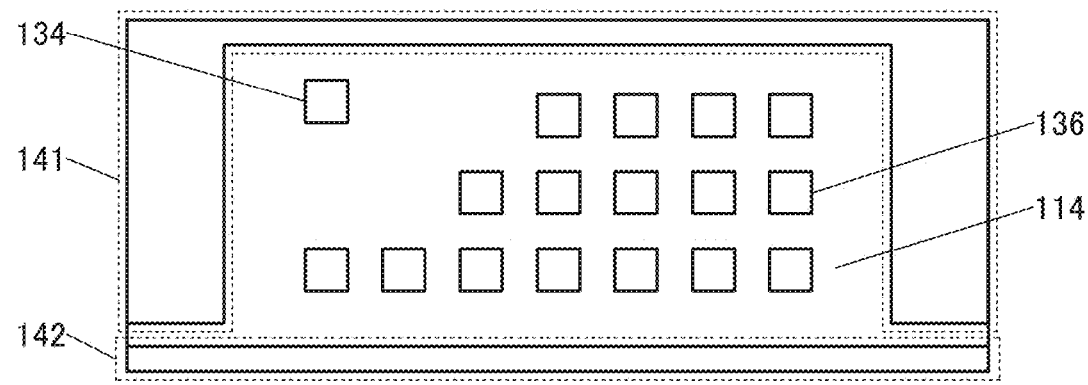
FIGS. 2A to 2C each illustrate a top view of a coloring layer of a display device.

Here, an upper surface shape of the coloring layer 114 in the display device illustrated in FIG. 1 is described more specifically. FIG. 2A is a top view of the coloring layer 114. Note that in FIG. 2A, components other than the coloring layer 114 are omitted. In addition, FIG. 2A corresponds to a top view of one pixel.

The coloring layer 114 illustrated in FIG. 2A has the opening 134 and the openings 136. In FIG. 2A, a region overlapping with the coloring layer 114 of an adjacent pixel, here the coloring layer 114 of an upper adjacent pixel, is denoted by a region 141, and a region overlapping with the coloring layer 114 of a lower adjacent pixel is denoted by a region 142. Such an arrangement in which one pixel overlaps with part of the coloring layer 114 of an adjacent pixel can suppress light reflection by the gate line 104 or the source line 110. In other words, when the coloring layer 114 of 2) an adjacent pixel is stacked, part of the coloring layer 114 can function as a so-called black matrix (BM).

Note that FIG. 2A illustrates, as an example, a structure in which the coloring layers 114 of adjacent pixels on both sides separately overlap with the coloring layer 114; however, the present invention is not limited to this structure. For example, each of the coloring layers 114 of the adjacent pixels may overlap with the coloring layer 114. Note that in the case where each of the coloring layers 114 of the adjacent pixels overlaps with the coloring layer 114, surface unevenness in the pixel region 120 or around the pixel region 120 may increase. In view of the flatness in the pixel region 120 or around the pixel region 120, it is preferable that the coloring layers 114 of both the adjacent pixels separately overlap with the coloring layer 114 as illustrated in FIG. 2A. Alternatively, a black coloring layer serving as a black matrix (BM) may be provided around the pixel region 120.

Figure 2B:
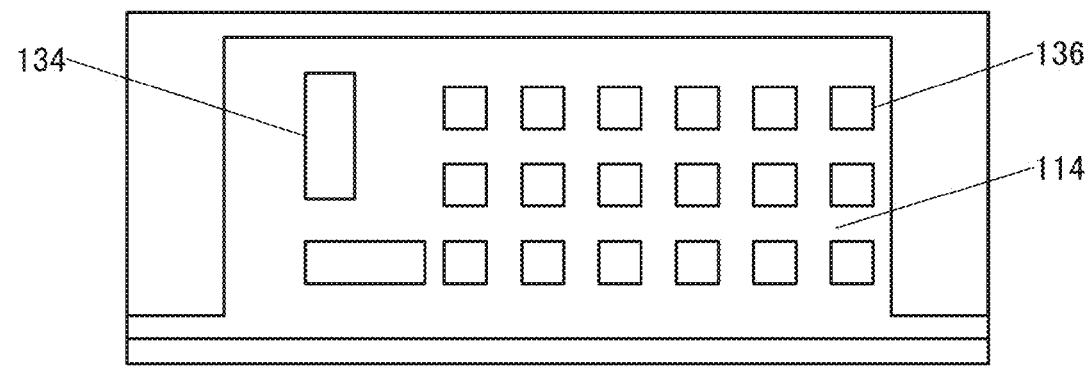
Figure 2C:
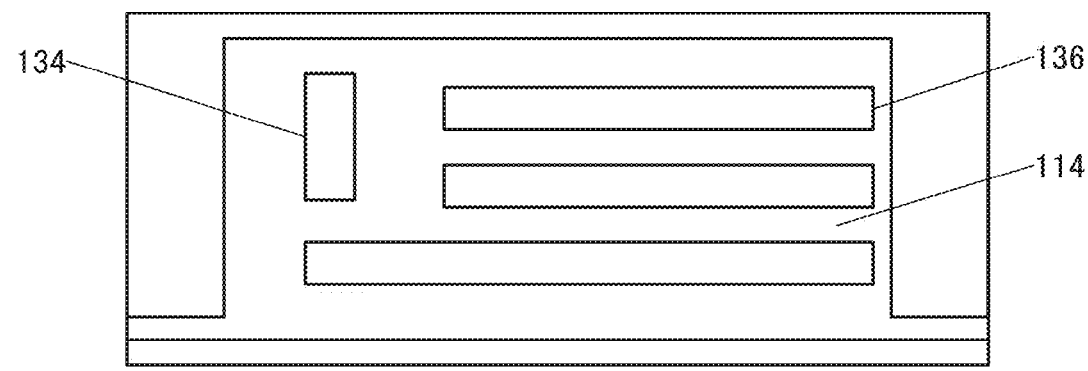

FIGS. 2B and 2C illustrate modification examples of the coloring layer 114 in FIG. 2A.

The coloring layer 114 in FIG. 2B differs from the coloring layer 114 in FIG. 2A in the shape of the opening 134 and the shape and arrangement of the openings 136. The coloring layer 114 in FIG. 2C differs from the coloring layer 114 in FIG. 2A in the shape of the opening 134 and the shape and arrangement of the openings 136. In this manner, the shapes, numbers, or arrangement of the opening 134 and the openings 136 of the coloring layer 114 can be variously changed to adjust the color purity of the coloring layer 114. Although the openings 136 illustrated in FIG. 1 and FIGS. 2A to 2C have quadrilateral shapes, the present invention is not limited to these examples and the openings 136 may have a circular shape, an elliptical shape, or the like.

Note that the shape and arrangement of the coloring layer 114, the opening 134, the openings 136, and the like may be changed depending on the color of the pixel. For example, the structure in FIG. 2A may be adopted for an R pixel; the structure in FIG. 2B may be adopted for a G pixel; and the structure in FIG. 2C may be adopted for a B pixel. For a W pixel, a structure not provided with the coloring layer 114 may be adopted, or the opening 134 or the openings 136 may be larger than those in pixels of other colors.

Figure 14A:
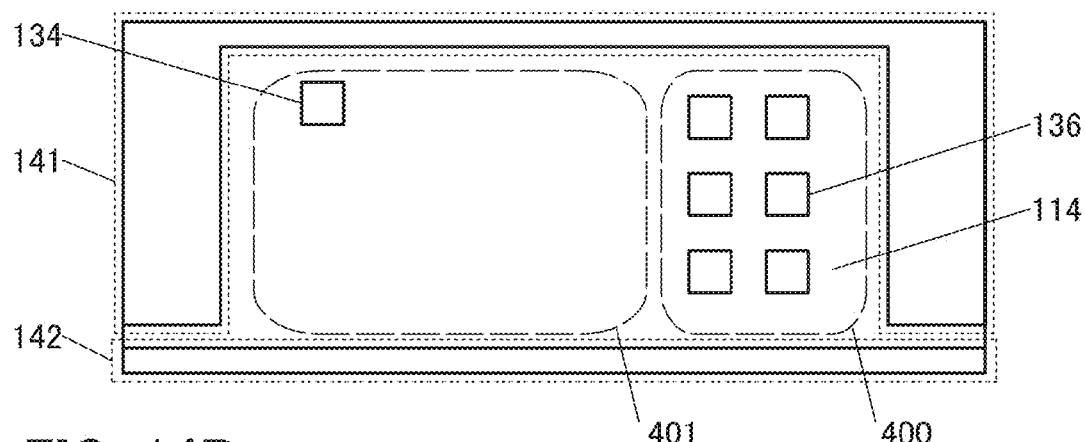
FIGS. 14A to 14C each illustrate a top view of a coloring layer of a display device.
Figure 14B:
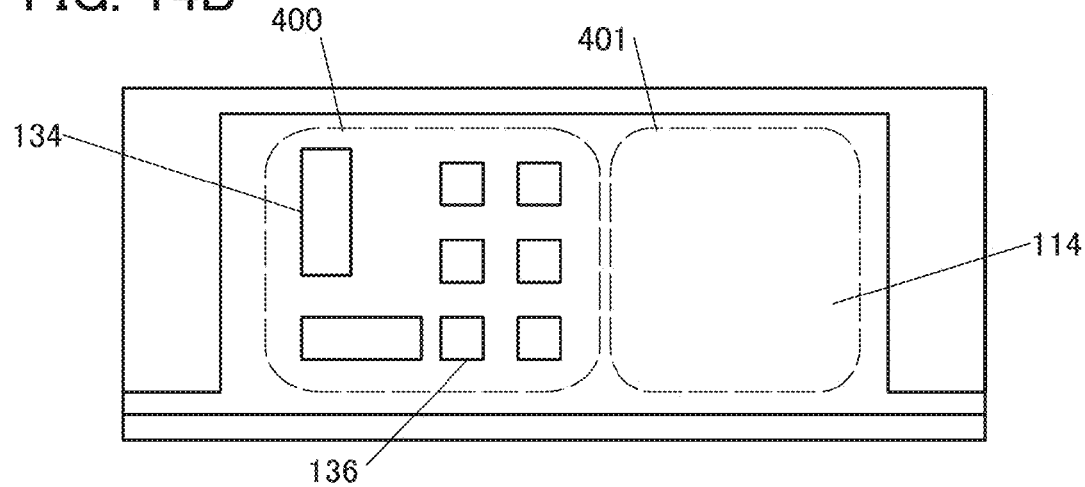
Figure 14C:
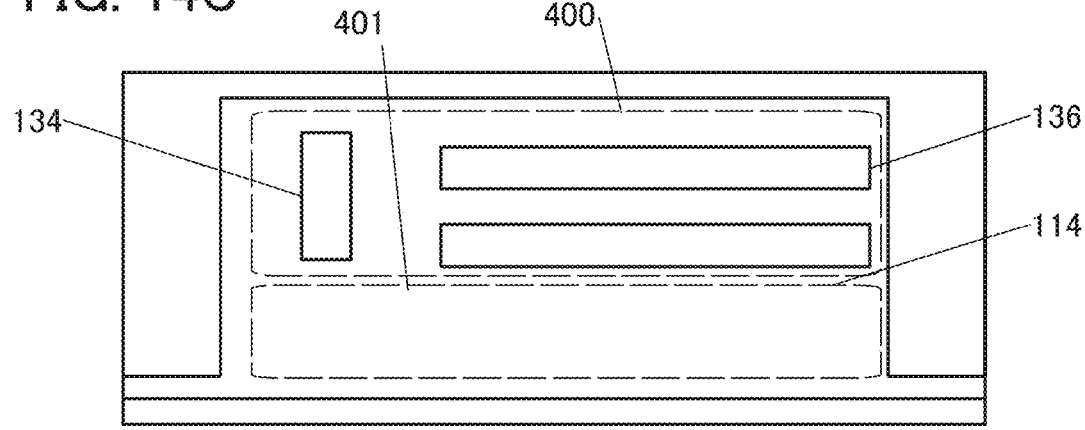

Alternatively, a transmissive region 401 may be provided in one pixel. Alternatively, a semi-transmissive display device including the transmissive region 401 and a reflective region 400 may be formed. FIGS. 14A to 14C illustrate examples in which the upper surface shapes of the coloring layers 114 in FIGS. 2A to 2C are used in semi-transmissive display devices. As illustrated in FIGS. 14A to 14C, it is possible that the opening 136 is not provided in the transmissive region 401.

Figure 3A:
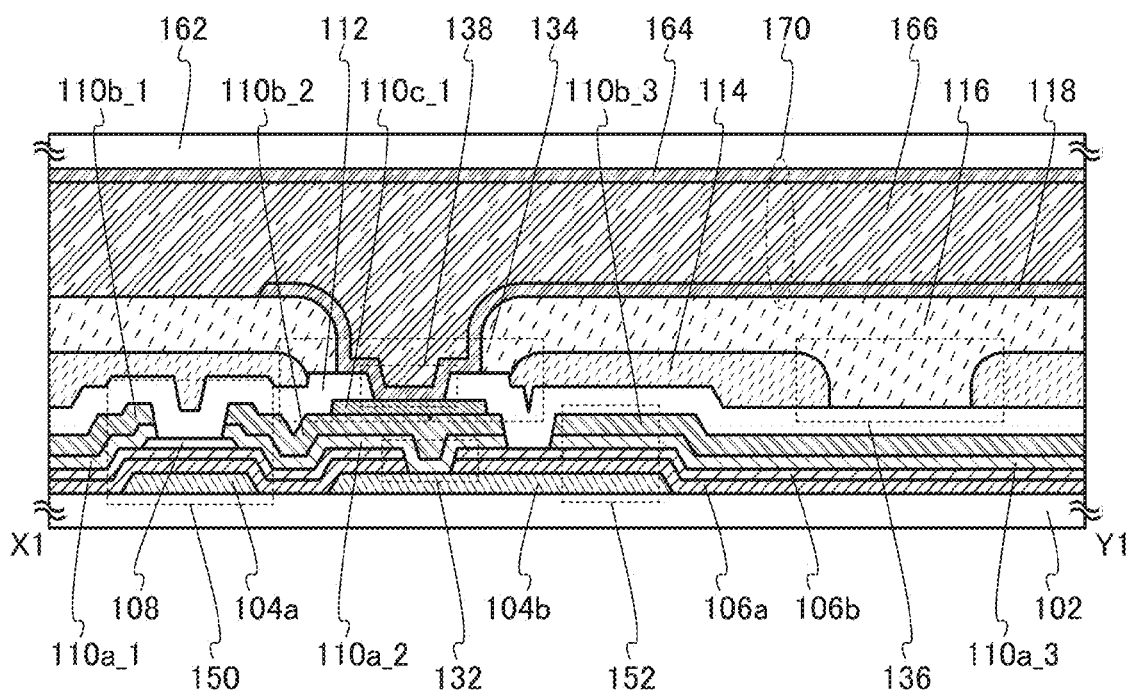
FIGS. 3A and 3B illustrate cross-sectional views of a display device.
Figure 3B:
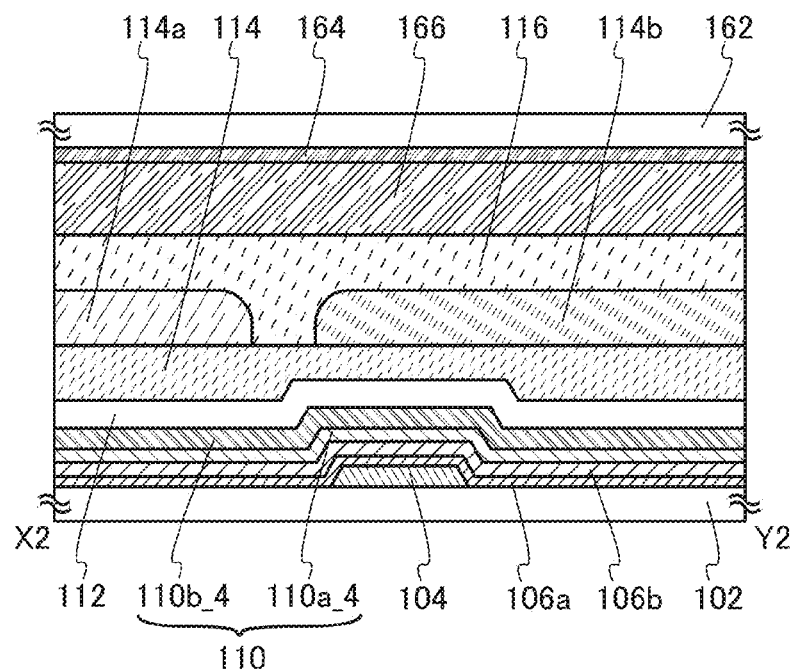

Next, cross sections of the display device illustrated in FIG. 1 are described with reference to FIGS. 3A and 3B. Note that FIG. 3A is a cross-sectional view corresponding to a cross section taken along dashed-dotted line X1-Y1 in FIG. 1. FIG. 3B is a cross-sectional view corresponding to a cross section taken along dashed-dotted line X2-Y2 in FIG. 1.

The display device in FIG. 3A includes a first substrate 102; the conductive layer 104a serving as a gate electrode layer over the first substrate 102; the conductive layer 104b formed in the same step as the conductive layer 104a; an insulating layer 106a and an insulating layer 106b over the first substrate 102 and the conductive layers 104a and 104b; the semiconductor layer 108 which is over the insulating layer 106b and overlaps with the conductive layer 104a; a conductive layer 110a_1 serving as a source electrode layer over the semiconductor layer 108 and the insulating layer 106b; a conductive layer 110a_2 serving as a drain electrode layer over the semiconductor layer 108 and the insulating layer 106b; a conductive layer 110a_3 formed in the same step as the conductive layers 110a_1 and 110a_2; the conductive layers 110b_1, 110b_2, and 110b_3 over the conductive layers 110a_1, 110a_2, and 110a3; a conductive layer 110c_1 over the conductive layer 110b_2; an insulating layer 112 serving as a protective insulating film over the insulating layer 106b, the semiconductor layer 108, and the conductive layers 110b_1, 110b_2, 110b_3, and 110c_1; the coloring layer 114 having a function of a color filter over the insulating layer 112; an insulating layer 116 having a function of an overcoat layer over the coloring layer 114; the pixel electrode layer 118 over the insulating layer 116; a liquid crystal layer 166 over the pixel electrode layer 118; a conductive layer 164 having a function of a counter electrode over the liquid crystal layer 166; and a second substrate 162 over the conductive layer 164.

Note that the conductive layer 104a, the insulating layers 106a and 106b, the semiconductor layer 108, and the conductive layers 110a_1, 110a_2, 110b_1, and 110b_2 form the transistor 150. The conductive layer 104b, the insulating layers 106a and 106b, and the conductive layers 110a_3 and 110b_3 form the capacitor 152.

Note that a portion of the insulating layers 106a and 106b which overlaps with the conductive layer 104a serving as a gate electrode layer has a function of a gate insulating layer of the transistor 150, and a portion thereof which overlaps with the conductive layer 104b has a function of a dielectric layer of the capacitor 152.

The insulating layers 106a and 106b are provided with an opening 132 which reaches the conductive layer 104b, and the conductive layers 110a_2 and 110b_2 having a function of a drain electrode layer of the transistor 150 are connected to the conductive layer 104b through the opening 132.

Figure 16A:
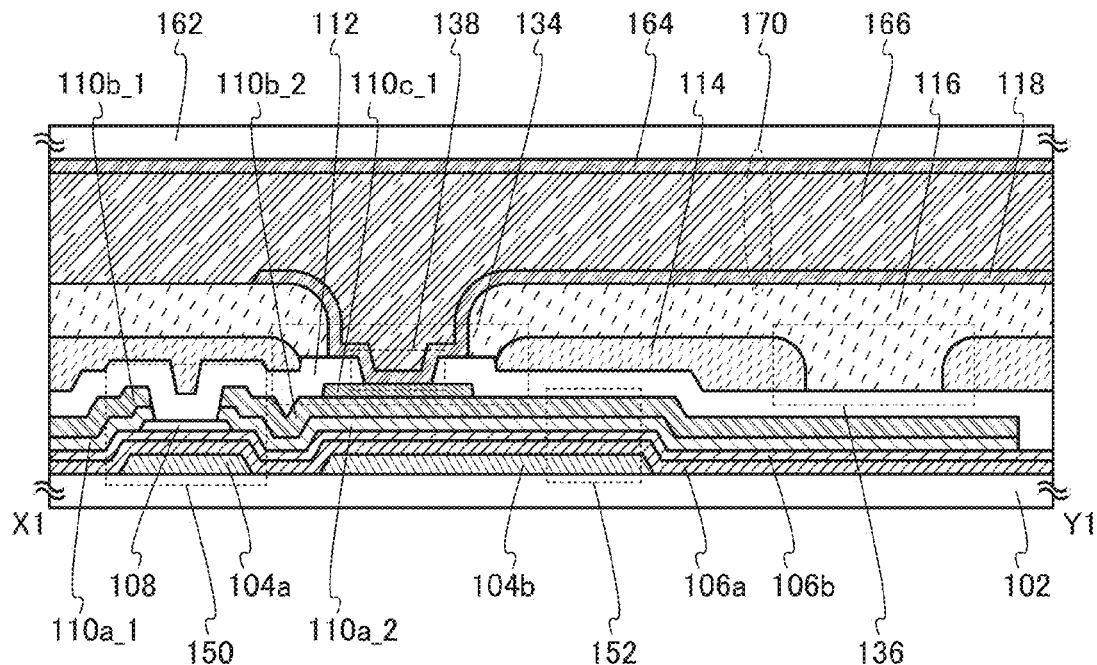
FIGS. 16A and 16B each illustrate a cross-sectional view of a display device.

Note that the example in which the opening 132 is provided is described here; however, one embodiment of the present invention is not limited to this example. For example, a structure in which the opening is not provided as illustrated in FIG. 16A may be employed. In that case, the conductive layer 110b_3 is included in the same island as the conductive layer 110b_2. Similarly, the conductive layer 110a_3 is included in the same island as the conductive layer 110a_2. The conductive layer 104b can serve as a capacitor line. Accordingly, in such a case, the conductive layer 104b is preferably provided so as to extend in a direction substantially parallel to the conductive layer 104a or the gate line 104.

The coloring layer 114 is provided with the opening 134 and the openings 136. In other words, the insulating layer 116 over the coloring layer 114 is in contact with the insulating layer 112 in the opening 134. Note that the adhesion of the insulating layer 116 to the insulating layer 112 is higher than that of the coloring layer 114. Therefore, when there is a region where the insulating layer 116 and the insulating layer 112 are in contact with each other, separation of the coloring layer 114 can be suppressed even in the case where the adhesion between the coloring layer 114 and the insulating layer 112 is not sufficient.

The insulating layer 112 is preferably formed with an inorganic insulating material. The insulating layer 116 is preferably formed with an organic insulating material. When the insulating layer 112 is formed with an inorganic insulating material, the insulating layer 112 can have favorable characteristics of the interface with the semiconductor layer 108. When the insulating layer 116 is formed with an organic insulating material, the pixel electrode layer 118 formed over the insulating layer 116 can have high flatness.

The color purity of the coloring layer 114 can be adjusted with the openings 136 provided in the coloring layer 114. For example, the color purity of the coloring layer 114 can be adjusted by adjusting the shape of the openings 136 or the area of the openings 136.

With such a structure in which the coloring layer 114 has the openings 136, a novel display device capable of adjusting color purity can be provided. It addition, a novel display device with improved adhesion of the coloring layer 114 used as a color filter can be provided.

The insulating layer 112 is provided with the opening 138. The pixel electrode layer 118 is connected to the conductive layer 110c_1 serving as a drain electrode layer of the transistor 150, through the openings 134 and 138.

The conductive layer 110b_3 has a function of a reflective electrode layer. Therefore, a highly reflective conductive layer is preferably used. For example, the highly reflective conductive layer is formed to have a single-layer structure or a stacked-layer structure including any of metals such as aluminum, silver, palladium, and copper or an alloy containing any of these metals as its main component. It is particularly preferable to use a material including aluminum for the conductive layer 110b_3 in terms of cost, processability, and the like. As the conductive layer 110c_1, it is preferable to use a highly oxidation-resistant conductive layer. When a highly oxidation-resistant conductive layer is used as the conductive layer 110c_1, its contact resistance with the pixel electrode layer 118 can be decreased. This can increase reflectance and decrease contact resistance with the pixel electrode layer.

In other words, in the display device illustrated in FIG. 3A, the highly reflective conductive layer is used in the reflective region, and the highly oxidation-resistant conductive layer is used in a region for contact with the pixel electrode layer; thus, the display device is a novel display device which is capable of excellent reflective display and in which contact failures between a transistor and a pixel electrode layer are reduced.

Figure 16B:
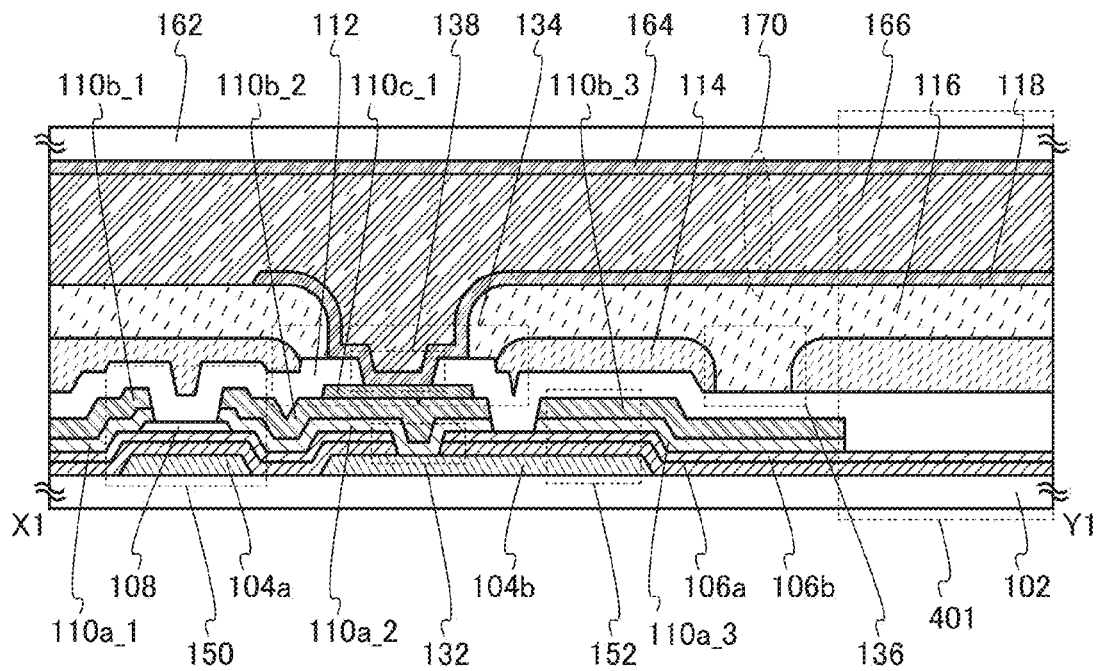

Note that the transmissive region 401 may be provided as illustrated in FIG. 16B.

In the display device in FIG. 3A, the liquid crystal layer 166 is provided between the first substrate 102 and the second substrate 162 which faces the first substrate 102.

The conductive layer 164 is formed under the second substrate 162. The pixel electrode layer 118, the liquid crystal layer 166, and the conductive layer 164 form a liquid crystal element 170. By application of voltage between the pixel electrode layer 118 and the conductive layer 164, the alignment state in the liquid crystal layer 166 can be controlled. In FIG. 3A, the pixel electrode layer 118 and the conductive layer 164 are in contact with the liquid crystal layer 166; however, one embodiment of the present invention is not limited to this structure. For example, alignment films may be formed in a region where the pixel electrode layer 118 is in contact with the liquid crystal layer 166 and a region where the conductive layer 164 is in contact with the liquid crystal layer 166.

In the display device in FIG. 3A, the conductive layer 110b_3 serving as a reflective electrode layer, the coloring layer 114, and the pixel electrode layer 118 can be formed over the first substrate 102; thus, as compared with the case where the coloring layer is formed on the second substrate 162 side, high alignment accuracy can be achieved. With this structure, even a liquid crystal display device with high resolution (e.g., 300 ppi or more) can be a reflective liquid crystal display device capable of color display.

Figure 17A:
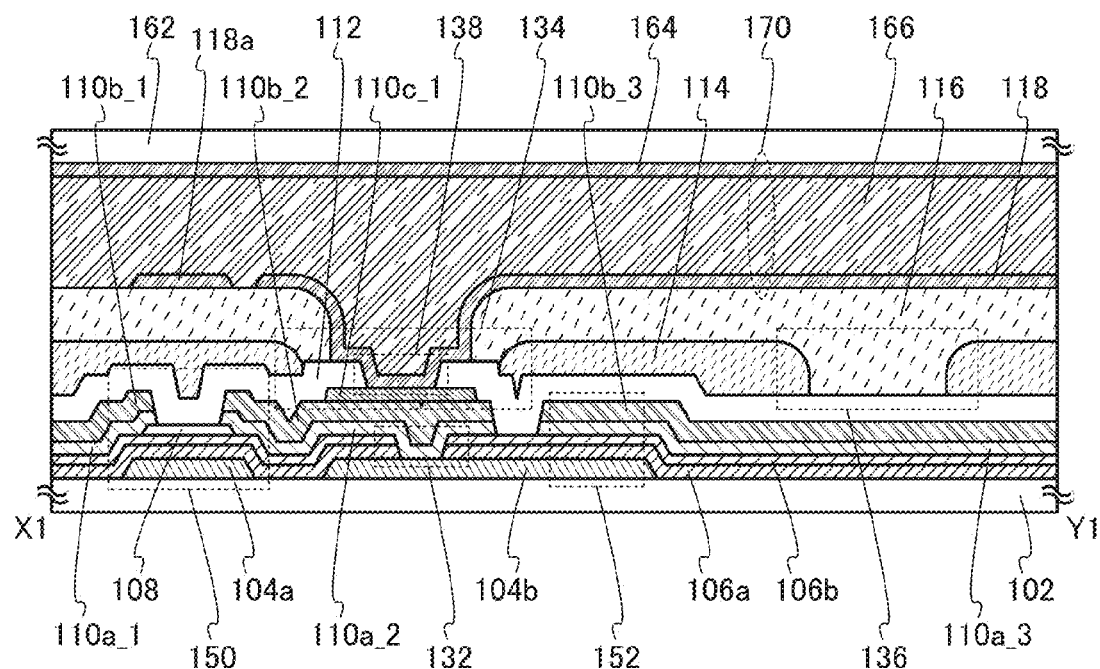
FIGS. 17A and 17B each illustrate a cross-sectional view of a display device.

Note that the transistor 150 may be provided with a gate electrode over a channel or under the channel, or may be provided with gate electrodes over and under the channel. FIG. 17A illustrates an example including a conductive layer 118a which is formed at the same time as the pixel electrode layer 118. The conductive layer 118a can serves as a gate electrode of the transistor 150. Note that the conductive layer 118a may be connected to the conductive layer 104a. In that case, the same signal or potential is supplied to the conductive layer 118a and the conductive layer 104a. Alternatively, different signals or potentials may be supplied to the conductive layer 118a and the conductive layer 104a.

Figure 17B:
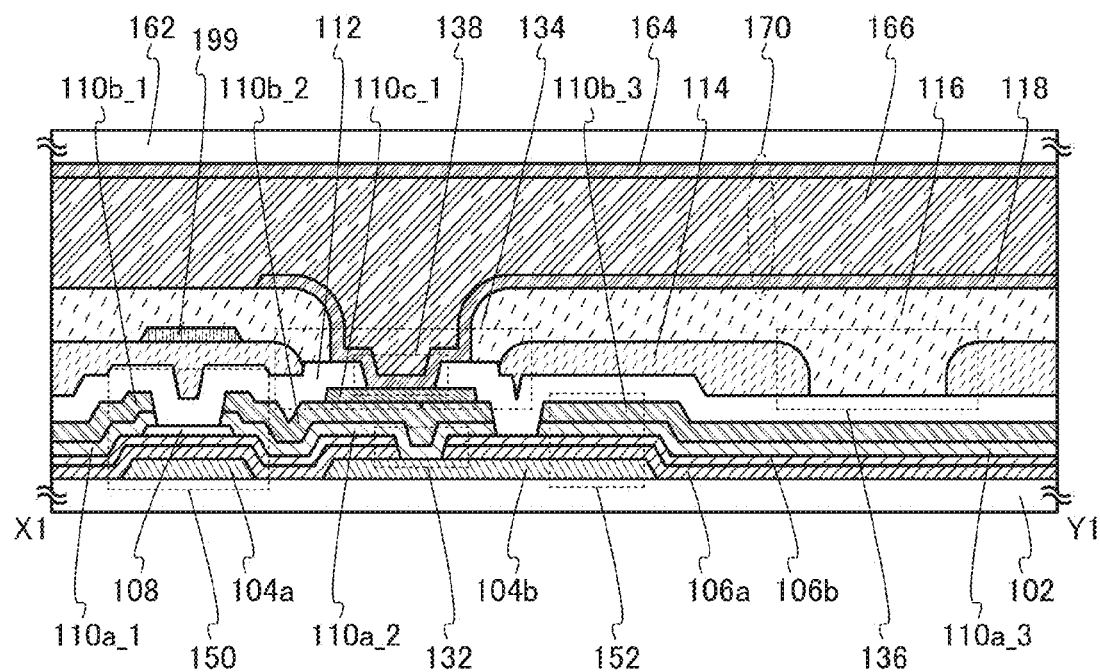
Figure 18A:
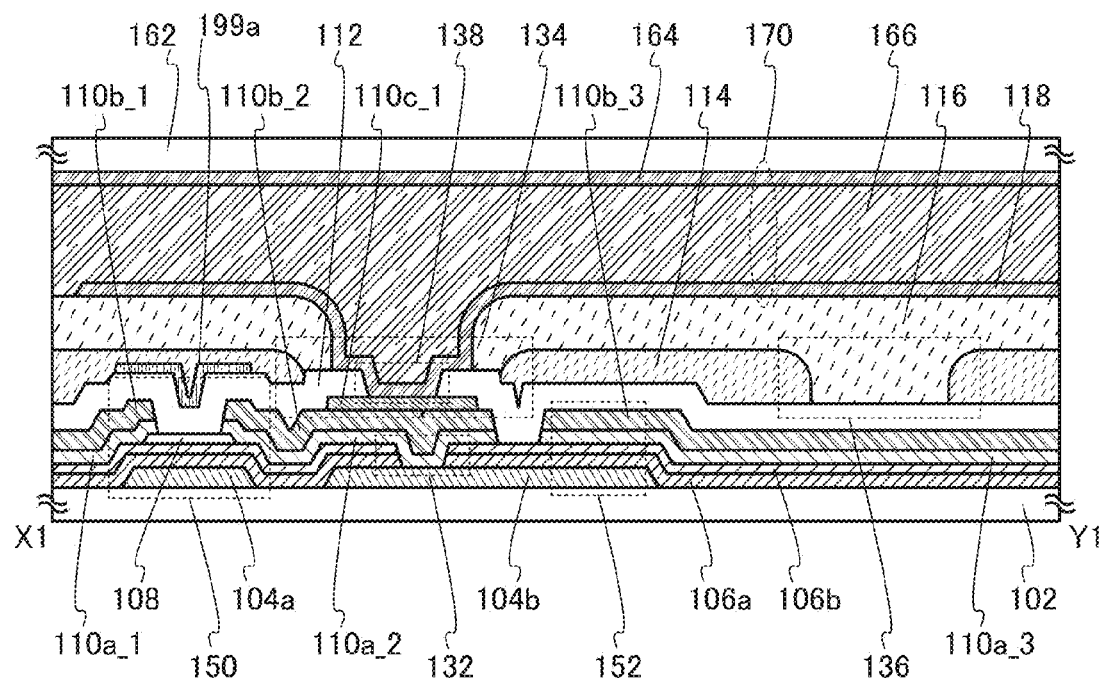
FIGS. 18A and 18B each illustrate a cross-sectional view of a display device.

Since the conductive layer 118a is formed at the same time as the pixel electrode layer 118 through the same film formation step and the same etching step, an increase in the number of steps in the process can be prevented. Note that one embodiment of the present invention is not limited to this example. For example, a different conductive layer may be used to form a conductive layer having a function of a gate electrode of the transistor 150. FIGS. 17B and 18A illustrate examples of such a case. Conductive layers 199 and 199a may contain a material used for the conductive layer 110c_1. Alternatively, the conductive layers 199 and 199a may contain a material similar to the above-described materials that can be used for the conductive layers 104a, 110a_1, 110b_1, and 110c_1, and the like.

Figure 18B:
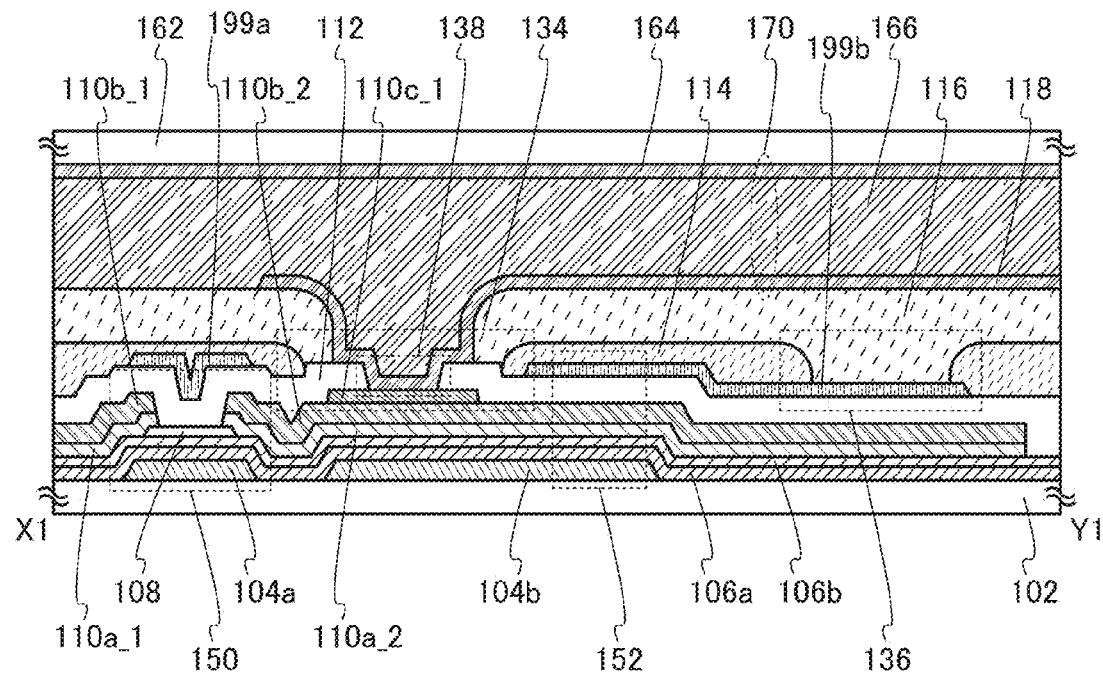

Note that as illustrated in FIG. 18B, a conductive layer 199b may be provided as a conductive layer which is formed at the same time as the conductive layer 199a through the same film formation step and the same etching step. This conductive layer can serve as a reflective electrode when formed using a highly reflective material similar to that used for the conductive layer 110b_3. Alternatively, the conductive layer can form a capacitor when overlapping with the conductive layer 110b_2. In that case, the conductive layer 199h may be connected to the conductive layer 104h.

Figure 19A:
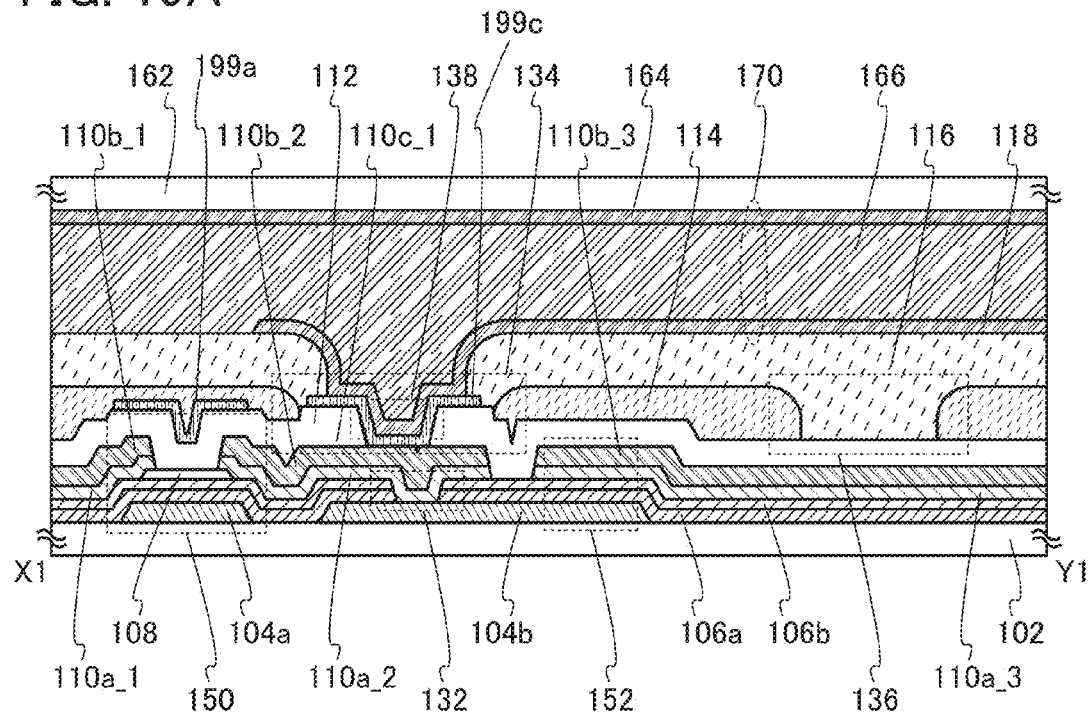
FIGS. 19A and 19B each illustrate a cross-sectional view of a display device.
Figure 19B:
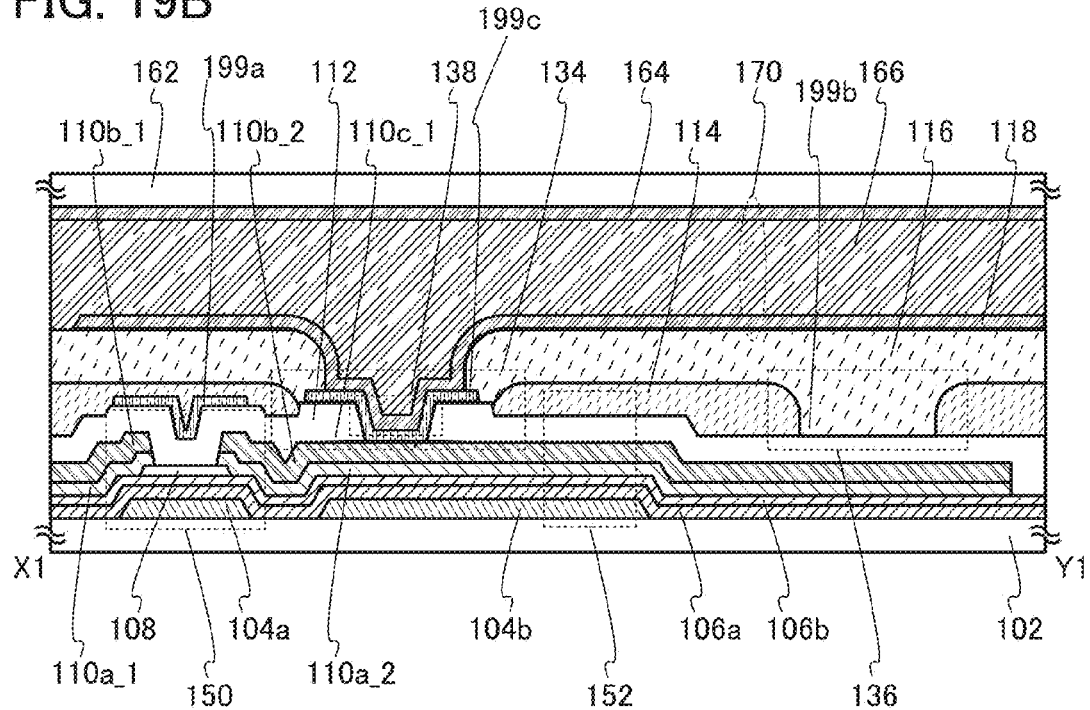
Figure 20A:
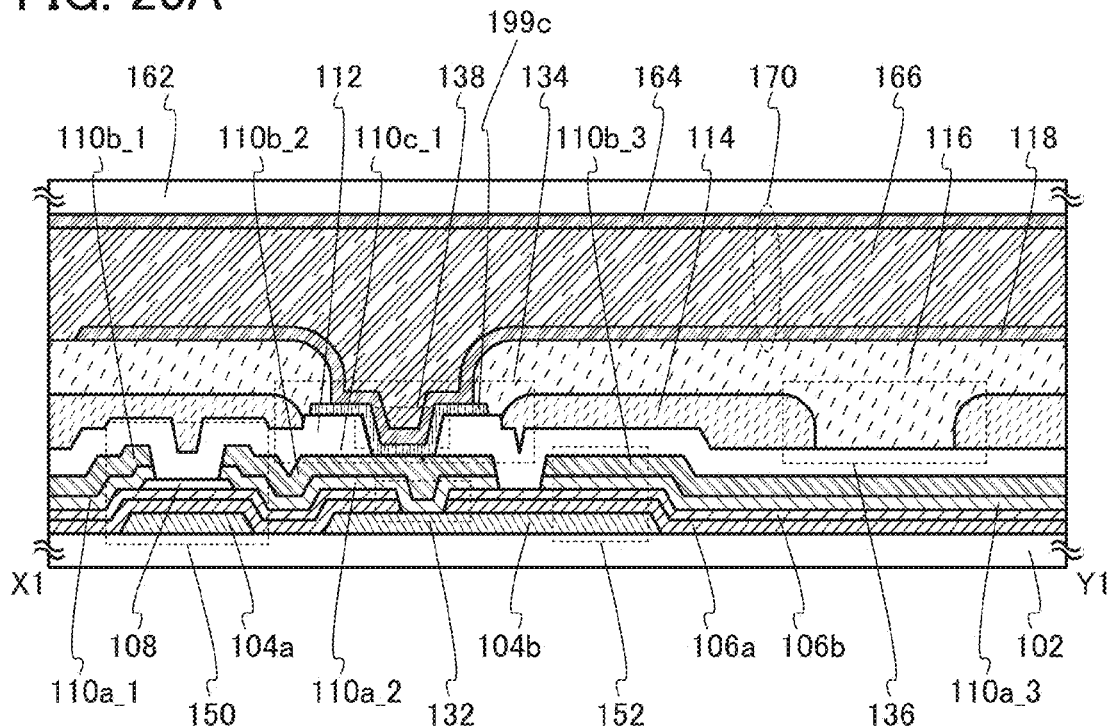
FIGS. 20A and 20B each illustrate a cross-sectional view of a display device.
Figure 20B:
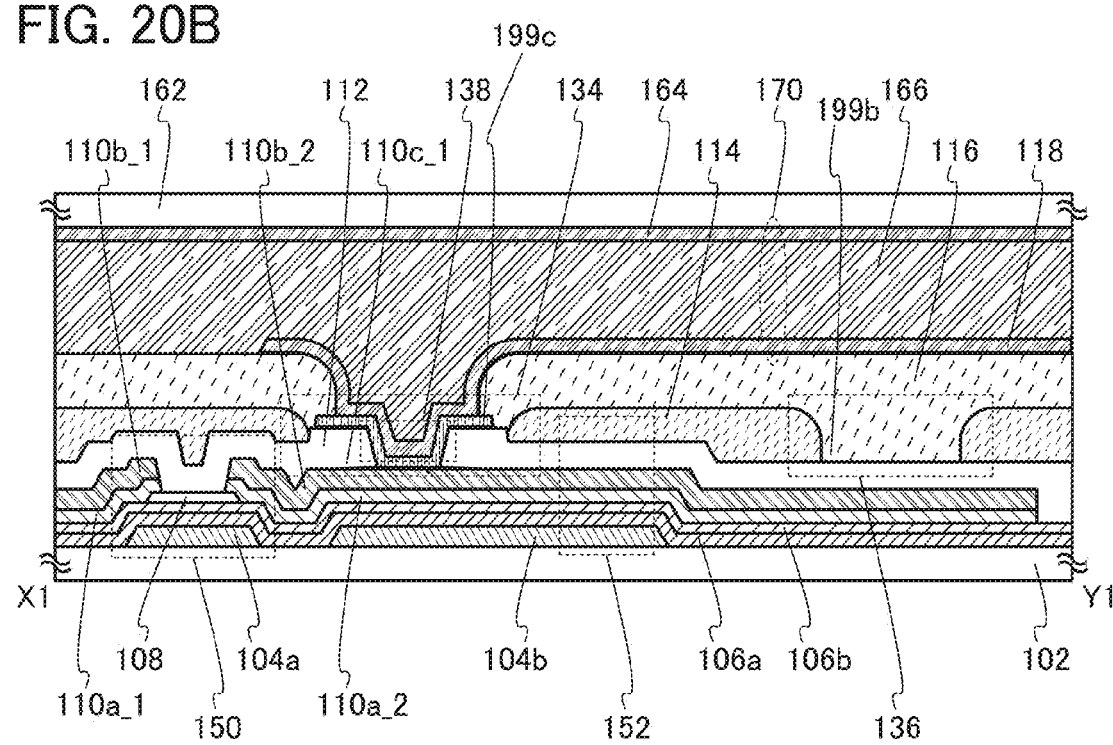

Note that a conductive layer 199c may be provided as a conductive layer which is formed at the same time as the conductive layer 199a through the same film formation step and the same etching step. The conductive layer 199c may be provided in a portion for connection to the pixel electrode layer 118. FIGS. 19A and 19B illustrate examples of such a case. In that case, the conductive layer 199a may contain a material similar to that of the conductive layer 110c_1. Note that the conductive layer 199a is not necessarily provided. FIGS. 20A and 20B illustrate examples of such a case.

Next, the display device illustrated in FIG. 3B will be described below.

The display device in FIG. 3B includes the first substrate 102; the gate line 104 over the first substrate 102; the insulating layers 106a and 106b over the gate line 104; conductive layers 110a_4 and 110b_4 over the insulating layer 106b; the insulating layer 112 over the insulating layer 106b and the conductive layer 110b_4; the coloring layer 114 over the insulating layer 112; coloring layers 114a and 114b over the coloring layer 114; the insulating layer 116 over the coloring layers 114, 114a, and 114b; the liquid crystal layer 166 over the insulating layer 116; the conductive layer 164 over the liquid crystal layer 166; and the second substrate 162 over the conductive layer 164. Note that the conductive layers 110a_4 and 110b_4 serve as the source line 110.

FIG. 3B is a cross-sectional view of a region where the gate line 104 and the conductive layers 110a_4 and 110b_4 serving as the source line 110 intersect with each other.

When the coloring layers 114a and 114b are formed over the coloring layer 114 as illustrated in FIG. 3B, surface reflection due to the gate line 104 or the conductive layer 110b_4 can be suppressed. Note that the coloring layer 114a is a coloring layer of an adjacent pixel, here the lower pixel in FIG. 1. The coloring layer 114b is a coloring layer of an adjacent pixel, here the upper pixel in FIG. 1. For example, the coloring layer 114 may be green (G); the coloring layer 114a may be blue (B); and the coloring layer 114b may be red (R).

With such a structure in which coloring layers are stacked in a region other than at least a reflective region, i.e., a structure in which a coloring layer overlaps with a coloring layer of an adjacent pixel, part of the coloring layers can function as a black matrix.

Note that other components of the display device in FIG. 1 and FIGS. 3A and 3B are described in detail in Method for Manufacturing Display Device.

<Method for Manufacturing Display Device>

A method for manufacturing the display device illustrated in FIG. 1 and FIGS. 3A and 3B is described below with reference to FIGS. 4A to 4D, FIGS. 5A to 5D, and FIGS. 6A to 6C.

First, the first substrate 102 is prepared. For the first substrate 102, a glass material such as aluminosilicate glass, aluminoborosilicate glass, or barium borosilicate glass is used. In the mass production, for the first substrate 102, a mother glass with any of the following sizes is preferably used: the 8th generation (2160 mm×2460 mm), the 9th generation (2400 mm×2800 mm, or 2450 mm×3050 mm), the 10th generation (2950 mm×3400 mm), and the like. High process temperature and a long period of process time drastically shrink the mother glass. Thus, in the case where mass production is performed with the use of the mother glass, the heating temperature in the manufacturing process is preferably 600° C. or lower, further preferably 450° C. or lower, still further preferably 350° C. or lower.

Figure 4A:
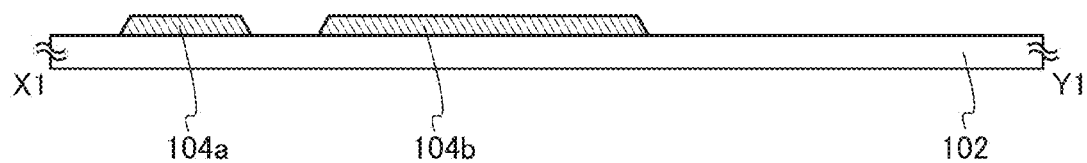
FIGS. 4A to 4D are cross-sectional views illustrating a method for manufacturing a display device.

Then, a conductive layer is formed over the first substrate 102 and processed into desired shapes, so that the conductive layers 104a and 104b are formed (see FIG. 4A).

For the conductive layers 104a and 104b, a metal element selected from aluminum, chromium, copper, tantalum, titanium, molybdenum, and tungsten, an alloy containing any of these metal elements as a component, an alloy containing these metal elements in combination, or the like can be used. In addition, the conductive layers 104a and 104h may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are contained may be used. The conductive layers 104a and 104b can be formed by a sputtering method, for example.

Figure 4B:
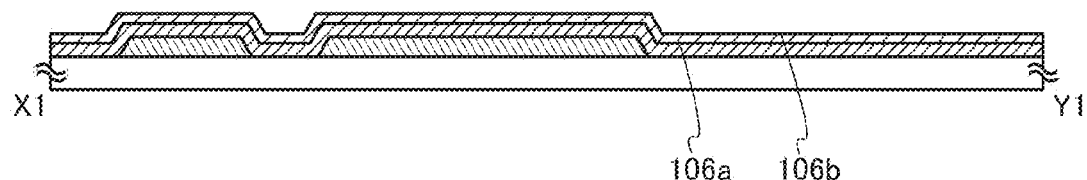
Figure 4C:
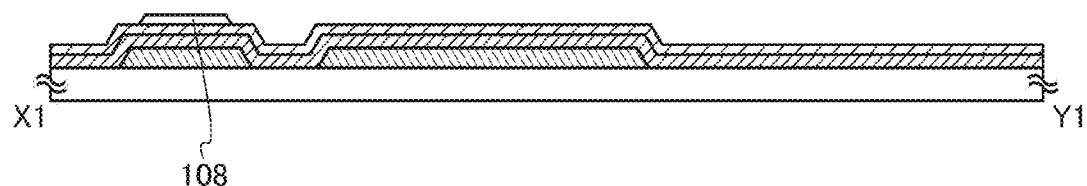

Next, the insulating layers 106a and 106b are formed over the first substrate 102 and the conductive layers 104a and 104b (see FIG. 4B).

The insulating layer 106a is formed to have a single-layer structure or a stacked-layer structure using, for example, any of a silicon nitride oxide film, a silicon nitride film, an aluminum oxide film, and the like with a PE-CVD apparatus. In the case where the insulating layer 106a has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating layer 106a can be prevented from moving or diffusing into the semiconductor layer 108 formed later.

The insulating layer 106b is formed to have a single-layer structure or a stacked-layer structure using any of a silicon oxide film, a silicon oxynitride film, and the like with a PE-CVD apparatus.

As for the insulating layers 106a and 106b, for example, a 400-nm-thick silicon nitride film can be formed as the insulating layer 106a, and then a 50-nm-thick silicon oxynitride film can be formed as the insulating layer 106b. The silicon nitride film and the silicon oxynitride film are preferably formed in succession in a vacuum such that fewer impurities are mixed into the films. Note that portions of the insulating layers 106a and 106b overlapping with the conductive layer 104a serve as the gate insulating layer of the transistor 150. In addition, portions of the insulating layers 106a and 106b overlapping with the conductive layer 104b serve as a dielectric layer of the capacitor 152.

Note that silicon nitride oxide refers to an insulating material that contains more nitrogen than oxygen, whereas silicon oxynitride refers to an insulating material that contains more oxygen than nitrogen.

When the gate insulating layer has the above structure, the following effects can be obtained, for example. The silicon nitride film has a higher relative permittivity than a silicon oxide film and needs a larger thickness for an equivalent capacitance. Thus, the physical thickness of the gate insulating layer can be increased. This makes it possible to reduce a decrease in the withstand voltage of the transistor 150 and furthermore increase the withstand voltage, thereby preventing electrostatic breakdown of the transistor 150.

Next, a semiconductor layer is formed over the insulating layer 106b and processed into a desired shape, so that the semiconductor layer 108 is formed. Note that the semiconductor layer 108 is formed in a position overlapping with the conductive layer 104a (see FIG. 4C).

For the semiconductor layer 108, amorphous silicon, polycrystalline silicon, single crystal silicon, or the like can be used, for example. It is particularly preferable to use an oxide semiconductor for the semiconductor layer 108. The oxide semiconductor preferably includes an oxide represented by an In-M-Zn oxide that contains at least indium (In), zinc (Zn), and Al (Al represents Al, Ga, Ge, Y, Zr, Sn, La, Ce, or Hi), Alternatively, both In and Zn are preferably contained.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, In—Ga—Zn oxide means an oxide containing In, Ga, and Zn as its main components and there is no particular limitation on the ratio of In to Ga and Zn. The In—Ga—Zn oxide may contain another metal element in addition to in, Ga, and Zn. In this embodiment, an oxide semiconductor is used for the semiconductor layer 108.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate for desorbed oxygen. By the first heat treatment, the crystallinity of the oxide semiconductor that is used for the semiconductor layer 108 can be improved, and in addition, impurities such as hydrogen and water can be removed from the insulating layers 106a and 106b and the semiconductor layer 108. The first heat treatment may be performed before processing into the semiconductor layer 108 having an island shape.

Figure 4D:
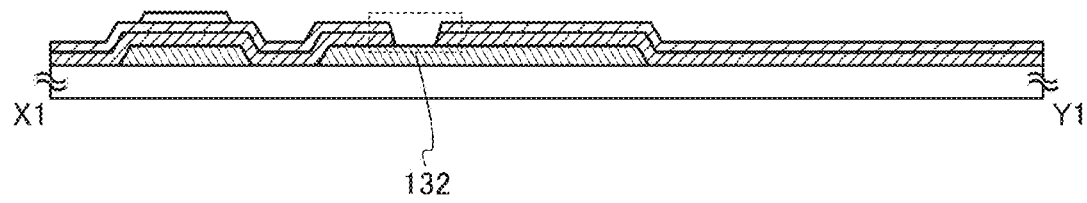

Next, the opening 132 is formed in a desired region of the insulating layers 106a and 106b (see FIG. 4D).

Note that the opening 132 is formed so as to reach the conductive layer 104b. The opening 132 can be formed by, for example, wet etching, dry etching, or a combination of wet etching and dry etching.

Figure 5A:
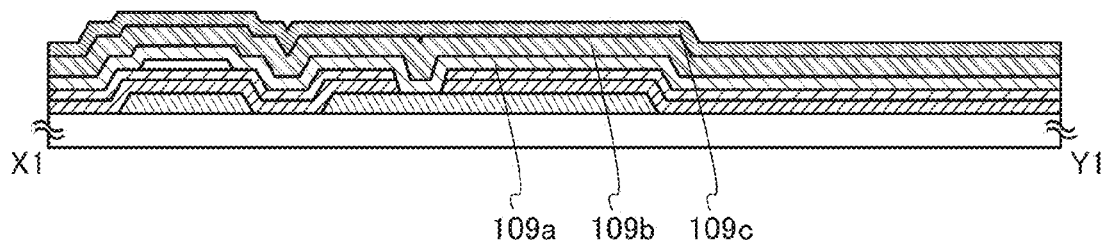
FIGS. 5A to 5D are cross-sectional views illustrating a method for manufacturing a display device.

Next, a conductive layer 109a, a conductive layer 109b, and a conductive layer 109c are formed over the insulating layer 106b and the semiconductor layer 108 so as to cover the opening 132 (see FIG. 5A).

The conductive layer 109a serves as a barrier metal. The conductive layer 109a can be formed using any material that provides excellent contact resistance between the conductive layer 109a and the semiconductor layer 108. For example, the conductive layer 109a is formed to have a single-layer structure or a stacked-layer structure including any of metals such as titanium, chromium, nickel, yttrium, zirconium, molybdenum, tantalum, and tungsten or an alloy containing any of these metals as its main component.

The conductive layer 109b, which is to serve as part of a reflective electrode layer, is preferably formed using a conductive material with high reflectivity. Further, the conductive layer 109b serves as part of the source electrode layer and part of the drain electrode layer of the transistor, and therefore is preferably formed using a low-resistance material. For example, the conductive layer 109b is formed to have a single-layer structure or a stacked-layer structure including any of metals such as aluminum, silver, palladium, and copper or an alloy containing any of these metals as its main component. It is particularly preferable to use a material including aluminum for the conductive layer 109b in terms of cost, processability, and the like.

The conductive layer 109c can be formed using any material that provides excellent contact resistance between the conductive layer 109c and the pixel electrode layer 118 connected later, and a highly oxidation-resistant conductive layer can be used. Note that the oxidation resistance of the highly oxidation-resistant conductive layer is higher than at least that of a material used for the conductive layer 109b. For example, the conductive layer 109c is formed to have a single-layer structure or a stacked-layer structure including any of metals such as titanium, chromium, nickel, yttrium, molybdenum, tantalum, and tungsten, an alloy containing any of these metals as its main component, or a metal nitride containing any of these materials as its main component. It is particularly preferable to use a material including titanium or molybdenum for the conductive layer 109c, in which case excellent contact resistance between the conductive layer 109c and a material (e.g., indium tin oxide (ITO)) used for the pixel electrode layer 118 can be provided.

For example, a titanium film or a titanium nitride film is used as the conductive layer 109a, an aluminum film or a silver film is used as the conductive layer 109b, and a titanium film or a titanium nitride film is used as the conductive layer 109c. Alternatively, a molybdenum film or a molybdenum nitride film is used as the conductive layer 109a, an aluminum film or a silver film is used as the conductive layer 109b, and a molybdenum film or a molybdenum nitride film is used as the conductive layer 109c.

Note that the structures of the conductive layers 109a, 109b, and 119c are not limited to the above, and a two-layer structure without the conductive layer 109a may be employed. An example of the two-layer structure is a structure in which an aluminum film is used as the conductive layer 109h and a titanium film is used as the conductive layer 109c.

The conductive layers 109a, 109b, and 109c can be formed by a sputtering method, for example.

Figure 5B:
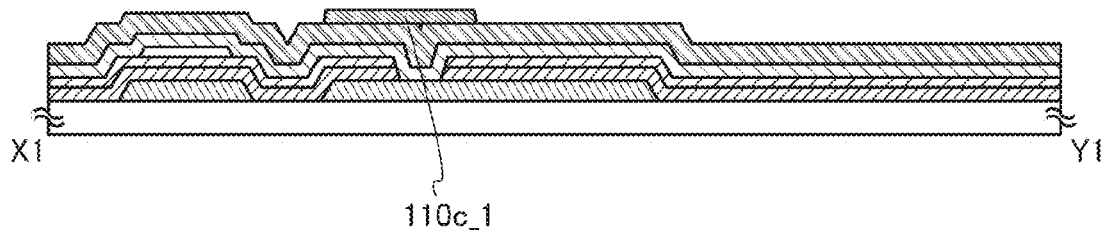

Then, the conductive layer 109c is processed into a desired shape, so that the conductive layer 110c_1 is formed (see FIG. 5B).

The conductive layer 110c_1 is formed at least in a region to be in contact with the pixel electrode layer 118 later. A conductive layer different from the conductive layer 110c_1 may be formed in the same step as the conductive layer 110c_1. An example of the conductive layer formed in the same step as the conductive layer 110c_1 is a conductive layer formed over a connection portion or an FPC terminal portion.

Note that when the conductive layer 110c_1 is formed, at least a portion of a surface of the conductive layer 109b is exposed. A region of the conductive layer 109b where the surface is exposed serves as a reflective electrode layer later. Examples of a method for forming the conductive layer 110c_1 include a dry etching method, a wet etching method, and plasma treatment. When the conductive layer 110c_1 is formed, the surface of the conductive layer 109b may become uneven. The uneven surface can diffusely reflect incident light. This is preferable when the conductive layer 109b is used as the reflective electrode layer because the reflective electrode layer can have improved reflection efficiency.

Then, the conductive layers 109a and 109b are processed into desired shapes, so that the conductive layers 110a_1, 110b_1, 110a_2, and 110b_2, which serve as the source electrode layer and the drain electrode layer of the transistor 150, and the conductive layers 110a_3 and 110b_3, which serve as the reflective electrode layer and one electrode of the capacitor 152, are formed. At this stage, the transistor 150 and the capacitor 152, are formed (see FIG. 5C).

The conductive layers 110a_1, 110b_1, 110a_2, 110b_2, 110a_3, and 110b_3 are formed in such a manner that a mask is formed over the conductive layers 109a, and 109b and regions not covered with the mask are etched. As an etching method for forming the conductive layers 110a_1, 110b_1, 110a_2, 110b_2, 110a_3, and 110b_3, a dry etching method or a wet etching method can be used.

When the conductive layers 110a_1, 110b_1, 110b_2, 110a_3 and 110b_3 are formed, the semiconductor layer 108 may be partly etched to have a depressed portion.

Figure 5C:
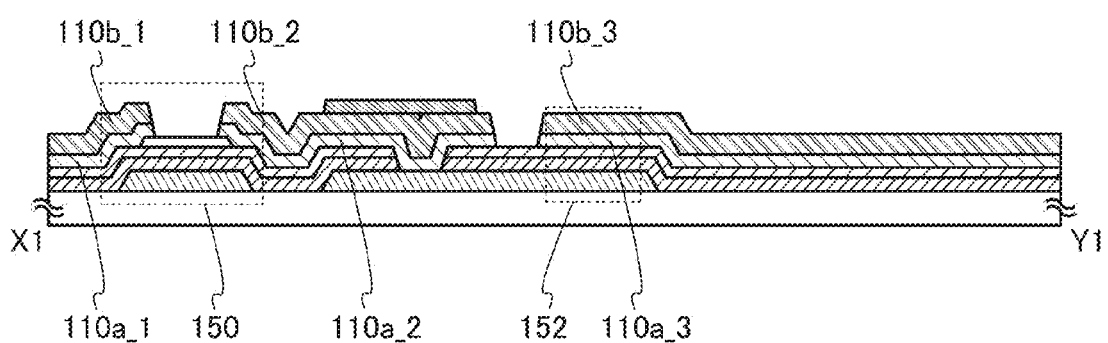
Figure 15:
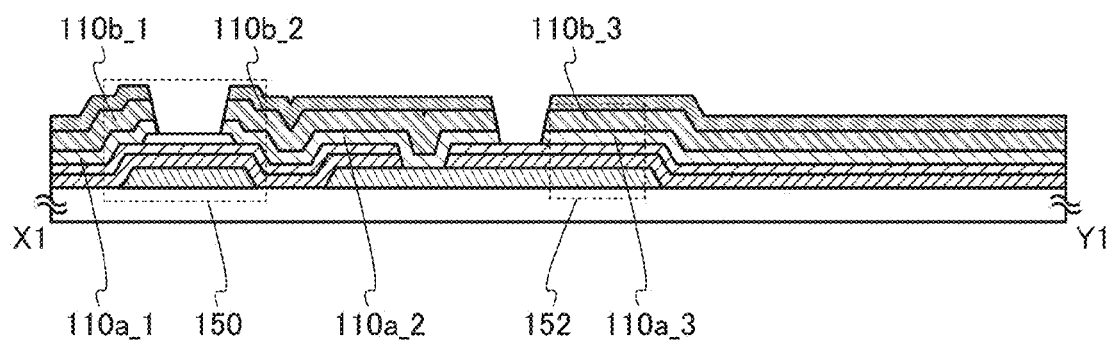
FIG. 15 is a cross-sectional view illustrating a method for manufacturing a display device.

Note that the cross-sectional structure illustrated in FIG. 5C may be formed using a half-tone mask or a gray-tone mask, a phase-shift mask, or the like). In that case, after the step in FIG. 5A, a cross-sectional structure illustrated in FIG. 15 is obtained by etching of the conductive layers 109a, 109b and 109c. After that, the resist is made slightly smaller by aching or the like, and then, only part of the conductive layers is etched. As a result, such a cross-sectional structure as illustrated in FIG. 5C is obtained. With the use of a half-tone mask (or a gray-tone mask, a phase-shift mask, or the like), the number of steps in the process can be reduced. In that case, the conductive layer 110b_2 or the like is necessarily provided under the conductive layer 110c_1. Note that one embodiment of the present invention is not limited to this example. For example, it is possible that the conductive layer 110b_2 or the like is not provided under the conductive layer 110c_1 and an insulating film is provided under the conductive layer 110c_1. Alternatively, for example, after the cross-sectional structure illustrated in FIG. 15 is obtained, the insulating layer 112 may be formed thereover without etching of the conductive layers.

Figure 5D:
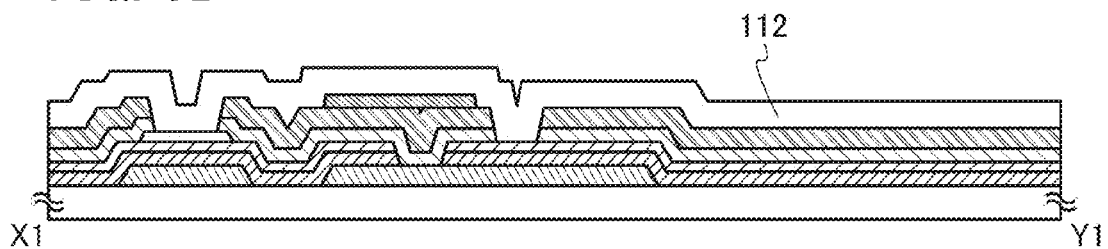

Next, the insulating layer 112 is formed over the semiconductor layer 108, the conductive layers 110b_1, 110b_2, 110b_3, and 110c_1, and the insulating layer 106b (see FIG. 5D).

For the insulating layer 112, an inorganic insulating material containing oxygen can be used in order to improve the characteristics of the interface with the oxide semiconductor used for the semiconductor layer 108. The insulating layer 112 can be formed by a PE-CVD method, for example.

As an example of the insulating layer 112, a silicon oxide film, a silicon oxynitride film, an aluminum oxide film, or the like having a thickness of greater than or equal to 50 nm and less than or equal to 500 nm can be used. In this embodiment, a 450-nm-thick silicon oxynitride film is used as the insulating layer 112.

Another insulating layer may be formed over the insulating layer 112. The insulating layer is formed using a material that can prevent an external impurity such as water, an alkali metal, or an alkaline earth metal from diffusing into the oxide semiconductor used for the semiconductor layer 108. For example, a silicon nitride film, a silicon nitride oxide film, or the like having a thickness of greater than or equal to 50 nm and less than or equal to 500 nm can be used as the insulating layer.

The insulating layer 112 over the conductive layer 110b_3 serving as a reflective electrode layer is preferably thin. For example, the thickness of the insulating layer 112 over the conductive layer 110b_3 is preferably greater than or equal to 1 nm and less than or equal to 100 nm, further preferably greater than or equal to 5 nm and less than or equal to 50 nm. Forming the insulating layer 112 thin over the conductive layer 110b_3 can shorten the optical path length between the conductive layer 110b_3 and the coloring layer 114. For example, the insulating layer 112 over the conductive layer 110b_3 serving as a reflective electrode layer is thinned in such a manner that, after the formation of the insulating layer 112, a mask is formed in a region other than the conductive layer 110b_3 and the insulating layer 112 over the conductive layer 110b_3 is etched.

Next, the coloring layer 114 having a desired shape is formed over the insulating layer 112. Then, the insulating layer 116 is formed so as to cover the coloring layer 114 (see FIG. 6A).

The coloring layer 114 is a coloring layer having a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with any of various materials by a printing method, an inkjet method, an etching method using a photolithography technique, or the like.

Note that the coloring layer 114 has the opening 134 serving as a first opening and the opening 136 serving as a second opening.

For the insulating layer 116, an organic insulating material such as an acrylic resin can be used. With the insulating layer 116, an impurity or the like contained in the coloring layer 114 can be prevented from diffusing to the liquid crystal layer 166 side, for example. Moreover, the insulating layer 116 can planarize unevenness and the like due to the transistor 150 or the coloring layer 114.

Note that the insulating layer 116 preferably has an opening in substantially the same position as the opening 134 in the coloring layer 114. The opening is formed so as to expose a portion of a surface of the insulating layer 112.

Figure 6A:
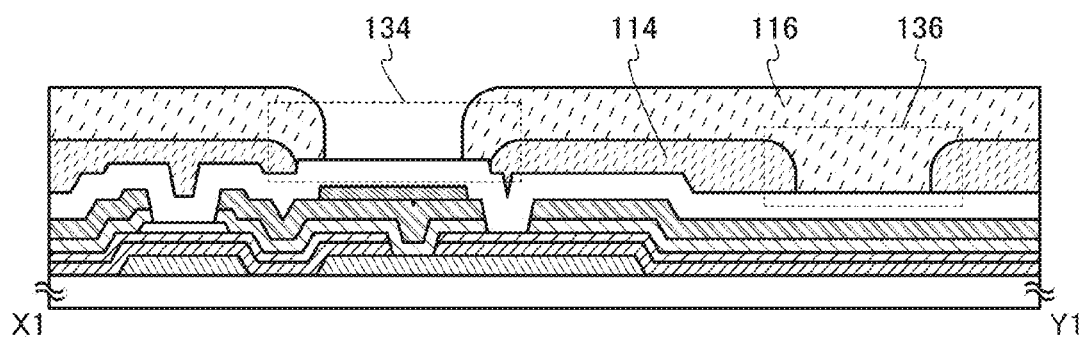
FIGS. 6A to 6C are cross-sectional views illustrating a method for manufacturing a display device.
Figure 6B:
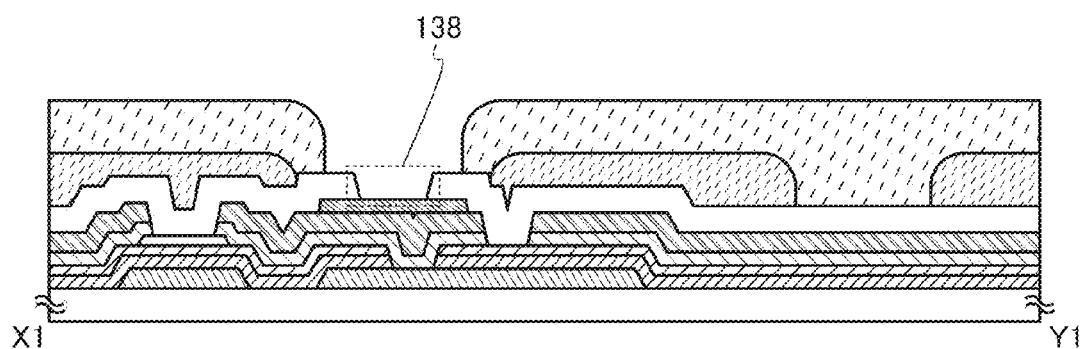

Next, the opening 138 is formed (see FIG. 6B).

The opening 138 is formed in a desired region so as to expose the conductive layer 110c_1. An example of a formation method of the opening 138 is, but is not limited to, a dry etching method. Alternatively, a wet etching method or a combination of dry etching and wet etching can be employed for formation of the opening 138.

Figure 6C:
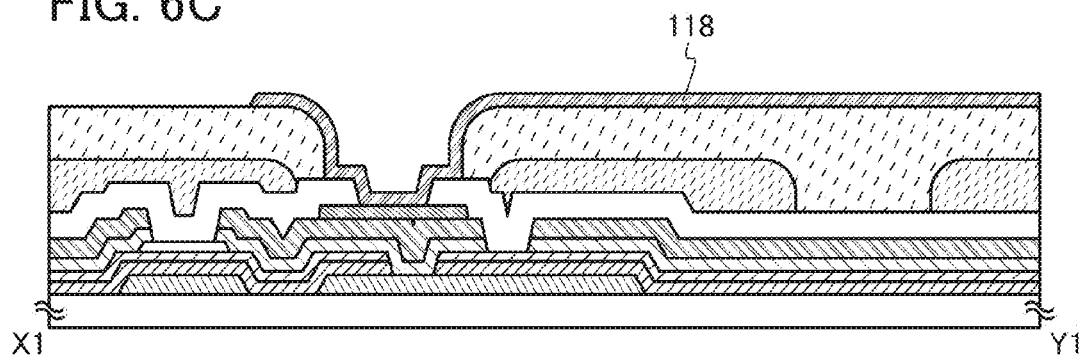

Then, the pixel electrode layer 118 is formed in a desired region over the insulating layer 116 so as to cover the openings 134 and 138 (see FIG. 6C).

A material having the property of transmitting visible light may be used for the pixel electrode layer 118. For example, a material including one of indium (In), zinc (Zn), and tin (Sn) is preferably used for the pixel electrode layer 118. The pixel electrode layer 118 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added. The pixel electrode layer 118 can be formed by a sputtering method, for example.

Note that the pixel electrode layer 118 is connected to the conductive layer 110c_1 through the openings 134 and 138. In other words, the pixel electrode layer 118 is electrically connected to the conductive layers 110a_2 and 110b_2 serving as a drain electrode layer of the transistor 150.

Through the above process, the structure over the first substrate 102 can be formed.

Next, the first substrate 102 and the second substrate 162 are attached to each other and the liquid crystal layer 166 is formed.

Note that the second substrate 162 has the conductive layer 164. The conductive layer 164, which serves as the other electrode of the liquid crystal element 170, is preferably formed using a light-transmitting material. For the conductive layer 164, a material that can be used for the pixel electrode layer 118 can be used.

The liquid crystal layer 166 can be formed by a dispenser method (a dropping method), or an injecting method by which a liquid crystal is injected using a capillary phenomenon after the first substrate 102 and the second substrate 162 are attached to each other.

There is no particular limitation on materials that can be used for the liquid crystal layer 166, and a nematic liquid crystal material, a cholesteric liquid crystal material, or the like may be used, for example. For the liquid crystal layer 166, a polymer dispersed liquid crystal, a high molecular compound dispersed liquid crystal, a polymer network liquid crystal, or the like may be used.

Through the above process, the display device illustrated in FIG. 1 and FIGS. 3A and 3B can be manufactured.

Although not illustrated, in this embodiment, an alignment film or an optical film such as a polarizing plate, a circularly polarizing plate (including an elliptically polarizing plate), or a retardation plate (a quarter-wave plate or a half-wave plate) may be provided as appropriate if necessary. Furthermore, the polarizing plate or the circularly polarizing plate may be provided with an anti-reflection film. For example, anti-glare treatment by which reflected light can be diffused by projections and depressions on the surface so as to reduce the glare can be performed.

Although the case of a reflective display device is described in this embodiment, one embodiment of the present invention is not limited to this example. For example, in an aperture portion of a pixel, a transmissive region may be provided. For example, in one part of an aperture portion of a pixel, a reflective region may be provided, and in another part thereof, a transmissive region may be provided. Therefore, one embodiment of the present invention can also be applied to a semi-transmissive display device.

Although the example in which the coloring layer 114 is provided with the openings 136 is described in this embodiment, one embodiment of the present invention is not limited to this example. Depending on circumstances or conditions, the coloring layer 114 is not necessarily provided with the openings 136. For example, it is possible that the opening 136 is not provided in at least one of R, G, and B pixels.

Alternatively, in the case where a transmissive region and a reflective region are provided in an aperture portion of a pixel, it is possible that the coloring layer 114 is provided with the opening 136 in the reflective region and the coloring layer 114 is not provided with the opening 136 in the transmissive region.

Although the example in which the coloring layer 114 is provided over the first substrate 102, is described in this embodiment, one embodiment of the present invention is not limited to this example. Depending on circumstances or conditions, the coloring layer 114 is not necessarily provided over the first substrate 102. For example, in the case where a W (white) pixel is used in addition to the R, C, and B pixels, it is possible that the coloring layer 114 is not provided over the first substrate 102.

This embodiment can be combined with any of the other embodiments in this specification as appropriate.

Embodiment 2

In this embodiment, a modification example of the display device described in Embodiment 1 is described with reference to FIGS. 7A and 7B. Note that portions having functions similar to those in Embodiment 1 are given the same reference numerals and detailed description thereof is omitted.

Figure 7A:
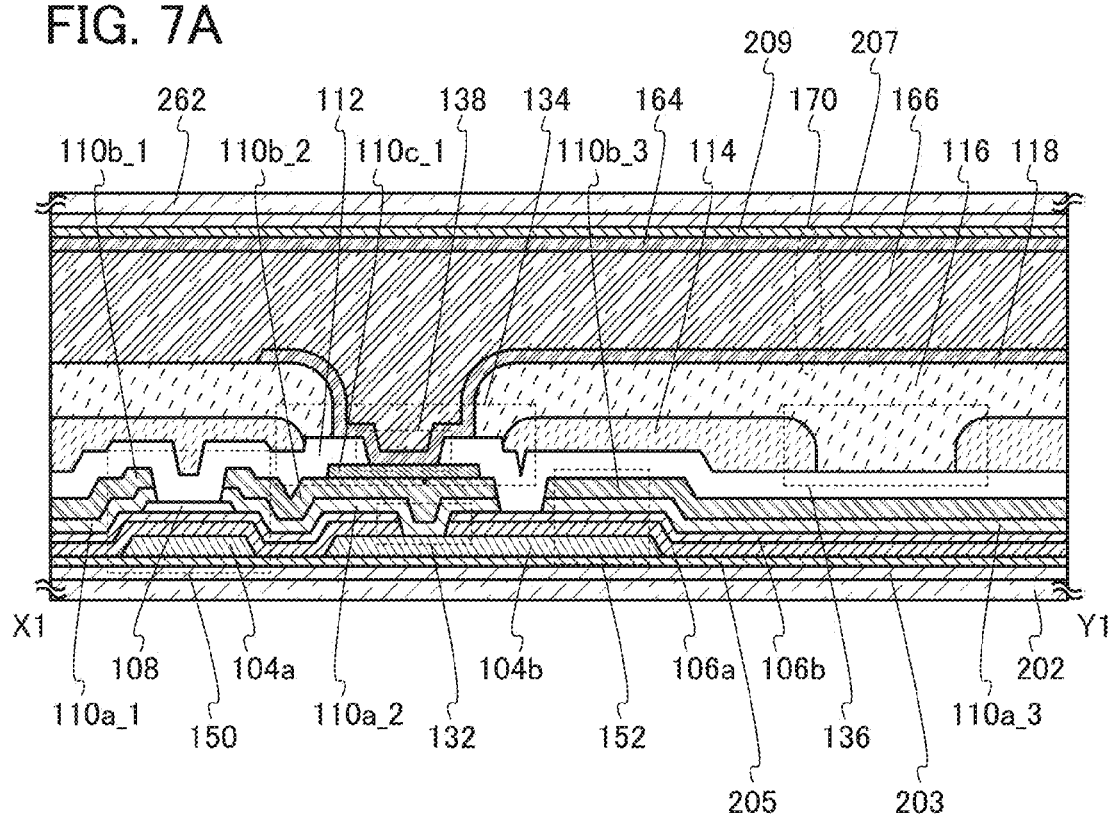
FIGS. 7A and 7B illustrate a cross section of a display device and a method for manufacturing the display device.

FIG. 7A is a cross-sectional view corresponding to a cross section taken along dashed-dotted line X1-Y1 in FIG. 1. FIG. 7B is a cross-sectional view illustrating an example of a method for manufacturing the display device illustrated in FIG. 7A.

The display device in FIG. 7A includes a first substrate 202; an adhesive layer 203 over the first substrate 202; an insulating layer 205 over the adhesive layer 203; the conductive layer 104a serving as a gate electrode layer over the insulating layer 205; the conductive layer 104b formed in the same step as the conductive layer 104a; the insulating layers 106a and 106b over the insulating layer 205 and the conductive layers 104a and 104b; the semiconductor layer 108 which is over the insulating layer 106b and overlaps with the conductive layer 104a; the conductive layer 110a_1 serving as a source electrode layer over the semiconductor layer 108 and the insulating layer 106b; the conductive layer 110a_2 serving as a drain electrode layer over the semiconductor layer 108 and the insulating layer 106b; the conductive layer 110a_3 formed in the same step as the conductive layers 110a_1 and 110a_2; the conductive layers 110b_1, 110b_2, and 110b_3 over the conductive layers 110a_1, 110a_2, and 110a_3; the conductive layer 110c_1 over the conductive layer 110b_2; the insulating layer 112 serving as a protective insulating film over the insulating layer 106b, the semiconductor layer 108, and the conductive layers 110b_1, 110b_2, 110b_3, and 110c_1; the coloring layer 114 having a function of a color filter over the insulating layer 112; the insulating layer 116 having a function of an overcoat layer over the coloring layer 114; the pixel electrode layer 118 over the insulating layer 116; the liquid crystal layer 166 over the pixel electrode layer 118; the conductive layer 164 having a function of a counter electrode over the liquid crystal layer 166; an insulating layer 209 over the conductive layer 164; an adhesive layer 207 over the insulating layer 209; and a second substrate 262 over the adhesive layer 207.

Note that the conductive layer 104a, the insulating layers 106a and 106b, the semiconductor layer 108, and the conductive layers 110a_1, 110a_2, 110b_1, and 110b_2 form the transistor 150. The conductive layer 104b, the insulating layers 106a and 106b, and the conductive layers 110a_3 and 110b_3 form the capacitor 152.

Note that portions of the insulating layers 106a and 106b overlapping with the conductive layer 104a serving as a gate electrode layer have a function of the gate insulating layer of the transistor 150. In addition, portions of the insulating layers 106a and 106b overlapping with the conductive layer 104b have a function of a dielectric layer of the capacitor 152.

The insulating layers 106a and 106b are provided with the opening 132 which reaches the conductive layer 104b, and the conductive layers 110a_2 and 110b_2 having a function of a drain electrode layer of the transistor 150 are connected to the conductive layer 104b through the opening 132.

The coloring layer 114 is provided with the opening 134 and the openings 136. In other words, the insulating layer 116 over the coloring layer 114 is in contact with the insulating layer 112 in the opening 134. Note that the adhesion of the insulating layer 116 to the insulating layer 112 is higher than that of the coloring layer 114. Therefore, when there is a region where the insulating layer 116 and the insulating layer 112 are in contact with each other, separation of the coloring layer 114 can be suppressed even in the case where the adhesion between the coloring layer 114 and the insulating layer 112 is not sufficient.

The color purity of the coloring layer 114 can be adjusted with the openings 136 provided in the coloring layer 114. For example, the color purity of the coloring layer 114 can be adjusted by adjusting the shape of the openings 136 or the area of the openings 136.

With such a structure in which the coloring layer 114 has the openings 136, a novel display device capable of adjusting color purity can be provided. It addition, a novel display device with improved adhesion of the coloring layer 114 used as a color filter can be provided.

Note that the display device in FIG. 7A differs from the display device in FIG. 3A in the following points. In the display device in FIG. 7A, the first substrate 202 is provided instead of the first substrate 102, and the second substrate 262 is provided instead of the second substrate 162. In addition, in the display device in FIG. 7A, the adhesive layer 203 and the insulating layer 205 are provided between the first substrate 202 and the conductive layers 104a and 104b. Furthermore, in the display device in FIG. 7A, the adhesive layer 207 and the insulating layer 209 are provided between the second substrate 262 and the conductive layer 164.

For the first substrate 202 and the second substrate 262, a material having flexibility can be used. It is preferable to use a material having flexibility and toughness for the first substrate 202 and the second substrate 262. Examples of the material having flexibility include an organic resin and glass thin enough to have flexibility.

An organic resin, which has a specific gravity smaller than that of glass, is preferably used for the first substrate 202 and the second substrate 262, in which case the display device can be more lightweight as compared with the case where glass is used.

Examples of the material having flexibility include glass thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polyether ether ketone (PEEK) resin. In particular, a material whose coefficient of thermal expansion is low is preferable, and for example, a polyamide imide resin, a polyimide resin, or PET can be suitably used. A substrate in which a glass fiber is impregnated with an organic resin or a substrate whose coefficient of thermal expansion is reduced by mixing an organic resin with an inorganic filler can also be used.

In the case where a fibrous body is contained in the material having flexibility, a high-strength fiber of an organic compound or an inorganic compound is used as the fibrous body. A high-strength fiber is specifically a fiber with a high tensile modulus of elasticity or a fiber with a high Young's modulus. Typical examples of a high-strength fiber include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure in which this fibrous body is impregnated with a resin and the resin is cured may be used. The structure including the fibrous body and the resin is preferably used, in which case the reliability against bending or breaking due to local pressure can be increased.

To improve the light extraction efficiency, the refractive index of the material having flexibility is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferable, in which case such a filler can maintain optical transparency.

The first substrate 202 and the second substrate 262 may have a stacked-layer structure in which a hard coat layer (such as a silicon nitride layer) by which a surface of a display device is protected from damage, a layer (such as an aramid resin layer) which can disperse pressure, or the like is stacked over a surface of any of the above-mentioned materials having flexibility.

As the adhesive layers 203 and 207, various curable adhesives such as a reactive curable adhesive, a thermosetting adhesive, an anaerobic adhesive, and a photo-curable adhesive such as an ultraviolet curable adhesive can be used. Examples of such adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

The adhesive layers 203 and 207 may include a drying agent in a resin material. As the drying agent, for example, a substance which adsorbs moisture by chemical adsorption, such as an oxide of an alkaline earth metal. (e.g., calcium oxide or barium oxide), can be used. Alternatively, a substance that adsorbs moisture by physical adsorption, such as zeolite or silica gel, may be used. The drying agent is preferably included, in which case it can suppress entry of impurities such as moisture into the display device.

For the insulating layers 205 and 209, an inorganic insulating material can be used, for example. The inorganic insulating material may have a single-layer structure or a multilayer structure of silicon nitride, silicon oxynitride, silicon nitride oxide, aluminum oxide, or the like. The insulating layers 205 and 209 have a function of buffer layers.

There is no particular limitation on the method for forming the insulating layers 205 and 209; a sputtering method, an evaporation method, a droplet discharging method (e.g., an ink-jet method), a printing method (e.g., a screen printing method or an off-set printing method), or the like may be used.

Here, an example of a method for manufacturing the display device illustrated in FIG. 7A is described with reference to FIG. 7B.

Figure 7B:
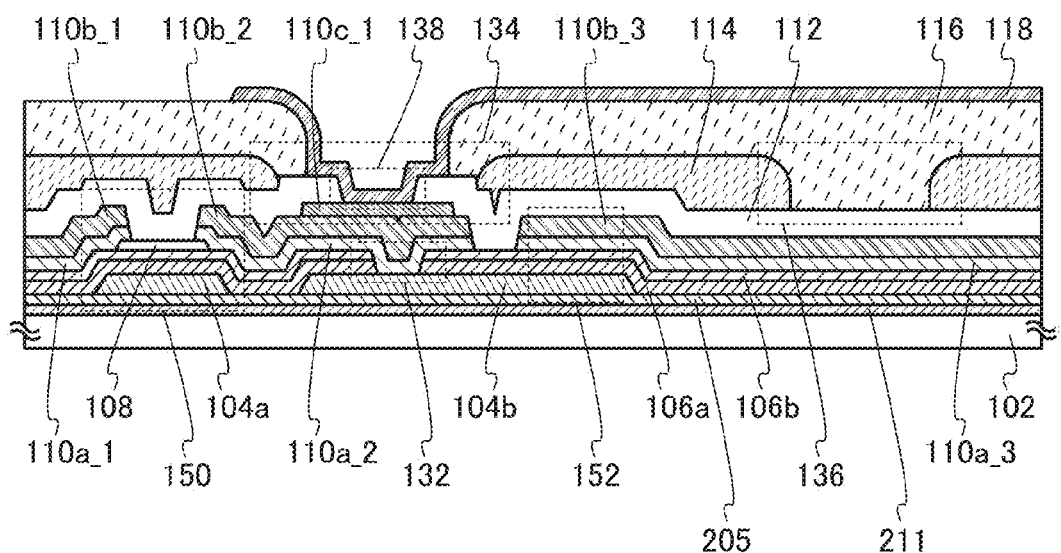

As illustrated in FIG. 7B, a separation layer 211 is formed over the first substrate 102. Next, the insulating layer 205 is formed over the separation layer 211.

For the first substrate 102, any of the materials described in Embodiment 1 can be used.

The separation layer 211 can be formed to have a single-layer structure or a stacked-layer structure using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like, for example. In the case of a layer containing silicon, a crystal structure of the layer containing silicon may be amorphous, microcrystal, polycrystal, or single crystal.

Note that between the first substrate 102 and the separation layer 211, an insulating film such as a silicon oxide film, a silicon oxynitride film, a silicon nitride film, or a silicon nitride oxide film may be formed. The insulating film is preferably formed because it can suppress entry of impurities which can be contained in the first substrate 102 to the separation layer 211 side.

The separation layer 211 can be formed by a sputtering method, a plasma CVD method, a coating method, a printing method, or the like. Note that a coating method includes a spin coating method, a droplet discharge method, and a dispensing method.

In the case where the separation layer 211 has a single-layer structure, a layer containing tungsten, molybdenum, or a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer 211 is formed to have a stacked-layer structure including a layer containing tungsten and a layer containing an oxide of tungsten, the layer containing an oxide of tungsten may be formed as follows: the layer containing tungsten is formed first and an insulating layer formed of an oxide is formed thereover, so that the layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer 211 is changed by the plasma treatment or heat treatment, whereby adhesion between the separation layer 211 and the insulating layer 205 formed later can be controlled.

In this embodiment, a 30-nm-thick tungsten film is formed as the separation layer 211 by a sputtering method.

The insulating layer 205 can be formed using any of the above-listed materials. For example, in this embodiment, the insulating layer 205 is formed at a temperature of higher than or equal to 250° C., and lower than or equal to 400° C. by a plasma CVD method, whereby the insulating layer 205 can be a dense film with low water permeability. Note that the thickness of the insulating layer 205 is preferably greater than or equal to 10 nm and less than or equal to 3000 nm, further preferably greater than or equal to 200 nm and less than or equal to 1500 nm. In this embodiment, a 600-nm-thick silicon oxynitride film is formed by a plasma CVD method and then a 200-nm-thick silicon nitride film is formed over the silicon oxynitride by a plasma CVD method.

Next, the conductive layers 104a and 104b are formed over the insulating layer 205. Subsequent steps are similar to those for components in Embodiment 1; thus, components can be formed with reference to the description in Embodiment 1.

Next, a material to be an adhesive layer is applied to an element substrate where the transistor 150, the capacitor 152, and the like are formed (in FIG. 7B, to the insulating layer 116 and the pixel electrode layer 118), and the element substrate is attached to a support substrate with the adhesive layer. Then, separation is caused between the separation layer 211 and the insulating layer 205 over the first substrate 102, and the insulating layer 205 in an exposed state and the first substrate 202 are attached to each other with the adhesive layer 203.

Note that any of a variety of methods can be used as appropriate in the step of causing separation between the separation layer 211 and the insulating layer 205. For example, when a layer including a metal oxide film is formed as the separation layer 211 on the side in contact with a layer to be separated (in FIG. 7B, the insulating layer 205, which may also be referred to as a layer to be separated below), the metal oxide film is embrittled by crystallization, whereby the layer to be separated can be separated from the first substrate 102.

Alternatively, when a substrate having high heat resistance is used as the first substrate 102 and when an amorphous silicon film containing hydrogen is formed as the separation layer 211 between the substrate having high heat resistance and the layer to be separated, the amorphous silicon film is removed by laser light irradiation or etching, whereby the layer to be separated can be separated from the first substrate 102.

Alternatively, after a layer including a metal oxide film is formed as the separation layer 211 on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film.

A method may be used in which a film containing nitrogen, oxygen, hydrogen, or the like (for example, an amorphous silicon film containing hydrogen, an alloy film containing hydrogen, an alloy film containing oxygen, or the like) is used as the separation layer 211, and the separation layer 211 is irradiated with laser light to release nitrogen, oxygen, or hydrogen contained in the separation layer 211 as a gas, thereby promoting separation between the layer to be separated and the substrate.

Further, the separation process can be conducted easily by combination of the above-described separation steps. For example, separation can be performed with physical force (by a machine or the like) after performing laser light irradiation, etching on the separation layer with a gas, a solution, or the like, or mechanical removal with a sharp knife, a scalpel, or the like so that the separation layer and the layer to be separated can be easily separated from each other.

Separation of the layer to be separated from the first substrate 102 may be carried out by filling the interface between the separation layer 211 and the layer to be separated with a liquid. Further, the separation may be conducted while pouring a liquid such as water. In the case where the separation layer 211 is formed using a tungsten film, it is preferable that the separation be performed while etching the tungsten film using a mixed solution of ammonia water and a hydrogen peroxide solution.

Note that the separation layer 211 is not necessary in the case where separation at the interface between the first substrate 102 and the layer to be separated is possible. For example, glass is used as the first substrate 102, an organic resin such as polyimide is formed in contact with the glass, and an insulating film, a transistor, and the like are formed over the organic resin. In this case, heating the organic resin enables the separation at the interface between the first substrate 102 and the organic resin. Alternatively, separation at the interface between a metal layer and the organic resin may be performed in the following manner: the metal layer is provided between the first substrate 102 and the organic resin and current is made to flow in the metal layer so that the metal layer is heated.

Through the above steps, the transistor 150, the capacitor 152, and the like formed over the first substrate 102 can be transferred to the first substrate 202 having flexibility.

Note that transfer from the second substrate 162 to the second substrate 262 can be performed by a similar method. Note that the second substrate 262 is not provided with elements such as the transistor 150 and the capacitor 152; therefore, the conductive layer 164 may be formed directly over the second substrate 262. In that case, the adhesive layer 207 and the insulating layer 209 are not provided.

Next, the first substrate 202 and the second substrate 262 are attached and the liquid crystal layer 166 is injected between the first substrate 202 and the second substrate 262. Thus, the display device in FIG. 7A can be formed.

Since the first substrate 202 and the second substrate 262 of the material having flexibility are used in the display device described in this embodiment, the display device can be flexible. In the case where the material having flexibility and toughness is used for each of the first and second substrates 202 and 262, a display device with high impact resistance that is less likely to be broken can be obtained.

In the display device in FIG. 7A, the insulating layer 116 and the insulating layer 112 are in contact with each other in the opening 134 and the opening 136. Accordingly, the adhesion of the coloring layer 114 is increased, and separation of the coloring layer 114 can be suppressed even in a flexible structure. This is an advantageous effect obtained in one embodiment of the present invention. As described above, the display device of one embodiment of the present invention, in which the adhesion of the coloring layer 114 is increased, is particularly effective in a flexible structure.

Note that a substrate formed using the material having flexibility may be similarly used in other drawings such as FIGS. 16A and 16B, FIGS. 17A and 17B, FIGS. 18A and 18B, FIGS. 19A and 19B, and FIGS. 20A and 20B.

This embodiment can be combined with any of the other embodiments as appropriate.

Embodiment 3

In this embodiment, a display device of one embodiment of the present invention will be described with reference to FIGS. 8A and 8B. Note that portions having functions similar to those in Embodiments 1 and 2 are given the same reference numerals and detailed description thereof is omitted.

The display device illustrated in FIG. 8A includes a pixel portion including pixel regions with display elements (hereinafter, the portion is referred to as a pixel portion 302), a circuit portion being provided outside the pixel portion 302 and including a circuit for driving the pixel portion 302 (hereinafter, the portion is referred to as a driver circuit portion 304), circuits each having a function of protecting an element (hereinafter, the circuits are referred to as protection circuit portions 306), and a terminal portion 307. Note that the protection circuit portions 306 are not necessarily provided.

A part or the whole of the driver circuit portion 304 is preferably formed over a substrate over which the pixel portion 302 is formed, in which case the number of components and the number of terminals can be reduced. When a part or the whole of the driver circuit portion 304 is not formed over the substrate over which the pixel portion 302 is formed, the part or the whole of the driver circuit portion 304 can be mounted by chip-on-glass (COG) or tape automated bonding (TAB).

The pixel portion 302 includes a plurality of circuits for driving display elements arranged in X rows (X is a natural number of 2 or more) and Y columns (Y is a natural number of 2 or more) (hereinafter, such circuits are referred to as pixel circuits 308). The driver circuit portion 304 includes driver circuits such as a circuit for supplying a signal (scan signal) to select a pixel (hereinafter, the circuit is referred to as a gate driver 304a) and a circuit for supplying a signal (data signal) to drive a display element in a pixel (hereinafter, the circuit is referred to as a source driver 304b).

The gate driver 304a includes a shift register or the like. The gate driver 304a receives a signal for driving the shift register through the terminal portion 307 and outputs a signal. For example, the gate driver 304a receives a start pulse signal, a clock signal, or the like and outputs a pulse signal. The gate driver 304a has a function of controlling the potentials of wirings supplied with scan signals (hereinafter, such wirings are referred to as gate lines GL_1 to GL_X, and the gate lines may also be referred to as scan lines). Note that a plurality of gate drivers 304a may be provided to control the gate lines GL_1 to GL_X separately. Alternatively, the gate driver 304a has a function of supplying an initialization signal. Without being limited thereto, the gate driver 304a can supply another signal.

The source driver 304b includes a shift register or the like. The source driver 304b receives a signal (video signal) from which a data signal is derived, as well as a signal for driving the shift register, through the terminal portion 307. The source driver 304b has a function of generating a data signal to be written to the pixel circuit 308 which is based on the video signal. In addition, the source driver 304b has a function of controlling output of a data signal in response to a pulse signal produced by input of a start pulse signal, a clock signal, or the like. Further, the source driver 304b has a function of controlling the potentials of wirings supplied with data signals (hereinafter, such wirings are referred to as source lines DL_1 to DL_Y, and the source lines may also be referred to as data lines). Alternatively, the source driver 304b has a function of supplying an initialization signal. Without being limited thereto, the source driver 304b can supply another signal.

The source driver 304b includes a plurality of analog switches or the like, for example. The source driver 304b can output, as the data signals, signals obtained by time-dividing the video signal by sequentially turning on the plurality of analog switches. The source driver 304b may include a shift register or the like.

A pulse signal and a data signal are input to each of the plurality of pixel circuits 308 through one of the plurality of gate lines GL supplied with scan signals and one of the plurality of source lines DL supplied with data signals, respectively. Writing and holding of the data signal to and in each of the plurality of pixel circuits 308 are controlled by the gate driver 304a. For example, to the pixel circuit 308 in the m-th row and the n-th column (m is a natural number of less than or equal to X, and n is a natural number of less than or equal to Y), a pulse signal is input from the gate driver 304a through the gate line GL_m, and a data signal is input from the source driver 304b through the source line DL_n in accordance with the potential of the gate line GL_m.

Figure 8A:
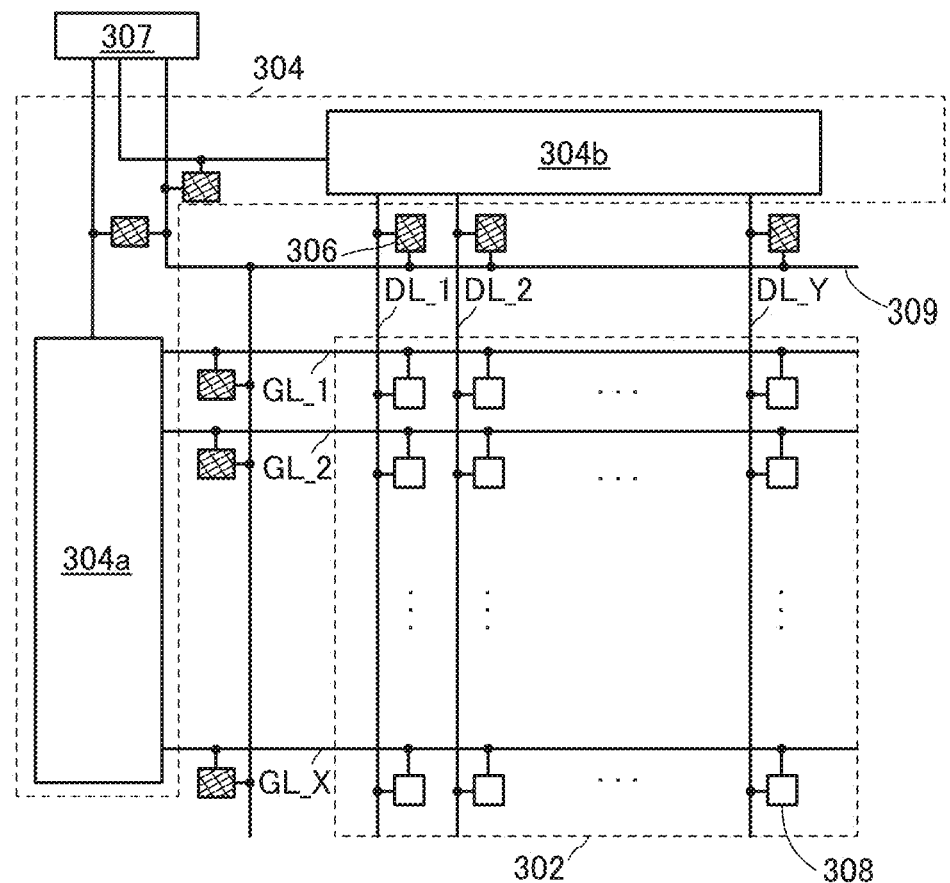
FIGS. 8A and 8B are a block diagram of a display device and a circuit diagram of a pixel.

The protection circuit portion 306 shown in FIG. 8A is connected to, for example, the gate line GL between the gate driver 304a and the pixel circuit 308. Alternatively, the protection circuit portion 306 is connected to the source line DL between the source driver 304b and the pixel circuit 308. Alternatively, the protection circuit portion 306 can be connected to a wiring between the gate driver 304a and the terminal portion 307. Alternatively, the protection circuit portion 306 can be connected to a wiring between the source driver 304b and the terminal portion 307. Note that the terminal portion 307 means a portion having terminals for inputting power, control signals, and video signals to the display device from external circuits.

The protection circuit portion 306 is a circuit that electrically connects a wiring connected to the protection circuit portion to another wiring when a potential out of a certain range is applied to the wiring connected to the protection circuit portion.

As illustrated in FIG. 8A, the protection circuit portions 306 are provided for the pixel portion 302 and the driver circuit portion 304, so that the resistance of the display device to overcurrent generated by electrostatic discharge (ESD) or the like can be improved. Note that the configuration of the protection circuit portions 306 is not limited to that, and for example, a configuration in which the protection circuit portions 306 are connected to the gate driver 304a or a configuration in which the protection circuit portions 306 are connected to the source driver 304b may be employed. Alternatively, the protection circuit portions 306 may be configured to be connected to the terminal portion 307.

In FIG. 8A an example in which the driver circuit portion 304 includes the gate driver 304a and the source driver 304b is shown; however, the structure is not limited thereto. For example, only the gate driver 304a may be formed and a separately prepared substrate where a source driver circuit is formed (e.g., a driver circuit substrate formed with a single crystal semiconductor film or a polycrystalline semiconductor film) may be mounted.

Figure 8B:
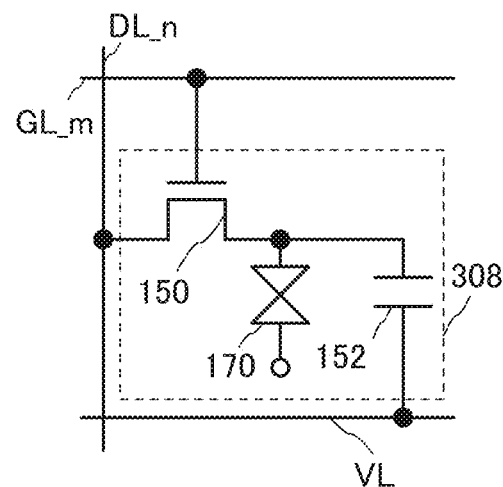

Each of the plurality of pixel circuits 308 in FIG. 8A can have a structure illustrated in FIG. 8B, for example.

The pixel circuit 308 illustrated in FIG. 8B includes the liquid crystal element 170, the transistor 150, and the capacitor 152. Note that the liquid crystal element 170, the transistor 150, and the capacitor 152 can be those in the display device in FIGS. 3A and 3B described in Embodiment 1.

The potential of one of a pair of electrodes of the liquid crystal element 170 is set in accordance with the specifications of the pixel circuit 308 as appropriate. The alignment state of the liquid crystal element 170 depends on written data. A common potential may be supplied to one of the pair of electrodes of the liquid crystal element 170 included in each of the plurality of pixel circuits 308. Further, the potential supplied to one of the pair of electrodes of the liquid crystal element 170 in the pixel circuit 308 in one row may be different from the potential supplied to one of the pair of electrodes of the liquid crystal element 170 in the pixel circuit 308 in another row.

As examples of a driving method of the display device including the liquid crystal element 170, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic. Therefore, alignment treatment is not necessary and viewing angle dependence is small.

In the pixel circuit 308 in the m-th row and the n-th column, one of a source and a drain of the transistor 150 is electrically connected to the source line DL_n, and the other is electrically connected to the other of the pair of electrodes of the liquid crystal element 170. A gate of the transistor 150 is electrically connected to the gate line GL_m. The transistor 150 has a function of controlling whether to write a data signal by being turned on or off.

One of a pair of electrodes of the capacitor 152 is electrically connected to a wiring to which a potential is supplied (hereinafter referred to as a potential supply line VL), and the other is electrically connected to the other of the pair of electrodes of the liquid crystal element 170. The potential of the potential supply line VL is set in accordance with the specifications of the pixel circuit 308 as appropriate. The capacitor 152 functions as a storage capacitor for storing written data.

For example, in the display device including the pixel circuit 308 in FIG. 8A, the pixel circuits 308 are sequentially selected row by row by the gate driver 304a, whereby the transistors 150 are turned on and a data signal is written.

When the transistors 150 are turned off, the pixel circuits 308 in which the data has been written are brought into a holding state. This operation is sequentially performed row by row; thus, an image can be displayed.

The structure described in this embodiment can be combined with any of the structures described in the other embodiments as appropriate.

Embodiment 4

In this embodiment, a display module and electronic devices that can be formed using a display device of one embodiment of the present invention are described with reference to FIG. 9 and FIGS. 10A to 10H.

Figure 9:
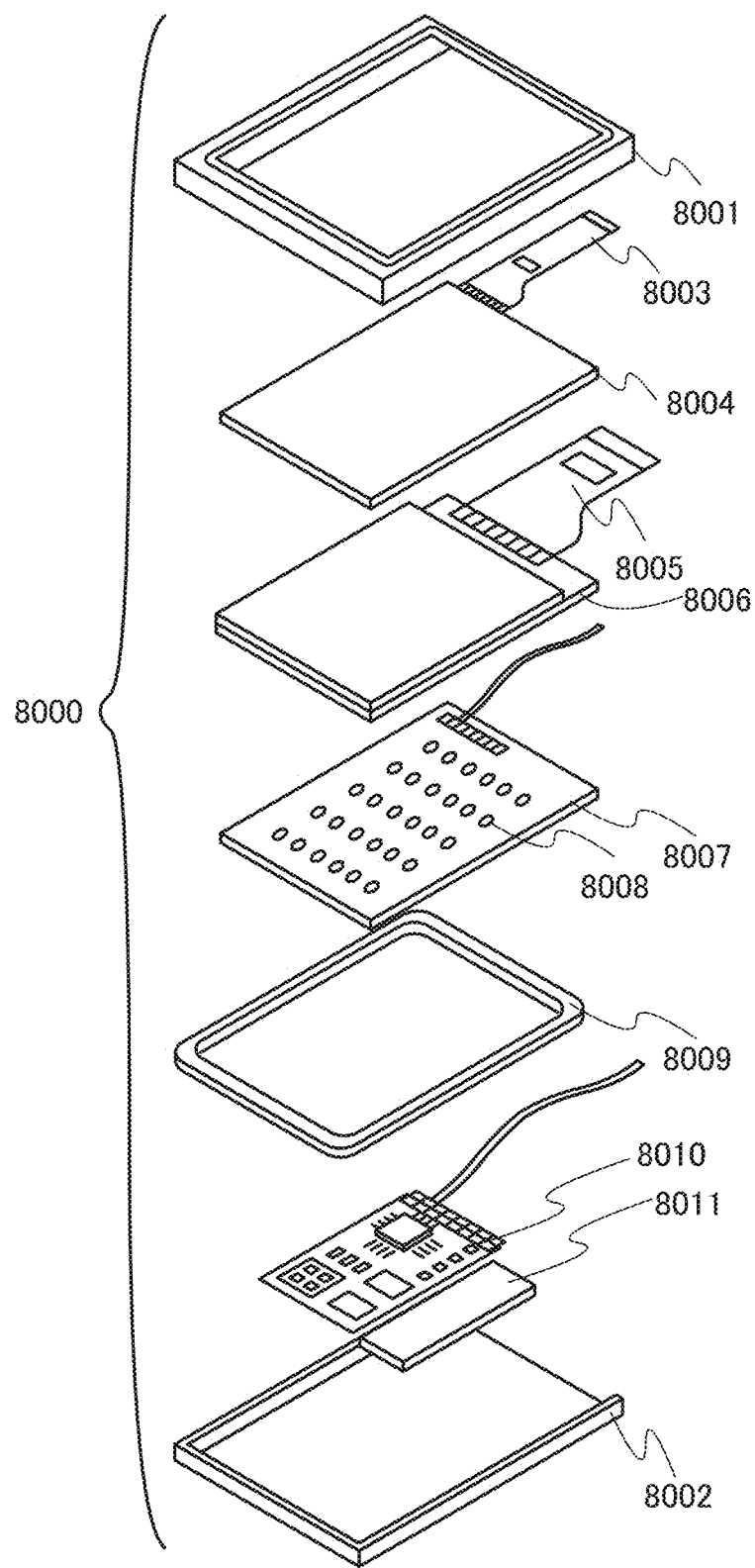
FIG. 9 illustrates a display module.

In a display module 8000 illustrated in FIG. 9, a touch panel 8004 connected to an FPC 8003, a display panel 8006 connected to an FPC 8005, a backlight unit 8007, a frame 8009, a printed board 8010 and a battery 8011 are provided between an upper cover 8001 and a lower cover 8002.

The display device of one embodiment of the present invention can be used for, for example, the display panel 8006.

The shapes and sizes of the upper cover 8101 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight unit 8007 includes a light source 8008. Note that although a structure in which the light sources 8008 are provided over the backlight unit 8007 is illustrated in Ha 9, one embodiment of the present invention is not limited to this structure. For example, a structure in which the light source 8008 is provided at an end portion of the backlight unit 8007 and a light diffusion plate is further provided may be employed.

Note that the backlight unit 8007 need not be provided in the case of a reflective liquid crystal display device. The backlight unit 8007 is provided in the case of a transmissive liquid crystal display device or a semi-transmissive liquid crystal display device, for example.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 10A to 10H illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 10A:
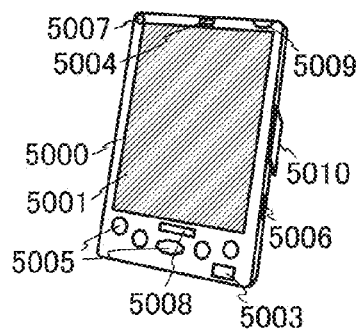
FIGS. 10A to 10H each illustrate an electronic device.
Figure 10B:
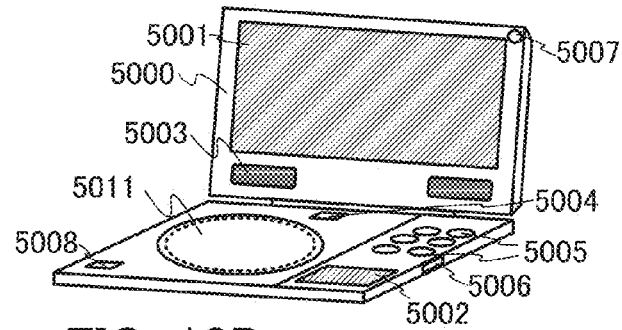
Figure 10C:
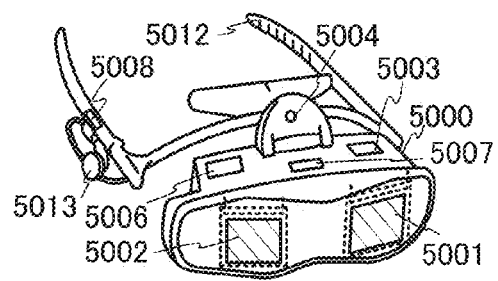
Figure 10D:
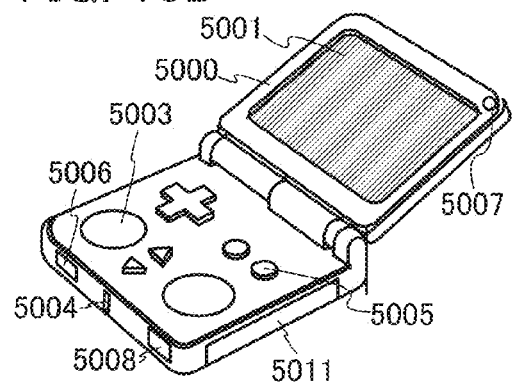
Figure 10E:
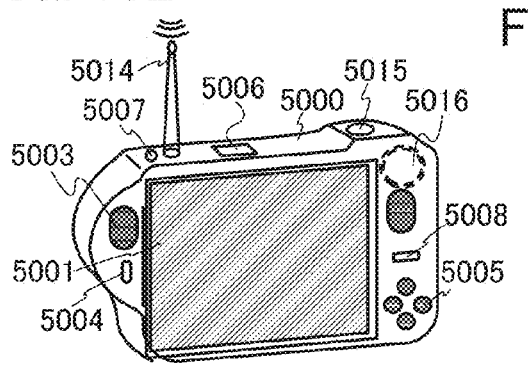
Figure 10F:
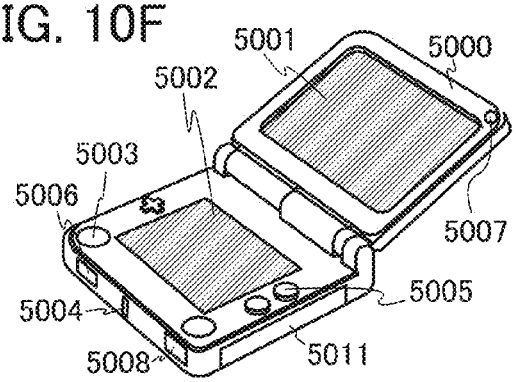
Figure 10G:
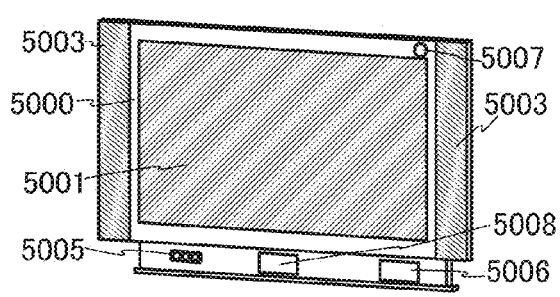
Figure 10H:
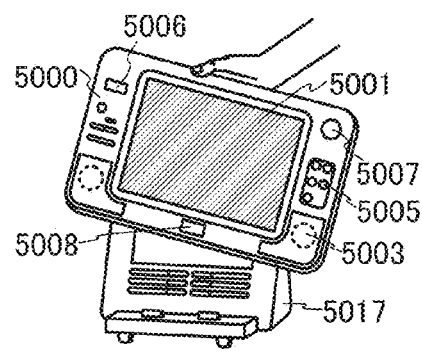

FIG. 10A illustrates a mobile computer that can include a switch 5009, an infrared port 5010, and the like in addition to the above components. FIG. 10B illustrates a portable image reproducing device (e.g., a DVD player) that is provided with a memory medium and can include a second display portion 5002, a memory medium reading portion 5011, and the like in addition to the above components. FIG. 10C illustrates a goggle-type display that can include the second display portion 5002, a support 5012, an earphone 5013, and the like in addition to the above components. FIG. 10D illustrates a portable game machine that can include the memory medium reading portion 5011 and the like in addition to the above components. FIG. 10E illustrates a digital camera that has a television reception function and can include an antenna 5014, a shutter button 5015, an image receiving portion 5016, and the like in addition to the above components. FIG. 10F illustrates a portable game machine that can include the second display portion 5002, the memory medium reading portion 5011, and the like in addition to the above components. FIG. 10G illustrates a television receiver that can include a tuner, an image processing portion, and the like in addition to the above components. FIG. 10H illustrates a portable television receiver that can include a charger 5017 capable of transmitting and receiving signals, and the like in addition to the above components.

The electronic devices illustrated in FIGS. 10A to 10H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Further, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (a external memory medium or a memory medium incorporated in the camera), a function of displaying a shot image on the display portion, or the like. Note that functions that can be provided for the electronic devices illustrated in FIGS. 10A to 10H are not limited to those described above, and the electronic devices can have a variety of functions.

The electronic devices described in this embodiment each include the display portion for displaying some sort of data.

The structure described in this embodiment can be combined with any of the structures described in the other embodiments as appropriate.

Embodiment 5

In this embodiment, a modification example of the display device described in Embodiment 1 is described with reference to FIG. 21, FIGS. 22A and 22B, and FIGS. 23A and 23B. Note that portions having functions similar to those in Embodiment 1 are given the same reference numerals and detailed description thereof is omitted.

Figure 21:
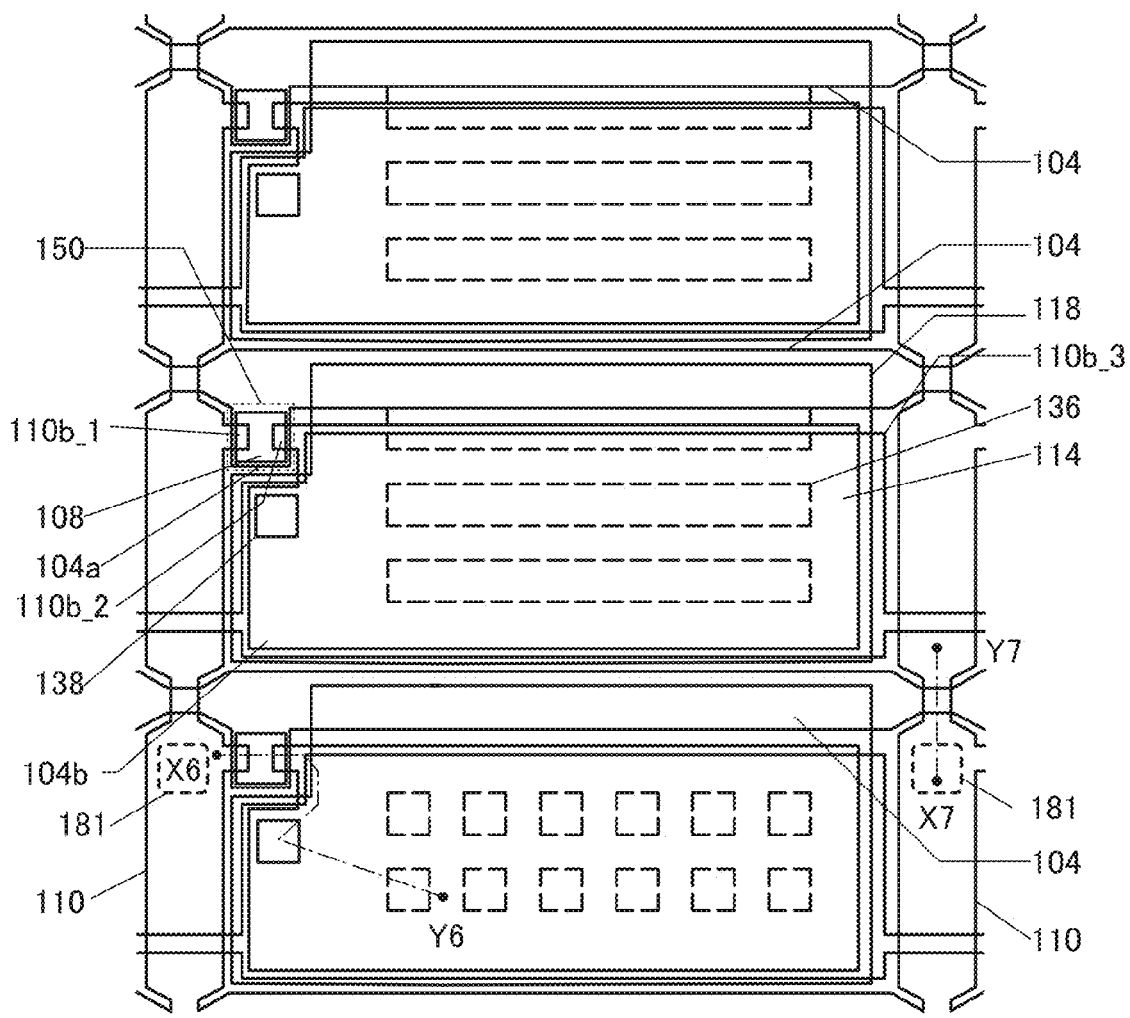
FIG. 21 illustrates a top view of a display device.
Figure 23A:
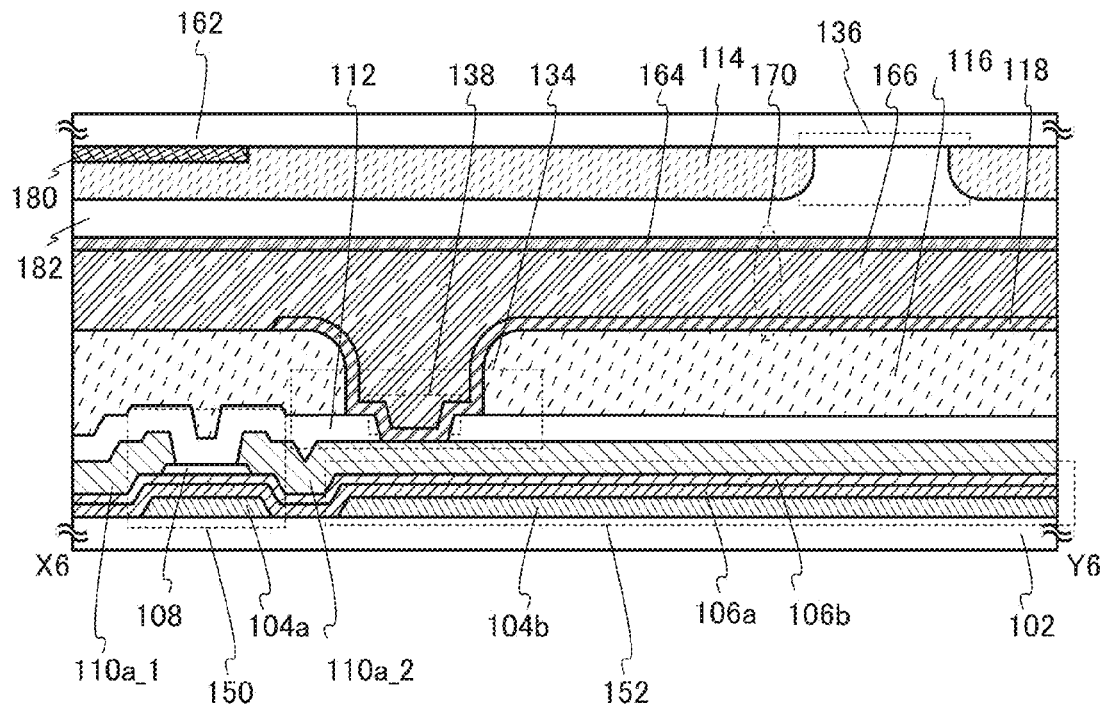
FIGS. 23A and 23B each illustrate a cross-sectional view of a display device.
Figure 23B:
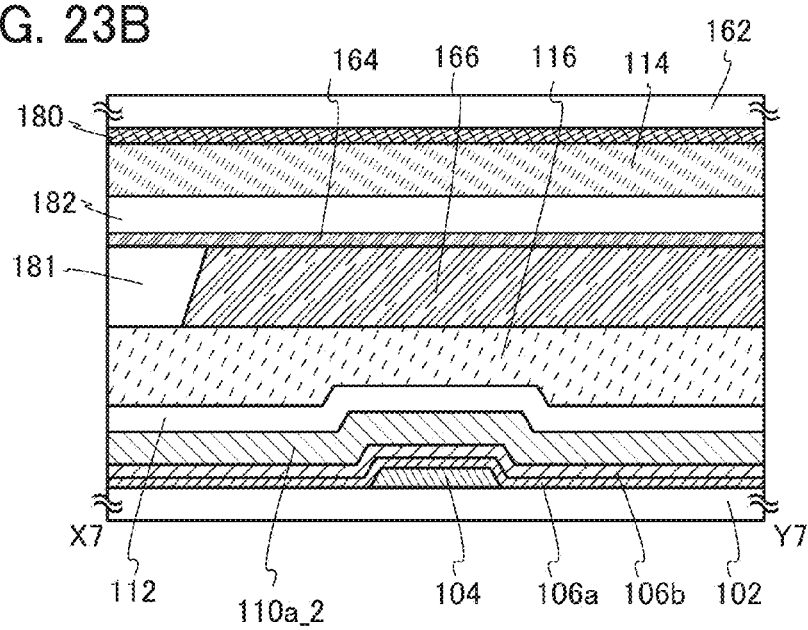

FIG. 21 is a top view of an example of a display device of one embodiment of the present invention. In the top view of FIG. 21, which shows some pixel regions (three pixels) in the display device, components such as a gate insulating layer are partly omitted to avoid complexity. FIG. 23A is a cross-sectional view corresponding to a cross section taken along dashed-dotted line X6-Y6 in FIG. 21. FIG. 23B is a cross-sectional view corresponding to a cross section taken along dashed-dotted line X7-Y7 in FIG. 21.

This embodiment describes an example in which a pixel electrode layer is used as a reflective electrode and a substrate 162 that is a counter substrate is provided with a coloring layer, a BM 180, and a spacer 181. The position of overlap with openings in the coloring layer and the position of overlap with the spacer 181 are indicated by dotted lines.

The transistor 150 has the same structure as that in Embodiment 1 except that a 100-nm-thick tungsten film is used as a conductive layer; thus, detailed description is omitted here. Note that the transistor 150 has a channel length L of 3 μm and a channel width W of 3 μm. The transistor 150 includes a 50-nm-thick In—Ga—Zn oxide (In:Ga:Zn=1:1:1 (at. %)) semiconductor layer formed with a sputtering apparatus.

The pixel electrode layer 118 electrically connected to the transistor 150 through the opening 138 overlaps with part of the gate line 104, and has a large reflection area. Note that the transistor 150 is positioned so as to overlap with the BM 180. As the BM 180, a 200-nm-thick titanium film formed with a sputtering apparatus is used.

Figure 22A:
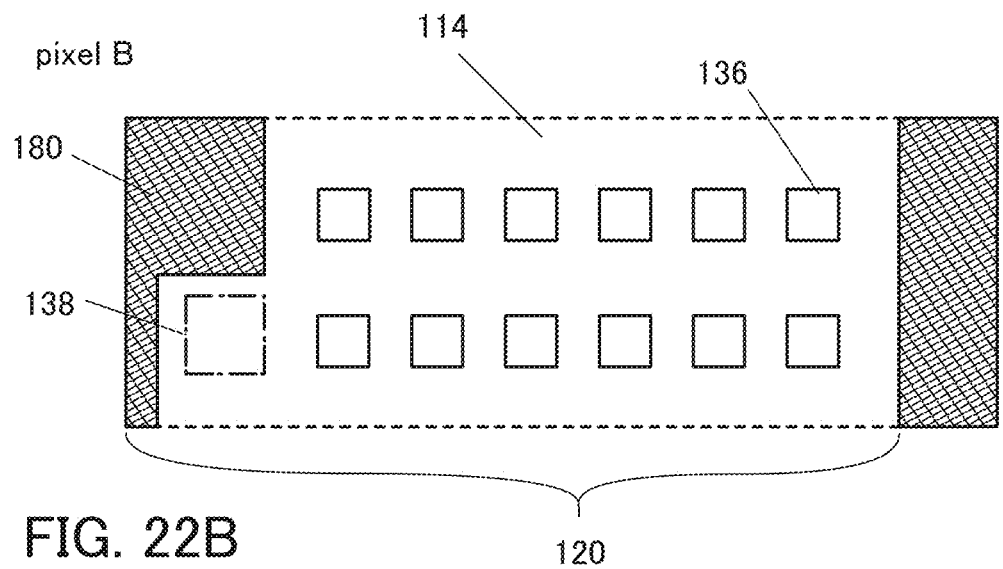
FIGS. 22A and 22B each illustrate a top view of a coloring layer of a display device.
Figure 22B:
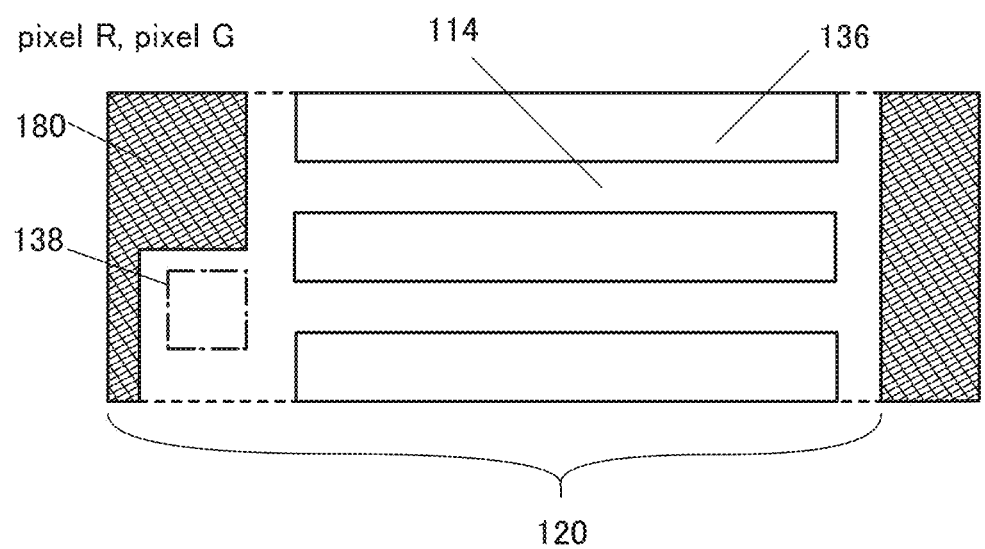

This embodiment describes an example in which openings in the coloring layers 114 have different shapes for different colors of pixels, as illustrated in FIGS. 22A and 22B.

FIG. 22A illustrates a structure of a B pixel on the counter substrate side. In FIG. 22A, the proportion of the area of the coloring layer 114 to the area of the pixel region 120 is 74.6%. Note that the area of the coloring layer 114 is calculated by subtracting the area of the BM 180 from the area of the pixel region 120. FIG. 22B illustrates a structure of each of R and G pixels on the counter substrate side. In FIG. 22B, the proportion of the area of the coloring layer 114 to the area of the pixel region 120 is 44.4%. When the upper surface shape of the coloring layer 114 in each of the R and G pixels is different from the upper surface shape of the coloring layer 114 in the B pixel, and when the area of the coloring layer 114 in the B pixel is larger than that of the coloring layer 114 in the R or G pixel, reflectance can be improved with an NTSC ratio maintained.

In each of FIGS. 22A and 22B, a region overlapping with the opening 138 is indicated by a dashed-dotted line for easy understanding of positional relationship; this does not mean that the structure on the counter substrate side actually has the opening 138. In addition, in FIG. 21, the opening 136 and the spacer 181 are indicated by dotted lines for easy understanding of positional relationship; only the positions are indicated and this does not mean that the structure on the side of the substrate provided with the transistor has the opening 136 and the spacer 181.

The upper surface shapes of the openings illustrated in FIGS. 22A and 22B are examples, to which the present invention is not limited, and may be triangular, circular, elliptical, polygonal, or the like or a combination of a plurality of kinds of these shapes. In addition, the total area of the openings in the coloring layer 114 in the B pixel is at least smaller than that of the openings in the coloring layer 114 in each of the R and G pixels.

The display device in FIG. 23A includes the first substrate 102; the conductive layer 104a serving as a gate electrode layer over the first substrate 102; the conductive layer 104b formed in the same step as the conductive layer 104a; the insulating layers 106a and 106b over the first substrate 102 and the conductive layers 104a and 104b; the semiconductor layer 108 which is over the insulating layer 106b and overlaps with the conductive layer 104a; the conductive layer 110a_1 serving as a source electrode layer over the semiconductor layer 108 and the insulating layer 106b; the conductive layer 110a_2 serving as a drain electrode layer over the semiconductor layer 108 and the insulating layer 106b; the insulating layer 112 serving as a protective insulating film over the semiconductor layer 108 and the conductive layers 110a_1 and 110a_2; the insulating layer 116 formed using a photosensitive resin over the insulating layer 112; the pixel electrode layer 118 over the insulating layer 116; the liquid crystal layer 166 over the pixel electrode layer 118; the conductive layer 164 having a function of a counter electrode over the liquid crystal layer 166; the spacer 181; the BM 180; the coloring layer 114 having a function of a color filter; an overcoat layer 182 covering the coloring layer 114; and the second substrate 162 that is a counter substrate over the conductive layer 164. In this case, the overcoat layer 182 is in contact with the second substrate 162 that is the counter substrate in the opening 136.

As the overcoat layer 182, an acrylic based resin film is used, which is formed by applying an acrylic based resin material with a spin coater apparatus and then drying the material in an oven apparatus. As for the coloring layer 114, three colors of red (R), green (G), and blue (B) are used, and green (G), red (R), and blue (B) color filters are formed in this order in desired positions by light exposure and development. Each of the red (R), green (G), and blue (B) color filters is formed so as to have a thickness of 0.8 μm.

Note that the conductive layer 104a, the insulating layers 106a and 106b, the semiconductor layer 108, and the conductive layers 110a_1 and 110a_2 form the transistor

150. The conductive layer 104*b*, the insulating layers 106*a* and 106*b*, and the conductive layer 110*a*_2 form the capacitor 152. The capacitor 152 has a large area and thus has a large capacitance for charge storage. Thus, it is possible to retain the potential of the pixel electrode for a longer time and to apply a driving mode with a reduced refresh rate. Furthermore, a change in voltage applied to the liquid crystal layer can be inhibited for a long time even when the liquid crystal display device is used in the driving mode with a reduced refresh rate. This makes it possible to prevent screen flickers from being perceived by a user more effectively. Thus, the power consumption can be reduced and the display quality can be improved.

An effect of reducing the fresh rate will be described here. Note that the refresh rate refers to the number of times of image writing per second and is also called driving frequency. Such high-speed screen switching that is difficult for the human eye to perceive is considered as a cause of eye strain.

The eye strain is divided into two categories: nerve strain and muscle strain. The nerve strain is caused by prolonged looking at light emitted from a liquid crystal display device or blinking images. This is because the brightness stimulates and fatigues the retina and nerve of the eye and the brain. The muscle strain is caused by overuse of a ciliary muscle which works for adjusting the focus.

Figure 27A:
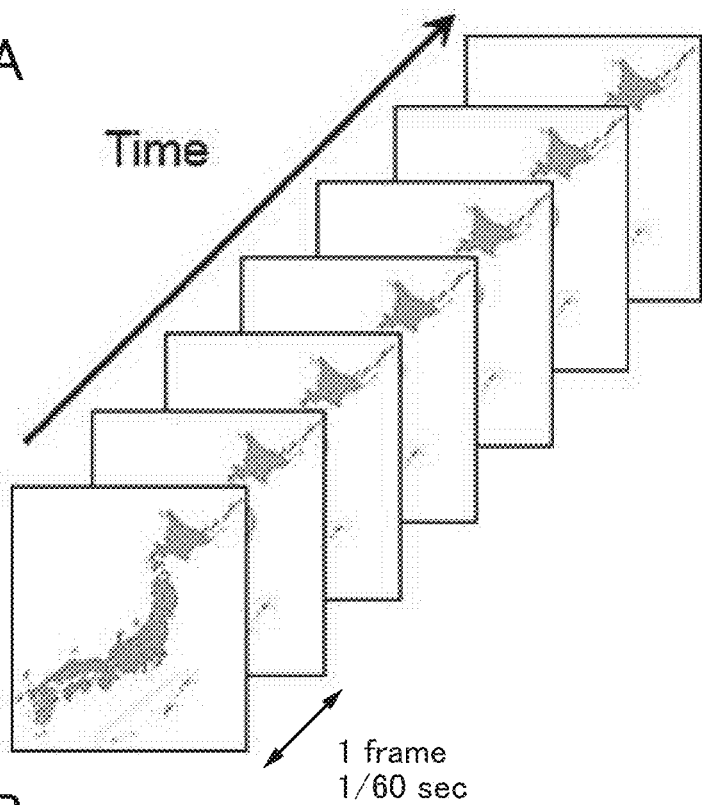
FIGS. 27A and 27B are conceptual diagrams each illustrating an example of a driving method of a display device.

FIG. 27A is a schematic diagram illustrating display of a conventional liquid crystal display device. As illustrated in FIG. 27A, for the display of the conventional liquid crystal display device, image rewriting is performed 60 times per second. A prolonged looking at such a screen might stimulate the retina and nerve of the eye and the brain of a user and lead to eye strain.

In this embodiment, a transistor with an extremely low off-state current a transistor using an oxide semiconductor) is used as the transistor 150 in a pixel portion of a liquid crystal display device. In addition, the liquid crystal element has a large-area capacitor. With these components, leakage of electrical charges stored in the capacitor can be inhibited, whereby the luminance of a liquid crystal display device can be kept even at a lower frame frequency.

Figure 27B:
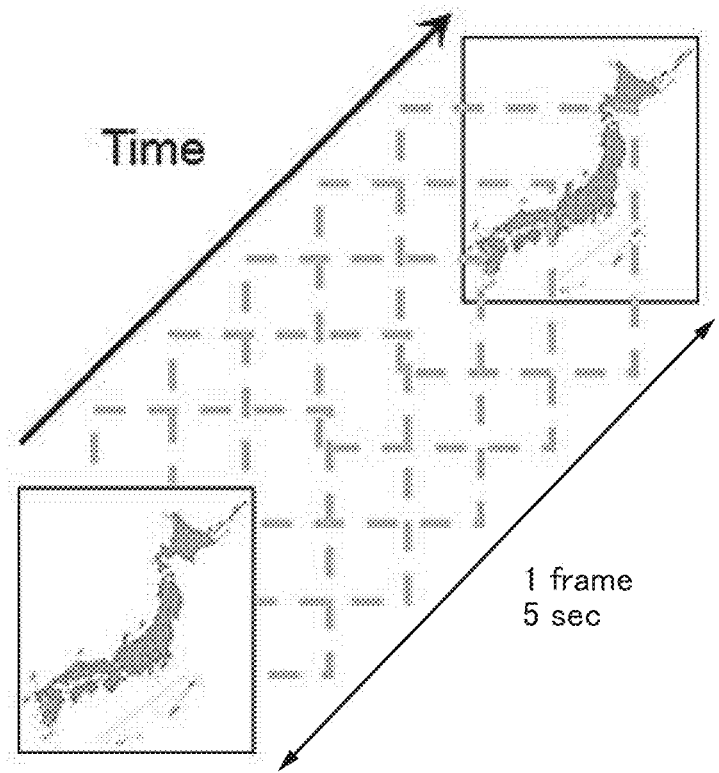

Thus, for example, the number of times of image writing can be reduced to once every five seconds as shown in FIG. 27B. The same image can be seen for as long as possible and flickers on a screen perceived by a user can be reduced. This makes it possible to reduce stimuli to the retina and nerve of the eye and the brain of a user, resulting in less nerve strain.

This embodiment makes it possible to provide an eye-friendly liquid crystal display device.

The refresh operation needs to be performed such that a change of an image caused by the refresh operation is not distinguished by users. The display device according to this embodiment has little change of an image caused by the refresh operation and can perform favorable display.

The coloring layer 114 formed on the second substrate 162 side is provided with a plurality of openings 136. The color purity of the coloring layer 114 can be adjusted by setting the shape or area of the openings 136 provided in the coloring layer 114. With such a structure in which the coloring layer 114 has the openings 136, a novel display device capable of adjusting color purity can be provided.

The insulating layer 112 is provided with the opening 138. The pixel electrode layer 118 is connected to the conductive layer 110*a*_2 serving as a drain electrode layer of the transistor 150, through the opening 138. For the insulating layer 116, a photosensitive resin may be used so that random projections and depressions are formed. In the case where random projections and depressions are formed, the pixel electrode layer 118 is a reflective electrode having random projections and depressions reflecting the random projections and depressions on the surface of the insulating layer 116. Thus, viewing angle dependence can be improved.

In this embodiment, a highly reflective conductive layer is used as the pixel electrode layer 118 so as to serve as a reflective electrode. For example, the highly reflective conductive layer is formed to have a single-layer structure or a stacked-layer structure including any of metals such as aluminum, silver, palladium, and copper or an alloy containing any of these metals as its main component.

FIG. 23B is a cross-sectional view of a region where the gate line 104 and the conductive layer 110*a*_2 serving as the source line 110 intersect with each other.

In the display device in FIG. 23B, the distance between the first substrate 102 and the second substrate 162 which faces the first substrate 102 is maintained by the spacer 181. In the case where alignment films are formed, the alignment films may be formed after the spacer is formed by patterning an organic resin film or by forming a columnar structure using a photosensitive resin.

When the BM 180 is formed as illustrated in FIG. 23B, surface reflection due to the gate line 104 or the conductive layer 110*a*_2 can be suppressed.

In this manner, the BM 180 is preferably formed in a portion other than at least a reflective region.

This embodiment can be freely combined with any of the other embodiments.

Example 1

In this example, a display device of one embodiment of the present invention was manufactured and subjected to optical microscope observation and cross-sectional observation. Details of samples manufactured in this example are described below.

Note that a display device having a structure similar to that of the display device illustrated in FIG. 1, FIGS. 2A to 2C, and FIGS. 3A and 3B was manufactured in this example. Thus, portions having functions similar to those in FIG. 1, FIGS. 2A to 2C, and FIGS. 3A and 3B are given the same reference numerals.

A method for manufacturing the samples were observed in this example will be described below.

As the first substrate 102, a glass substrate was used. Then, the conductive layers 104*a*, 104*h*, and 104*c* were formed over the first substrate 102. A 200-nm-thick tungsten film (W) was formed by a sputtering method for the conductive layers 104*a*, 104*b*, and 104*c*.

Then, the insulating layers 106*a* and 106*b* serving as a gate insulating layer were formed over the first substrate 102 and the conductive layers 104*a*, 104*b*, and 104*c*. A 400-nm-thick silicon nitride film was formed as the insulating layer 106*a*, and a 50-nm-thick silicon oxynitride film was formed as the insulating layer 106*b*.

Note that the silicon nitride film that is the insulating layer 106*a* has a three-layer structure of a first silicon nitride film, a second silicon nitride film, and a third silicon nitride film.

The first silicon nitride film was formed to have a thickness of 50 nm under the following conditions: silane at a flow rate of 200 sccm, nitrogen at a flow rate of 2000 sccm, and an ammonia gas at a flow rate of 100 sccm were supplied to a reaction chamber of a plasma CVD apparatus as a source gas, the pressure in the reaction chamber was controlled to 100 Pa, and a power of 2000 W was supplied with the use of a 27.12 MHz high-frequency power source. The second silicon nitride film was formed to have a thickness of 300 nm under the following conditions: silane at a flow rate of 200 sccm, nitrogen at a flow rate of 2000 sccm, and an ammonia gas at a flow rate of 2000 sccm were supplied to the reaction chamber of the plasma CVD apparatus as a source gas, the pressure in the reaction chamber was controlled to 100 Pa, and a power of 2000 W was supplied with the use of a 27.12 MHz high-frequency power source. The third silicon nitride film was formed to have a thickness of 50 nm under the following conditions: silane at a flow rate of 200 sccm and nitrogen at a flow rate of 5000 sccm were supplied to the reaction chamber of the plasma CVD apparatus as a source gas, the pressure in the reaction chamber was controlled to 100 Pa, and a power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film formed as the insulating layer 106b was formed under the following conditions: silane at a flow rate of 20 sccm and dinitrogen monoxide at a flow rate of 3000 sccm were supplied to the reaction chamber of the plasma CVD apparatus as a source gas, the pressure in the reaction chamber was controlled to 40 Pa, and a power of 100 W was supplied with the use of a 27.12 MHz high-frequency power source. Note that the silicon oxynitride film was formed at a substrate temperature of 350° C.

Next, the semiconductor layer 108 was formed so as to overlap with the conductive layer 104a with the insulating layers 106a and 106b provided therebetween. A 35-nm-thick oxide semiconductor film was formed as the semiconductor layer 108 by a sputtering method.

The oxide semiconductor film was formed under the following conditions: a metal oxide sputtering target of In:Ga:Zn=1:1:1 (atomic ratio) was used, oxygen at a flow rate of 100 sccm and argon at a flow rate of 100 sccm were supplied as a sputtering gas to a reaction chamber of a sputtering apparatus, the pressure in the reaction chamber was controlled to 0.6 Pa, and an alternating-current power of 2.5 kW was supplied. Note that the oxide semiconductor film was formed at a substrate temperature of 170° C.

Next, the opening 132 was formed in a desired position of the insulating layers 106a and 106b. Note that the opening 132 reaches the conductive layer 104b.

The opening 132 was formed using a dry etching apparatus.

Next, a conductive layer was formed over the semiconductor layer 108 and the insulating layers 106a and 106b. As the conductive layer, a 400-nm-thick aluminum film was formed over a 50-nm-thick tungsten film, and a 100-nm-thick titanium film was formed over the aluminum film.

Next, a conductive layer 110_1 was formed by removing a region other than a desired region of the 100-nm-thick titanium film with a dry etching apparatus. Note that the conductive layer 110_1 is a 100-nm-thick titanium film.

Next, the conductive layers 110a_1, 110a_2, 110a_3, 110a_4, 110b_1, 110b_2, 110b_3, and 110b_4 were formed by processing the 50-nm-thick tungsten film and the 400-nm-thick aluminum film into a desired shape with a dry etching apparatus. Note that the conductive layers 110a_1, 110a_2, 110a_3, and 110a_4 are each a 50-nm-thick tungsten film. The conductive layers 110b_1, 110b_2, 110b_3, and 110b24 are each a 400-nm-thick aluminum film.

The conductive layers 110a_1 and 1 serve as a source electrode layer of a transistor; the conductive layers 110a_2 and 110b_2 serve as a drain electrode layer of the transistor; the conductive layers 110a_3 and 110b_3 serve as a reflective electrode layer; and the conductive layers 110a_4 and 110b_4 serve as part of a source line.

Next, the insulating layer 112 was formed so as to cover the semiconductor layer 108 and the conductive layers 110b_1, 110b_2, 110b_3, and 110c_1.

The insulating layer 112 was formed to have a three-layer structure of a first oxide insulating film, a second oxide insulating film, and a nitride insulating film.

A 50-nm-thick silicon oxynitride film was formed as the first oxide insulating film. A 400-nm-thick silicon oxynitride film was formed as the second oxide insulating film. Note that the first oxide insulating film and the second oxide insulating film were successively formed with a plasma CVD apparatus in vacuum without exposure to the air. Since the first oxide insulating film and the second oxide insulating film were formed using the same kind of material, the interface between these films cannot be clearly defined in some cases.

The first oxide insulating film was formed by a plasma CVD method under the following conditions: silane at a flow rate of 30 sccm and dinitrogen monoxide at a flow rate of 4000 sccm were used as a source gas, the pressure in the reaction chamber was 40 Pa, the substrate temperature was 220° C., and a high-frequency power of 150 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the reaction chamber was 200 Pa, the substrate temperature was 220° C., and a high-frequency power of 1500 W was supplied to the parallel-plate electrodes. Under the above conditions, it is possible to form a silicon oxynitride film containing oxygen at a higher proportion than oxygen in the stoichiometric composition and from which part of oxygen is released by heating.

Next, heat treatment was performed to release water, nitrogen, hydrogen, and the like from the first oxide insulating film and the second oxide insulating film and supply part of oxygen contained in the second oxide insulating film to the oxide semiconductor film used as the semiconductor layer 108. Here, the heat treatment was performed at 350° C. in a mixed atmosphere of nitrogen and oxygen for one hour.

Then, a 100-nm-thick nitride insulating film was formed over the second oxide insulating film. A 100-nm-thick silicon nitride film was formed as the nitride insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas, the pressure in the reaction chamber was 100 Pa, the substrate temperature was 350° C., and a high-frequency power of 1000 W was supplied to the parallel-plate electrodes.

Next, the coloring layer 114 was formed in a desired region over the insulating layer 112.

As the coloring layer 114, a photosensitive resin film was formed by applying a photosensitive resin solution in which a coloring material was dispersed, with a spin coater apparatus and then drying the solution in an oven apparatus. The photosensitive resin film serves as a so-called color filter. Note that in this example, three colors of red (R), green (G), and blue (B) are used, and green (G), red (R), and blue (B) color filters were formed in this order in desired positions by light exposure and development. Each of the red (R), green (U), and blue (B) color filters was formed so as to have a thickness of 0.8 μm. The coloring layer 114 was formed such that the opening 134 and the opening 136 were provided for each of the above colors.

Next, the insulating layer 116 having a function of an overcoat was formed over the insulating layer 112 and the coloring layer 114. Note that as the insulating layer 116, an acrylic based resin film was formed by applying an acrylic based resin material with a spin coater apparatus and then drying the material in an oven apparatus. The insulating layer 116 was formed so as to have a thickness of 2.5 μm. In addition, the insulating layer 116 was formed such that an opening is provided inside the opening 134 in the coloring layer 114.

Next, the opening 138 was formed in the insulating layer 112 in a position overlapping the opening 134. The opening 138 was formed so as to reach the conductive layer 110c_1. Note that the opening 138 was formed using a dry etching apparatus.

Next, the pixel electrode layer 118 was formed over the insulating layer 116 so as to cover the opening 138. A 100-nm-thick conductive film of an indium oxide-tin oxide-silicon oxide compound (ITO-SiO$_2$, hereinafter ITSO) was formed as the pixel electrode layer 118 by a sputtering method. Note that the composition of a target used for forming the conductive film was In$_2$O$_3$:SnO$_2$:SiO$_2$=85:10:5 [wt %].

Through these steps, elements were formed over the first substrate 102. These samples were subjected to optical microscope observation.

Note that in this example, in order to observe the elements formed over the first substrate 102, the liquid crystal layer 166, the conductive layer 164, and the second substrate 162 were not formed over the insulating layer 116 and the pixel electrode layer 118.

Figure 11A:
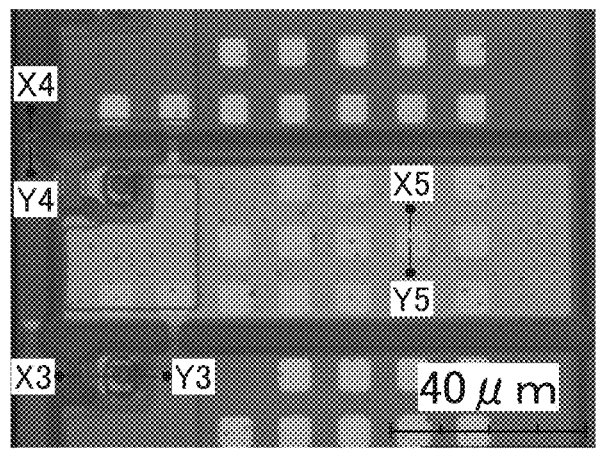
FIGS. 11A to 11C show optical micrographs in an example.
Figure 11B:
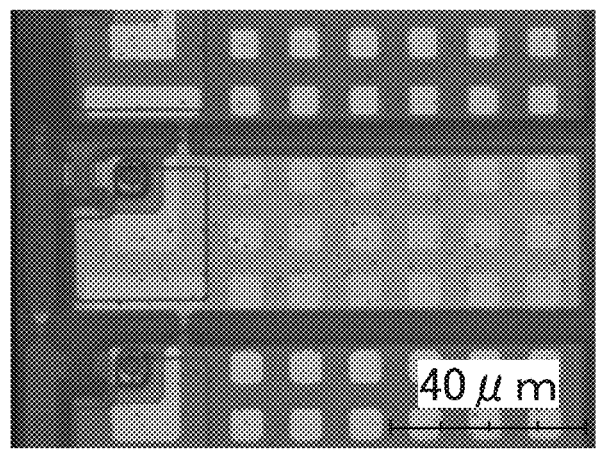
Figure 11C:
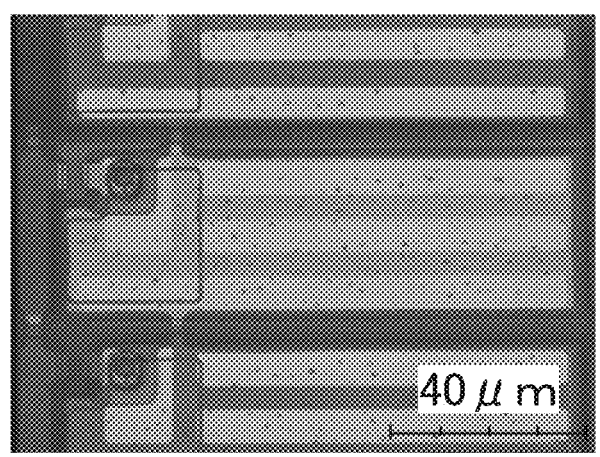

FIGS. 11A to 11C show optical micrographs of samples manufactured in this example. Note that the optical micrographs shown in FIGS. 11A to 11C are reflected bright-field images.

In addition, FIGS. 11A to 11C are optical micrographs of the samples with different shapes and arrangements of the openings 134 and 136 in the coloring layers 114 as shown in FIGS. 2A to 2C in Embodiment 1. Note that the shapes and arrangement of the openings 134 and 136 in the coloring layers 114 were changed by changing the shape of a light exposure mask.

As shown in FIGS. 11A to 11C, the coloring layer 114 with the openings 134 and 136 of any of the shapes was not separated, and these shapes are found favorable. In addition, favorable color purity was visually observed from all the samples in FIGS. 11A to 11C.

FIGS. 11A to 11C each show a top view of roughly three pixels. In each of FIGS. 11A to 11C, an upper portion is a pixel region in which a red (R) color filter is used as the coloring layer 114; a middle portion is a pixel region in which a green (G) color filter is used as the coloring layer 114; and a lower portion is a pixel region in which a blue (B) color filter is used as the coloring layer 114.

Note that the proportion of the area of the coloring layer 114 in FIG. 11A to the area of the conductive layer 110b_3 used as a reflective electrode layer in one pixel is 76%. The proportion of the area of the coloring layer 114 in FIG. 11B to the area of the conductive layer 110b_3 used as a reflective electrode layer in one pixel is 63%. The proportion of the area of the coloring layer 114 in FIG. 11C to the area of the conductive layer 110b_3 used as a reflective electrode layer in one pixel is 41%. Thus, the proportion of the area of the coloring layer 114 can be easily changed by changing the shape and arrangement of the openings 136 in the coloring layer 114.

Figure 12:
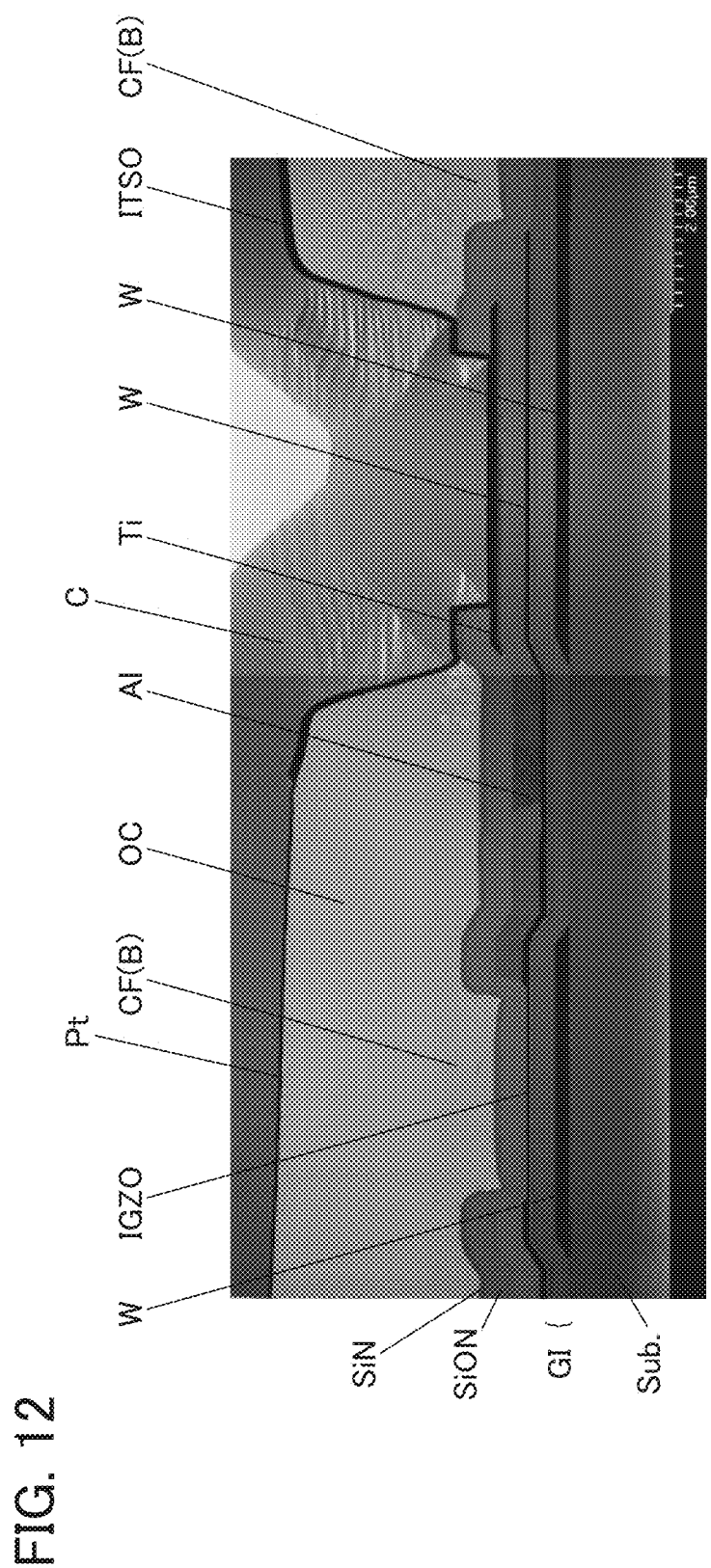
FIG. 12 shows a cross-sectional TEM image in an example.
Figure 13A:
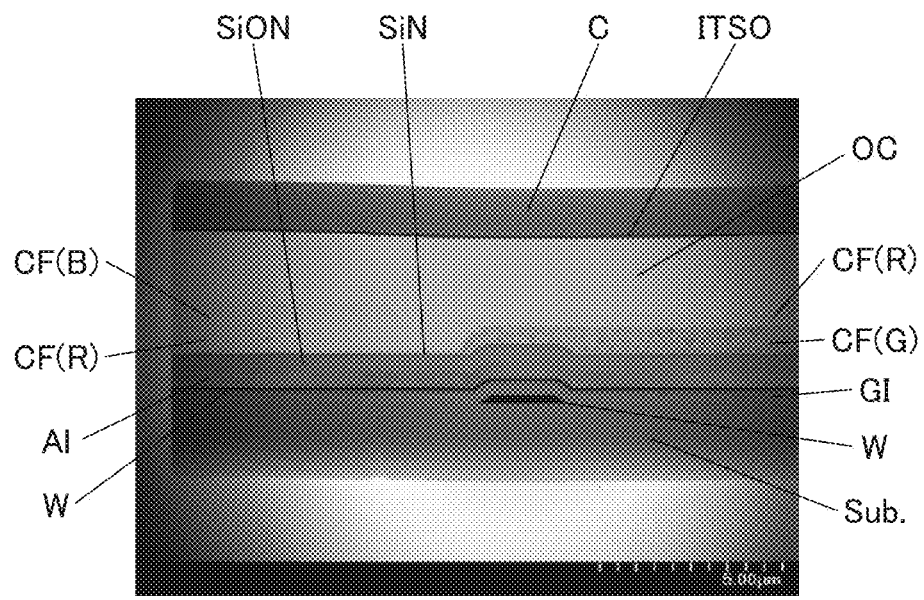
FIGS. 13A and 13B show cross-sectional TEM images in an example.
Figure 13B:
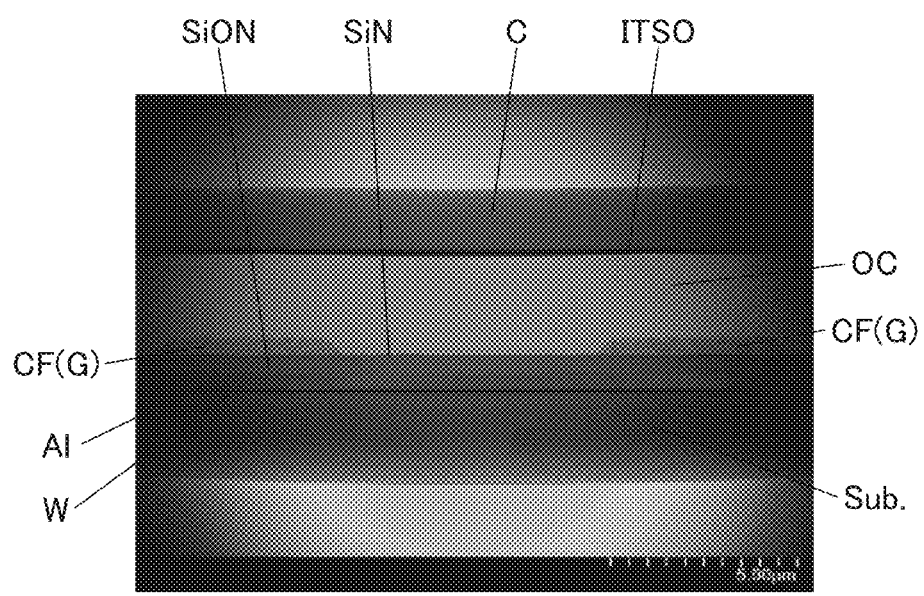

Next, results of cross-sectional observation of the samples manufactured in this example are described with reference to FIG. 12 and FIGS. 13A and 13B. Note that a transmission electron microscope (TEM) was used for the cross-sectional observation. FIG. 12 shows two TEM images partly overlapping with each other. In FIG. 12 and FIGS. 13A and 13B, brightness, contrast, and the like are adjusted to clearly show interfaces and the like.

Note that FIG. 12 shows a result of a cross section taken along dashed-dotted line X3-Y3 in FIG. 11A. FIG. 13A shows a result of a cross section taken along dashed-dotted line X4-Y4 in FIG. 11A. FIG. 13B shows a result of a cross section taken along dashed-dotted line X5-Y5 in FIG. 11A.

Note that in FIG. 12 and FIGS. 13A and 13B. Sub, denotes the first substrate 102. GI denotes the insulating layers 106a and 106b serving as a gate insulating layer. SiON denotes the silicon oxynitride film used as the insulating layer 112. SiN denotes the silicon nitride film used as the insulating layer 112. W denotes the tungsten films used as the conductive layers 104a, 104b, 104c, 110a_1, 110a2, 110a_3, and 110a_4. Al denotes the aluminum films used as the conductive layers 110b_1, 110b_2, 110b_3, and 110b_4. Ti denotes the titanium film used as the conductive layer 110c_1. IGZO denotes the oxide semiconductor film used as the semiconductor layer 108. CF(R) denotes the coloring layer 114 for red. CF(G) denotes the coloring layer 114 for green. CF(B) denotes the coloring layer 114 for blue. OC denotes the acrylic based resin film used as the insulating layer 116 having a function of an overcoat. ITSO denotes the indium oxide-tin oxide-silicon oxide compound film used as the pixel electrode layer 118. Pt denotes a platinum coating used as a conductive film for cross-sectional observation. C denotes a carbon coating used as a conductive film for cross-sectional observation.

The results shown in the TEM images in FIG. 12 and FIGS. 13A and 13B confirm that the display device of this example has a favorable cross-sectional shape.

As can be seen from the result shown in the TEM image in FIG. 13A, in the display device of this example, the color filter CF(G) and the color filter CF(R) each used as the coloring layer 114 are stacked over the gate line, the source line, or a region where the gate line intersects with the source line, which is other than a reflective region. In addition, in the display device of this example, the color filter CF(R) and the color filter GF(B) each used as the coloring layer 114 are stacked over the gate line, the source line, or a region where the gate line intersects with the source line, which is other than a reflective region.

As can be seen from the result shown in the TEM image in FIG. 13B, the display device of this example has a structure in which the color filter MG) used as the coloring layer 114 has an opening, and through the opening, the silicon nitride film (SiN) used as the insulating layer 112 is in contact with the acrylic based resin film used as the insulating layer 116 serving as an overcoat (OC). Thus, it is confirmed that the display device of this example has a favorable cross-sectional shape with improved adhesion of the coloring layer 114 and with no film separation or the like.

The structure described above in this example can be combined with any of the structures described in the other embodiments as appropriate.

Example 2

In this example, a display device of one embodiment of the present invention was manufactured, a pixel region where an image was displayed was photographed, and its reflectance was measured. Details of samples manufactured in this example are described below.

Note that the display device described in Embodiment 5 and illustrated in FIG. 21, FIGS. 22A and 22B, and FIGS. 23A and 23B was manufactured in this example. In addition, a display device in which all the coloring layers in R, G, and B pixels had the same shape was manufactured. The display device in this example is the same as the display device illustrated in FIG. 1, FIGS. 2A to 2C, and FIGS. 3A and 3B, except that openings in coloring layers for different colors have partly varying shapes, the coloring layers are formed over a counter substrate, and a pixel electrode is used as a reflective electrode, for example. Thus, portions having functions similar to those in FIG. 1, FIGS. 2A to 2C, and FIGS. 3A and 3B are given the same reference numerals.

Figure 24A:
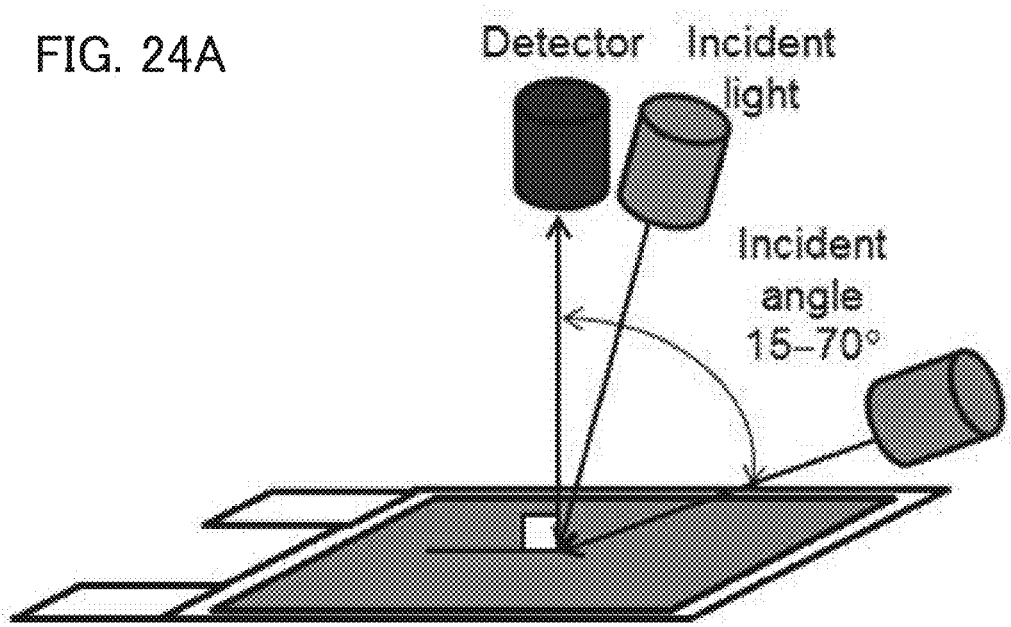
FIGS. 24A and 24B are a diagram illustrating a method for measuring reflectance and a graph showing reflectance.
Figure 24B:
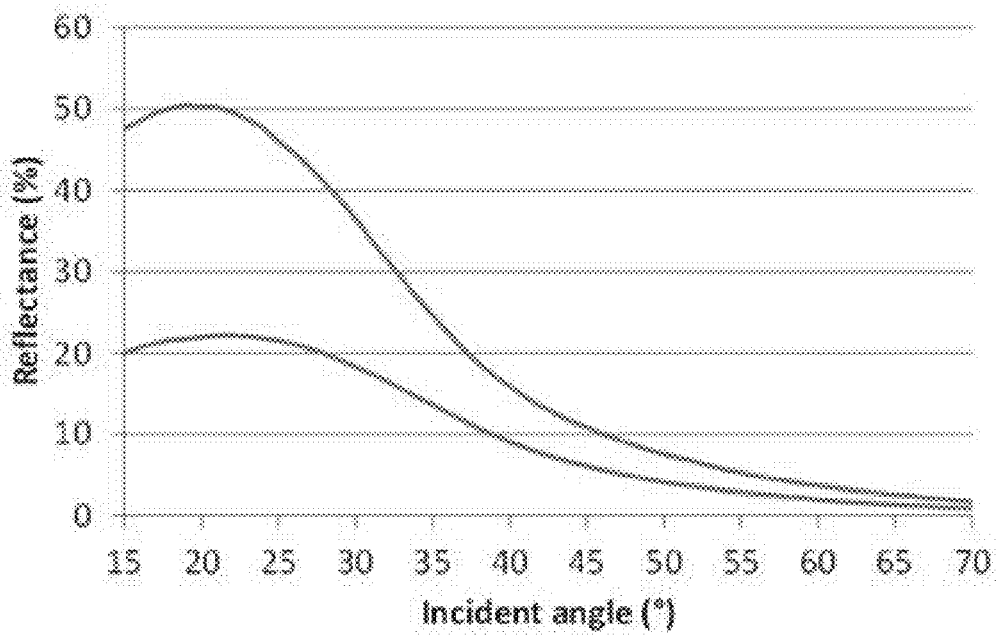

Two types of display panels which are the manufactured samples were subjected to reflectance measurement using a measurement apparatus (an LCD evaluation apparatus (product name: LCD-7200)) such that a detector was positioned over the center of the display panel so as to be perpendicular to the display panel surface and the center of the panel was irradiated with light from a light source at an angle in the range from 15° to 70°, as illustrated in FIG. 24A. FIG. 24B shows the results.

The upper curve in FIG. 24B represents data obtained from the display device described in Embodiment 5, and the lower curve represents data obtained from the display device in which the coloring layers in the R, G, and B pixels have the same shape that is illustrated in FIG. 22A.

Figures 25A, 25B:
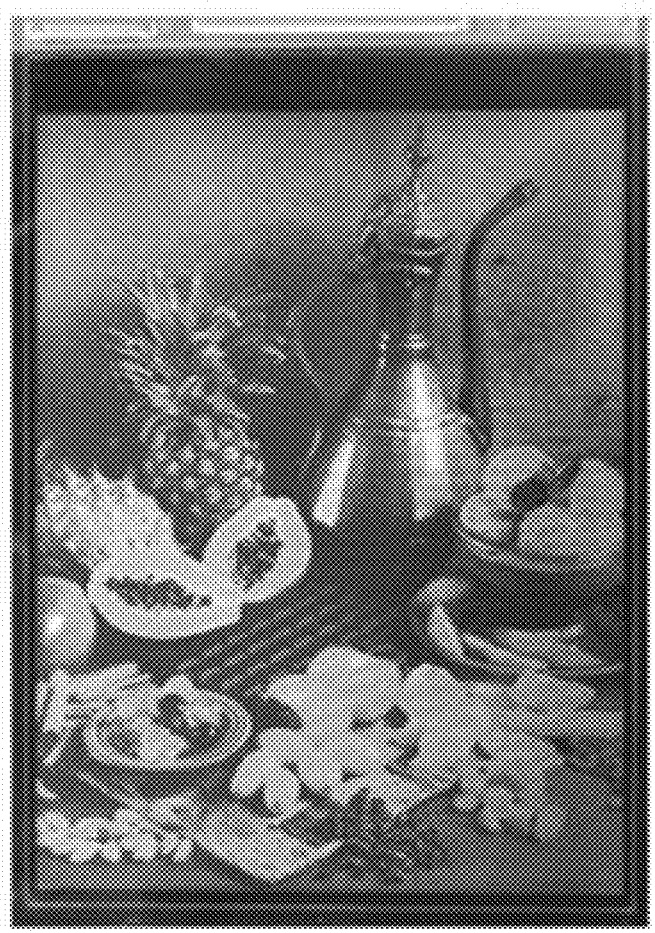
FIGS. 25A and 25B show a photograph of a display device and characteristics of the display device.

FIG. 25A shows a photograph of display by the display device described in Embodiment 5.

FIG. 25B shows a table of characteristics of the two types of display devices in FIG. 25B, the display device described in Embodiment 5 is referred to as high reflective LCD because of its high reflectance, and the other display device is referred to as high color gamut LCD.

These panels can further be provided with a touch panel so as to be a display device capable of touch input. FIG. 26 is a schematic diagram of a configuration example of a display device including a touch panel. A display device illustrated in FIG. 26 includes the pixel electrode layers 118 over the substrate 102; the coloring layers 114 overlapping with the pixel electrode layers 118; the BM 180 between the coloring layers 114 for different colors; the substrate 162; a liquid crystal between the substrate 102 and the substrate 162; an optical film 183 over the substrate 162; a touch panel 184; and a polarizing film 185. Note that transistors electrically connected to the pixel electrode layers 118 formed over the substrate 102 are not illustrated in FIG. 26.

Note that the data in FIG. 24B and FIGS. 25A and 25B were obtained before a touch panel is provided.

These data indicate that a reflective liquid crystal display device capable of high-resolution display can be obtained.

Furthermore, these display panels include capacitors with a large capacitance. Thus, it is possible to retain the potential of the pixel electrode for a longer time and to apply a driving mode with a reduced refresh rate. Moreover, a change in voltage applied to the liquid crystal layer can be inhibited for a long time even when the liquid crystal display device is used in the driving mode with a reduced refresh rate. This makes it possible to prevent screen flickers from being perceived by a user more effectively. Thus, the power consumption can be reduced and the display quality can be improved.

Figure 28:
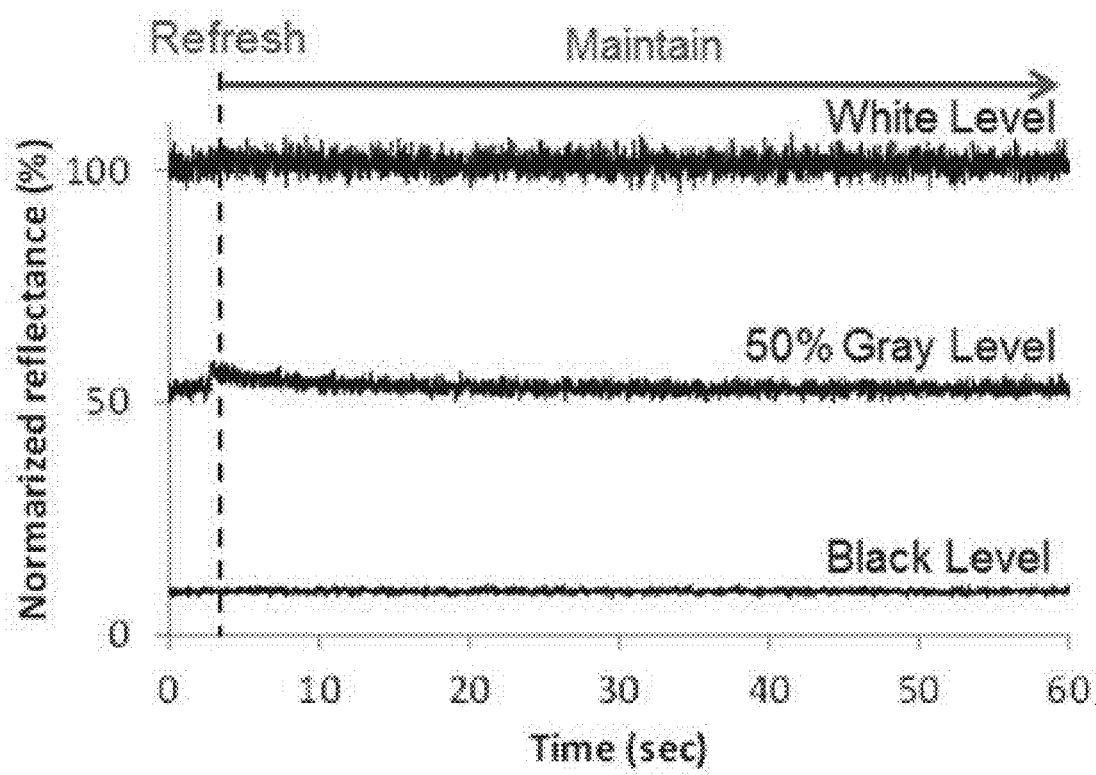
FIG. 28 is a graph showing changes in images caused by a refresh operation.

FIG. 28 shows results of measuring changes in images caused by a refresh operation in the display device of this example. As shown in FIG. 28, little change is caused in images by the refresh operation in any of white display, gray display, and black display.

The display device of this example can be used in a driving mode with a reduced refresh rate of 1 Hz or less and can be an eye-friendly reflective liquid crystal display device. The display device of this example can also be a low-power-consumption reflective liquid crystal display device.

This application is based on Japanese Patent Application serial no. 2013-216904 filed with Japan Patent Office on Oct. 18, 2013 and Japanese Patent Application serial no. 2014-005432 filed with Japan Patent Office on Jan. 15, 2014, the entire contents of which are hereby incorporated by reference.

What is claimed is:

1. A display device comprising:
   a substrate;
   a transistor over the substrate, the transistor comprising a source electrode layer and a drain electrode layer;
   a reflective layer over the substrate;
   a first insulating layer over the reflective layer;
   a coloring layer over the first insulating layer, the coloring layer overlapping with the reflective layer;
   a second insulating layer over the coloring layer; and
   a pixel electrode layer over the second insulating layer,
   wherein the coloring layer includes at least a first opening and a second opening,
   wherein the pixel electrode layer is electrically connected to the transistor through the first opening,
   wherein the second insulating layer is in contact with the first insulating layer in the second opening, and
   wherein the second opening is filled with the second insulating layer.

2. The display device according to claim 1,
   wherein the transistor comprises a gate electrode layer, a gate insulating layer, and a semiconductor layer, the gate electrode layer overlapping with the semiconductor layer,
   wherein the gate insulating layer is provided between the gate electrode layer and the semiconductor layer, and
   wherein the source electrode layer and the drain electrode layer are in contact with the gate insulating layer and the semiconductor layer.

3. The display device according to claim 2,
   wherein the first insulating layer includes a third opening overlapping with the first opening, and
   wherein the pixel electrode layer is electrically connected to one of the source electrode layer and the drain electrode layer through the first opening and the third opening.

4. The display device according to claim 2,
   wherein the semiconductor layer comprises an oxide semiconductor.

5. The display device according to claim 4,
   wherein the oxide semiconductor includes an oxide represented by an In-M-Zn oxide containing at least indium (In), zinc (Zn), and M, and
   wherein M represents Al, Ga, Ge, Y, Zr, Sn, La, Ce, or Hf.

6. The display device according to claim 2,
   wherein the reflective layer and at least one of the source electrode layer and the drain electrode layer are provided on a same layer.

7. The display device according to claim 1 further comprising an adhesive layer between the substrate and the transistor.

8. The display device according to claim 2 further comprising a capacitor,
   wherein a first electrode of the capacitor is electrically connected to one of the source electrode layer and the drain electrode layer, and
   wherein a part of the reflective layer overlaps with the first electrode of the capacitor and forms a second electrode of the capacitor.

9. The display device according to claim 1,
   wherein the first insulating layer comprises an inorganic insulating material, and
   wherein the second insulating layer comprises an organic insulating material.

10. An electronic device comprising the display device according to claim 1.

* * * * *

UNITED STATES PATENT AND TRADEMARK OFFICE
CERTIFICATE OF CORRECTION

| | |
|---|---|
| PATENT NO. | : 9,553,114 B2 |
| APPLICATION NO. | : 14/516103 |
| DATED | : January 24, 2017 |
| INVENTOR(S) | : Masataka Nakada et al. |

It is certified that error appears in the above-identified patent and that said Letters Patent is hereby corrected as shown below:

In the Specification

At Column 3, Line 53, "an contact" should be --in contact--;

At Column 4, Line 22, "effects," should be --effects.--;

At Column 6, Line 8, "corresponding" should be --(corresponding--;

At Column 6, Line 20, "Layout." should be --layout.--;

At Column 6, Line 25, "present," should be --present--;

At Column 6, Line 58, "layer 8" should be --layer 118--;

At Column 7, Line 4, "in same" should be --in the same--;

At Column 7, Line 52, "of 2) an" should be --of an--;

At Column 8, Line 59, "110a3;" should be --110a_3;--;

At Column 11, Line 16, "1990" should be --199b--;

At Column 11, Line 24, "199h" should be --199b--;

At Column 11, Line 24, "104h." should be --104b.--;

At Column 12, Line 31, "ahoy" should be --alloy--;

At Column 12, Line 34, "104h" should be --104b--;

Signed and Sealed this
Twenty-third Day of May, 2017

Michelle K. Lee
*Director of the United States Patent and Trademark Office*

CERTIFICATE OF CORRECTION (continued)
U.S. Pat. No. 9,553,114 B2

At Column 13, Line 41, "and Al (Al" should be --and M (M--;

At Column 13, Line 42, "Hi)," should be --Hf),--;

At Column 13, Line 60, "example, In-Ga-Zn" should be --example, an In-Ga-Zn--;

At Column 13, Line 64, "in, Ga," should be --In, Ga,--;

At Column 15, Line 13, "119c" should be --109c--;

At Column 15, Line 17, "109h" should be --109b--;

At Column 15, Line 52, "152, are formed (see" should be --152 are formed (see--;

At Column 15, Line 55, "109a, and 109b" should be --109a and 109b--;

At Column 15, Line 60, "110b_1, 110b_2," should be --110b_1, 110a_2, 110b_2,--;

At Column 15, Line 64, "mask or" should be --mask (or--;

At Column 16, Line 2, "aching" should be --ashing--;

At Column 18, Line 41, "R, C," should be --R, G,--;

At Column 21, Line 17, "metal." should be --metal--;

At Column 25, Line 17, "304h" should be --304b--;

At Column 26, Line 17, "FIG. 8A an" should be --FIG. 8A, an--;

At Column 27, Line 39, "8010 and" should be --8010, and--;

At Column 27, Line 44, "cover 8101" should be --cover 8001--;

At Column 27, Line 57, "Ha 9," should be --FIG. 9,--;

At Column 29, Line 10, "(a external" should be --(an external--;

At Column 29, Line 47, "100-nm-thick" should be --400-nm-thick--;

At Column 31, Line 14, "fresh" should be --refresh--;

At Column 31, Line 35, "current a" should be --current (e.g., a--;

At Column 32, Line 44, "samples were" should be --samples which were--;

CERTIFICATE OF CORRECTION (continued)
U.S. Pat. No. 9,553,114 B2

At Column 32, Line 47, "104h," should be --104b,--;

At Column 33, Line 63, "110b24" should be --110b_4--;

At Column 33, Line 64, "and 1" should be --and 110b_1--;

At Column 34, Line 66, "(U)," should be --(G),--;

At Column 35, Line 35, "of samples" should be --of the samples--;

At Column 36, Line 17, "13B. Sub," should be --13B, Sub.--;

At Column 36, Line 23, "110a2," should be --110a_2,--;

At Column 36, Line 48, "GF(B)" should be --CF(B)--.